(12) United States Patent
Nishida et al.

(10) Patent No.: US 8,007,627 B2
(45) Date of Patent: Aug. 30, 2011

(54) ELECTRONIC COMPONENT MOUNTING METHOD AND APPARATUS

(75) Inventors: Kazuto Nishida, Katano (JP); Hidenobu Nishikawa, Kadoma (JP); Yoshinori Wada, Suita (JP); Hiroyuki Otani, Ikoma (JP)

(73) Assignee: Panasonic Corporation, Osaka (JP)

( * ) Notice: Subject to any disclaimer, the term of this patent is extended or adjusted under 35 U.S.C. 154(b) by 724 days.

(21) Appl. No.: 11/064,122

(22) Filed: Feb. 23, 2005

(65) Prior Publication Data
US 2005/0155706 A1    Jul. 21, 2005

Related U.S. Application Data

(62) Division of application No. 09/890,066, filed as application No. PCT/JP00/00372 on Jan. 26, 2000, now Pat. No. 6,926,796.

(30) Foreign Application Priority Data

Jan. 29, 1999 (JP) .................... 11-21800
Jan. 29, 1999 (JP) .................... 11-22015

(51) Int. Cl.
*B32B 37/00* (2006.01)
*B29C 65/00* (2006.01)
(52) U.S. Cl. ...................... 156/306.6; 29/832
(58) Field of Classification Search .......... 156/312, 156/306.6, 306.9, 307.7; 29/832
See application file for complete search history.

(56) References Cited

U.S. PATENT DOCUMENTS

| | | | |
|---|---|---|---|
| 4,811,081 A | 3/1989 | Lyden | |
| 5,407,864 A | 4/1995 | Kim | |
| 5,603,158 A * | 2/1997 | Murata et al. | 29/846 |
| 5,629,566 A | 5/1997 | Doi et al. | |
| 5,686,703 A | 11/1997 | Yamaguchi | |
| 5,834,101 A * | 11/1998 | Hayashi | 428/209 |
| 5,895,976 A | 4/1999 | Morrell et al. | |
| 5,918,113 A | 6/1999 | Higashi et al. | |
| 6,049,038 A | 4/2000 | Suzuki | |
| 6,112,969 A | 9/2000 | Horibe et al. | |
| 6,207,549 B1 | 3/2001 | Higashi et al. | |
| 6,223,429 B1 | 5/2001 | Kaneda et al. | |
| 6,311,888 B1 | 11/2001 | Funada et al. | |
| 6,399,426 B1 | 6/2002 | Capote et al. | |

(Continued)

FOREIGN PATENT DOCUMENTS
EP    0 622 149    11/1994
(Continued)

OTHER PUBLICATIONS
Abstract for JP 05167212 1993.*
(Continued)

*Primary Examiner* — John L Goff, II
(74) *Attorney, Agent, or Firm* — Wenderoth, Lind & Ponack, L.L.P.

(57) ABSTRACT

A chip is bonded on a circuit board by aligning in position bumps with board electrodes with interposition of an anisotropic conductive layer between the chip and the circuit board. The anisotropic conductive layer is a mixture of an insulating resin, conductive particles and an inorganic filler. The chip is pressed against the board with a pressure force of not smaller than 20 gf per bump by virtue of a tool, while warp of the chip is corrected and the board is connected, the bumps are compressed, and the insulating resin is hardened.

1 Claim, 56 Drawing Sheets

U.S. PATENT DOCUMENTS

| | | |
|---|---|---|
| 6,439,447 B1 | 8/2002 | Minamitani et al. |
| 6,458,236 B2 | 10/2002 | Takeshita et al. |
| 6,518,677 B1 | 2/2003 | Capote et al. |
| 6,566,234 B1 | 5/2003 | Capote et al. |
| 6,589,376 B1 | 7/2003 | Davis et al. |
| 6,653,743 B2 | 11/2003 | Galuschki et al. |
| 6,774,493 B2 | 8/2004 | Capote et al. |
| 6,903,463 B1 | 6/2005 | Takeichi et al. |
| 6,916,684 B2 | 7/2005 | Stepniak et al. |
| 6,926,796 B1 | 8/2005 | Nishida et al. |
| 6,981,317 B1 * | 1/2006 | Nishida .................... 29/840 |
| 6,982,492 B2 | 1/2006 | Rumer et al. |
| 7,081,675 B2 | 7/2006 | Yim et al. |
| 2002/0056906 A1 | 5/2002 | Kajiwara et al. |
| 2005/0087891 A1 | 4/2005 | Rumer et al. |
| 2006/0055053 A1 | 3/2006 | Yamazaki et al. |
| 2007/0013067 A1 | 1/2007 | Nishida et al. |

FOREIGN PATENT DOCUMENTS

| | | | |
|---|---|---|---|
| EP | 834919 | | 4/1998 |
| EP | 866109 A1 | * | 9/1998 |
| EP | 954208 | | 11/1999 |
| JP | 58028337 A | * | 2/1983 |
| JP | 62-6652 | | 2/1987 |
| JP | 4-99034 | | 3/1992 |
| JP | 5-013119 | | 1/1993 |
| JP | 5-070750 | | 3/1993 |
| JP | 05167212 A | * | 7/1993 |
| JP | 05170220 A | * | 7/1993 |
| JP | 6-66355 | | 8/1994 |
| JP | 6-333965 | | 12/1994 |
| JP | 8-222599 | | 8/1996 |
| JP | 08213434 A | * | 8/1996 |
| JP | 8-298271 | | 11/1996 |
| JP | 9-36177 | | 2/1997 |
| JP | 9-162229 | | 6/1997 |
| JP | 9-266229 | | 10/1997 |
| JP | 10-004097 | | 1/1998 |
| JP | 10-013002 | | 1/1998 |
| JP | 10-084014 | | 3/1998 |
| JP | 10-226770 | | 8/1998 |
| JP | 10-256296 | | 9/1998 |
| JP | 10-256306 | | 9/1998 |
| JP | 10-289969 | | 10/1998 |
| JP | 10-308417 | | 11/1998 |
| JP | 10-321669 | | 12/1998 |
| JP | 10-335389 | | 12/1998 |
| JP | 10335373 A | * | 12/1998 |
| JP | 2000-31345 | | 1/2000 |
| JP | 2000-223534 | | 8/2000 |
| WO | 98/30073 | | 7/1998 |
| WO | 00/13229 | | 3/2000 |

OTHER PUBLICATIONS

Machine translation for JP 05167212 2008.*
Abstract for JP 08213434 1996.*
Machine translation of JP 10335373 date unknown.*
Office Action issued Mar. 19, 2009 in U.S. Appl. No. 11/527,461.

* cited by examiner

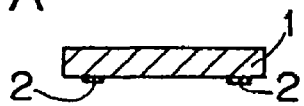
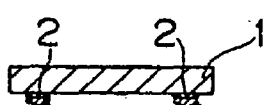
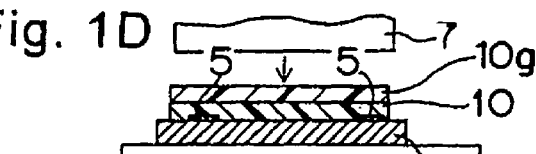
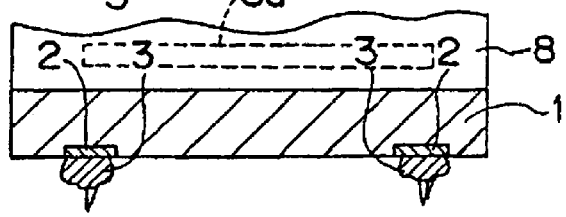
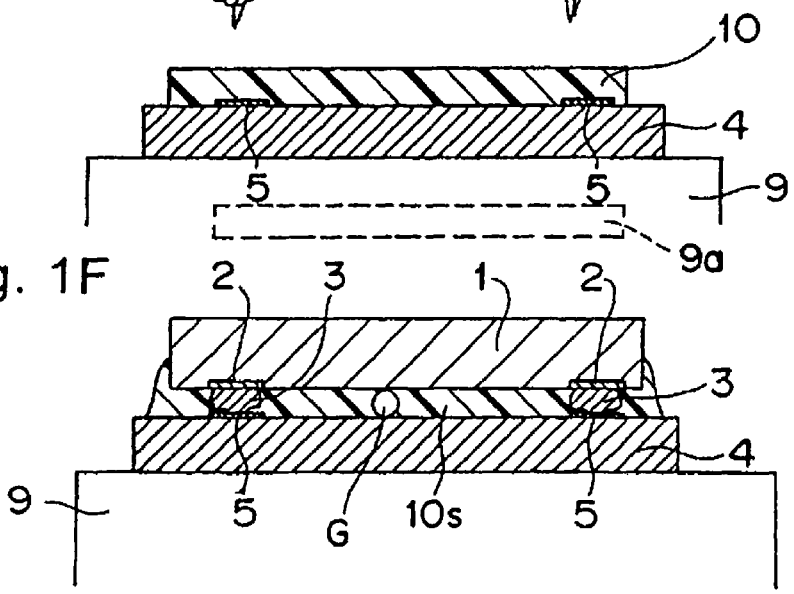
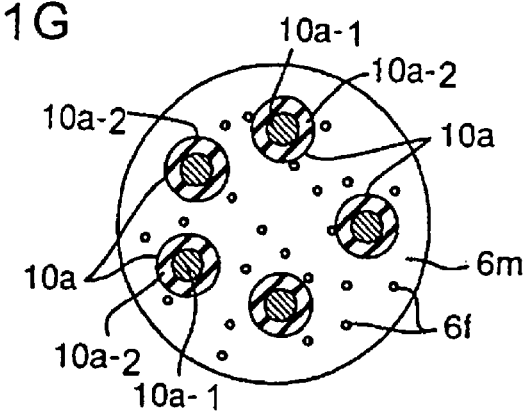

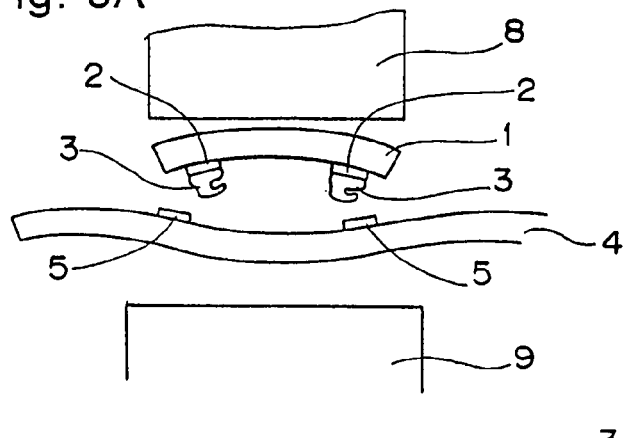
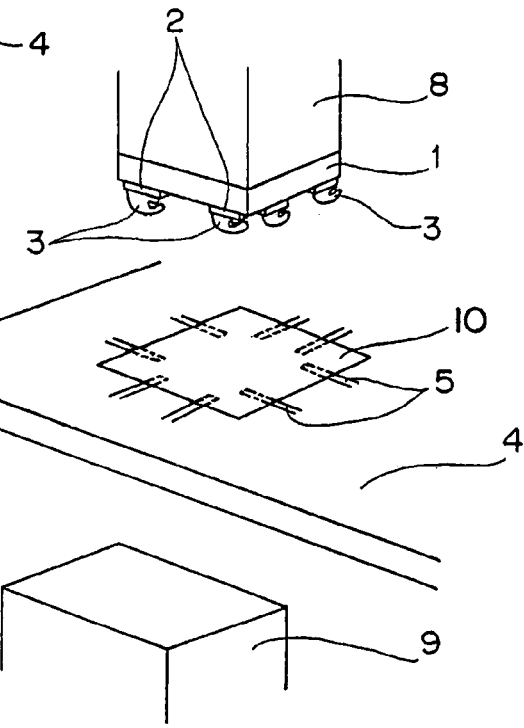
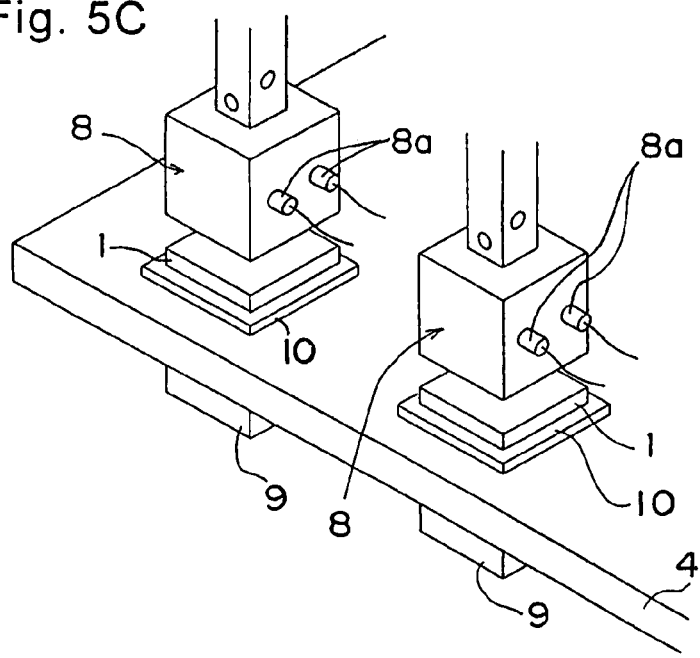
Fig. 5A
Fig. 5B
Fig. 5C

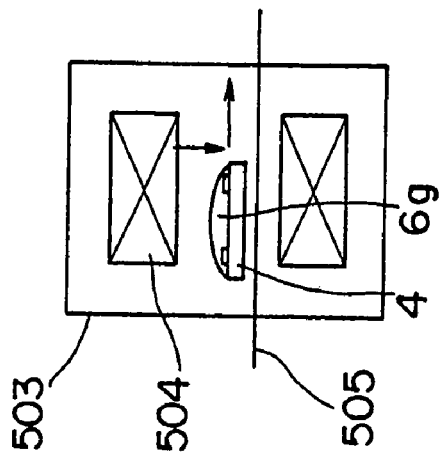
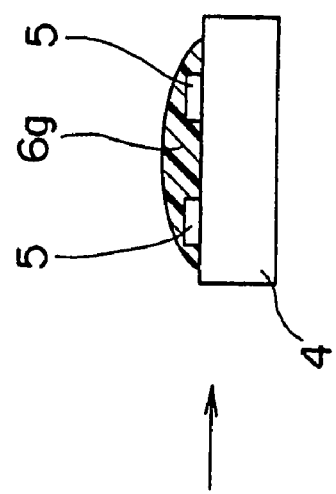
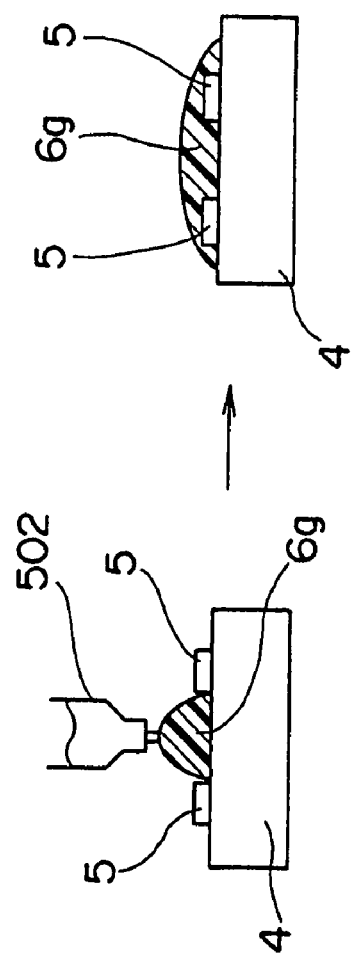
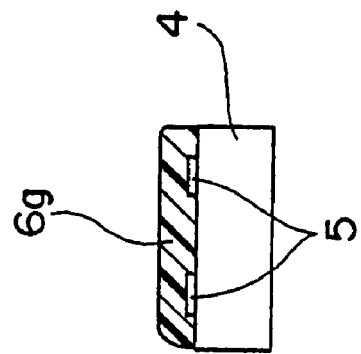
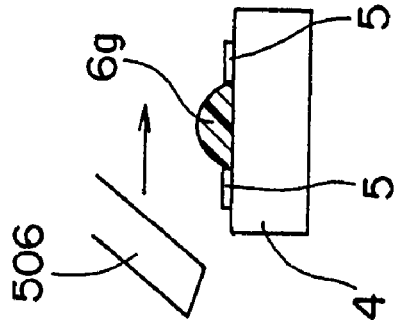
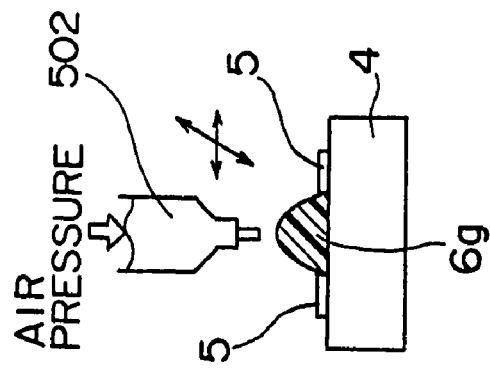

Fig. 10A
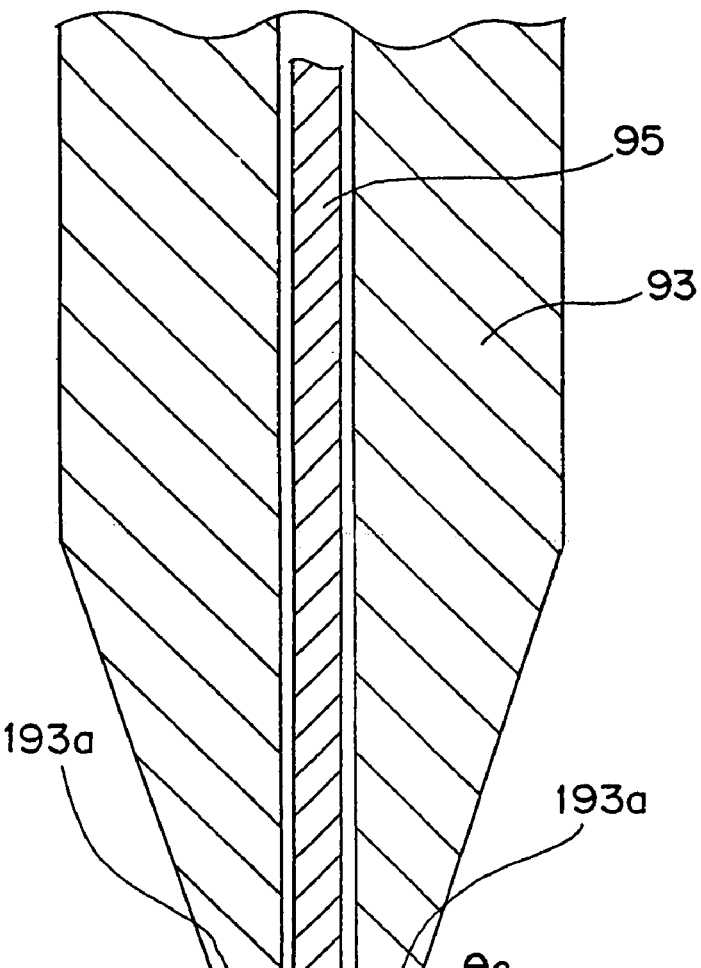
Fig. 10C
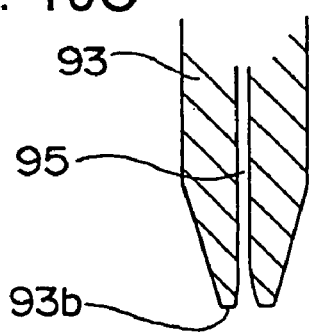
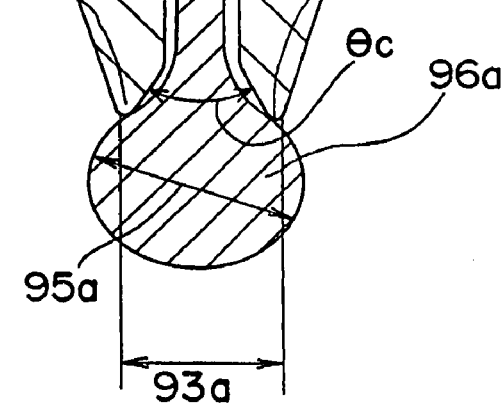
Fig. 10D
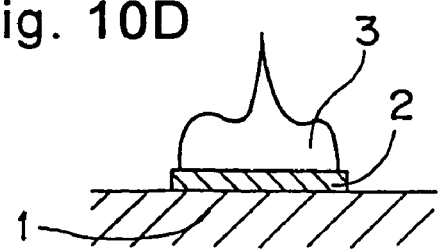
Fig. 10B
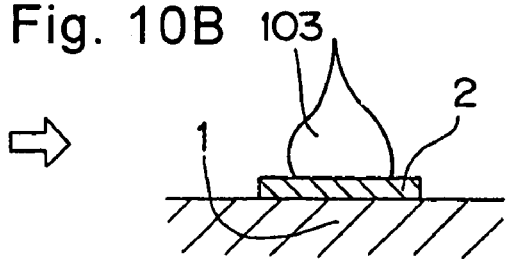

Fig. 11A
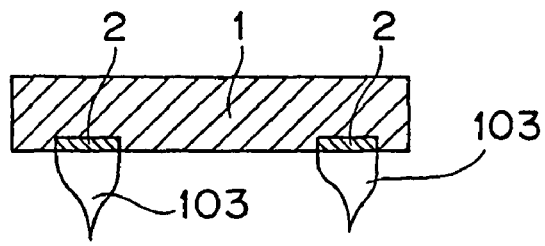
Fig. 11B
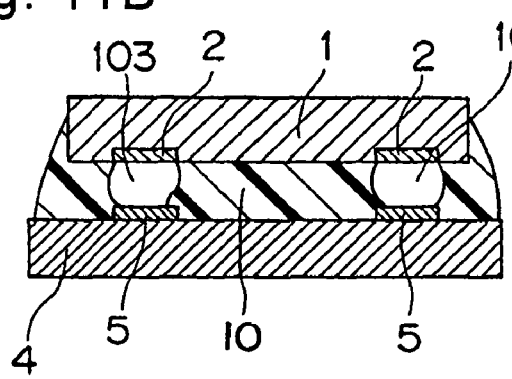
Fig. 11C
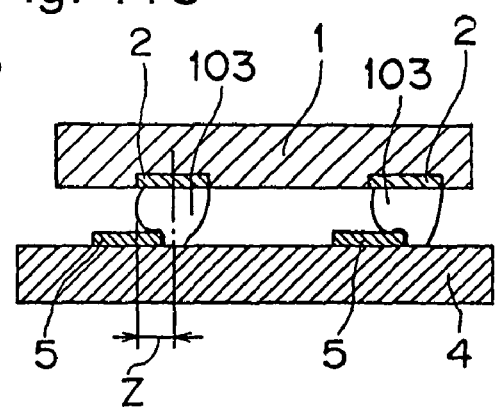
Fig. 11D
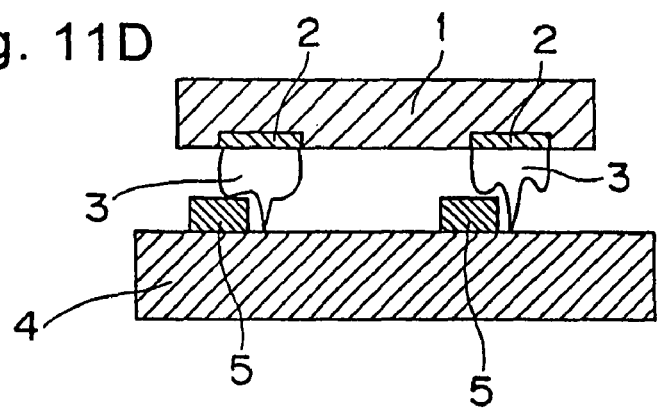
Fig. 11E
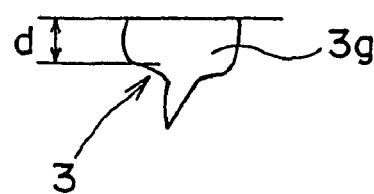

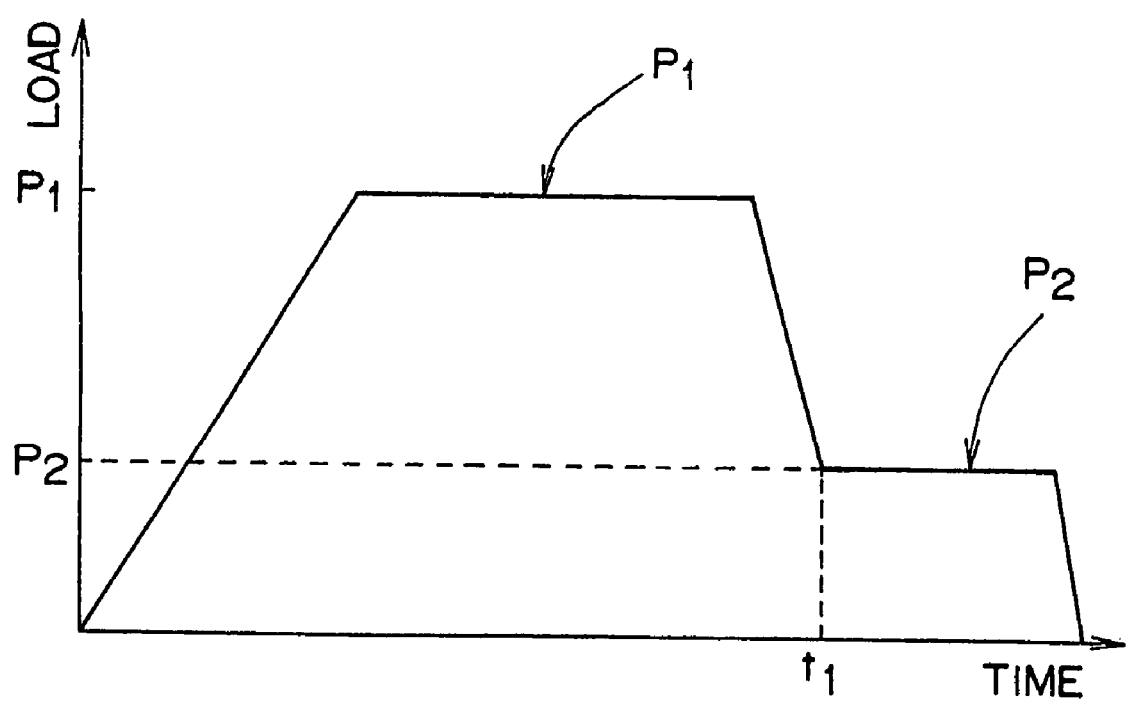

LCD ELECTRODE
(ITO, Aℓ, ETC)

Fig. 38A
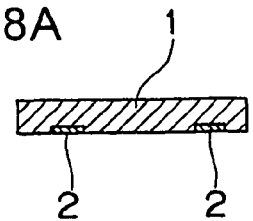
Fig. 38C
Fig. 38B
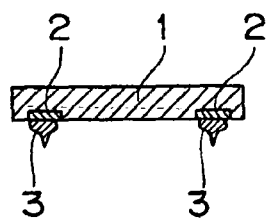
Fig. 38D
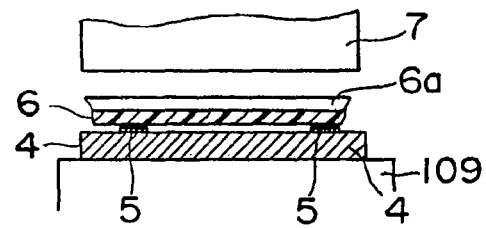
Fig. 38E
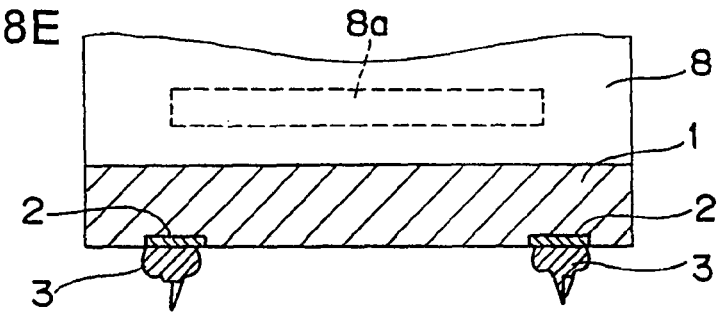
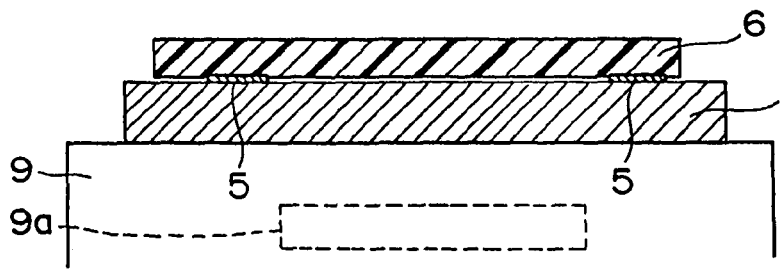
Fig. 38G
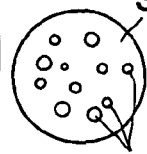
Fig. 38F
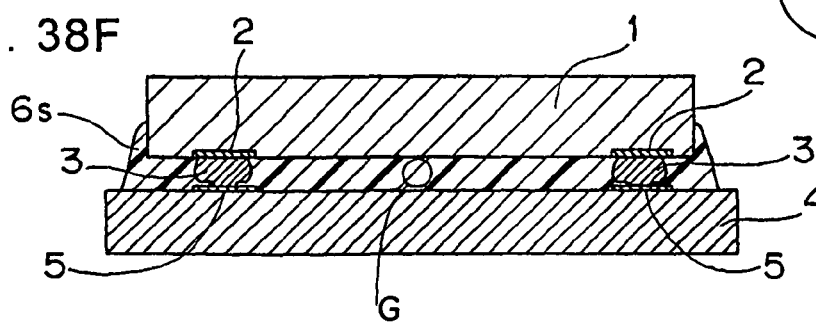

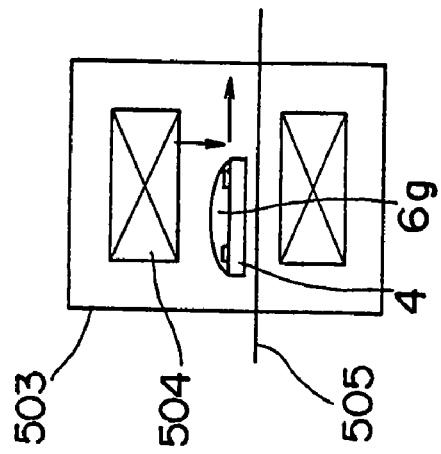
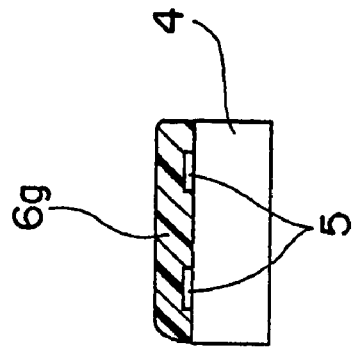
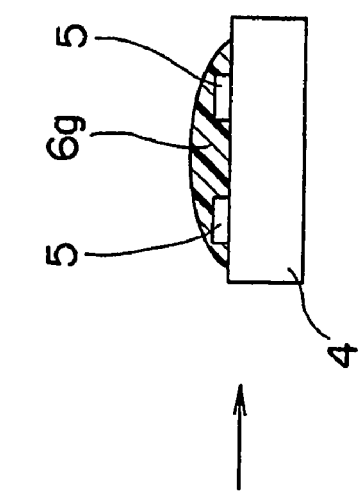
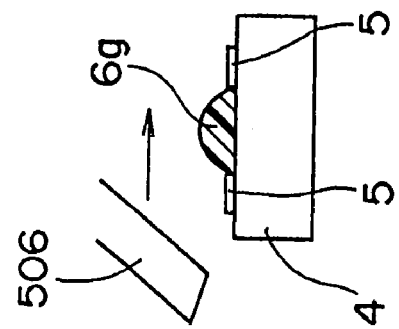
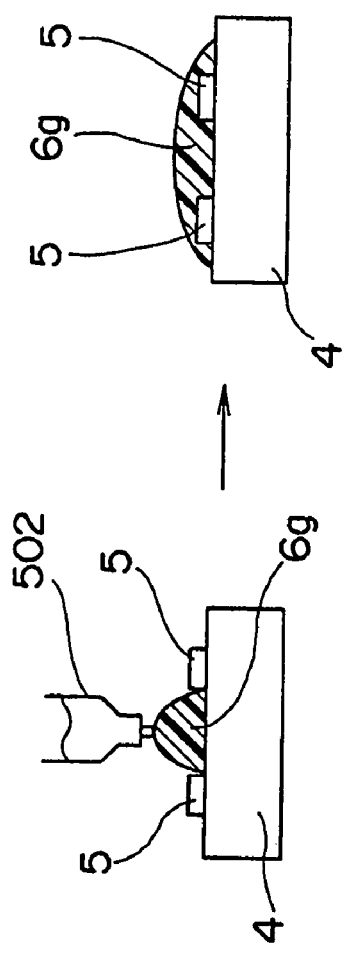
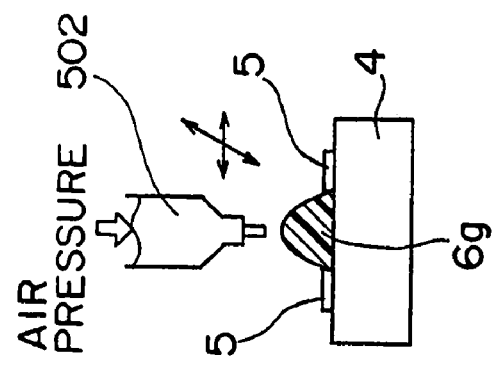

Fig. 48A
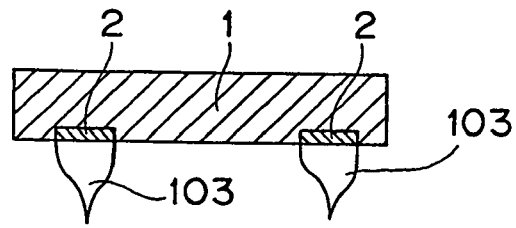
Fig. 48B
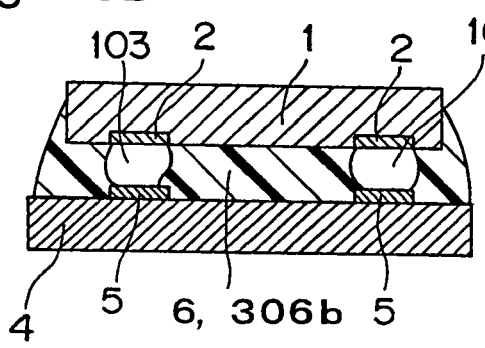
Fig. 48C
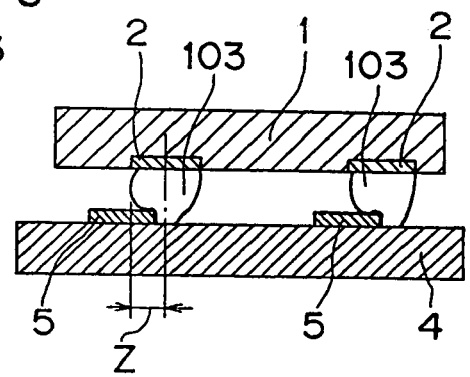
Fig. 48D
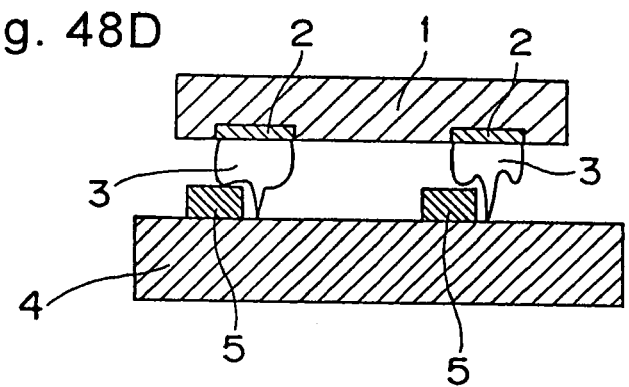
Fig. 48E
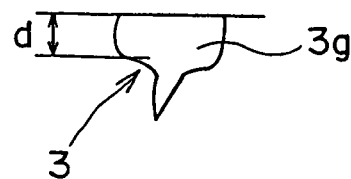

ELECTRONIC COMPONENT MOUNTING METHOD AND APPARATUS

This application is a divisional of U.S. Ser. No. 09/890,066, filed Jul. 26, 2001, now U.S. Pat. No. 6,926,796, which is a National Stage of International Application No. PCT/JP00/00372, filed Jan. 26, 2000.

BACKGROUND OF THE INVENTION

1. Field of the Invention

The present invention relates to an electronic component method and apparatus for mounting on a circuit board an electronic component of, for example, an Integrated Circuit (IC) chip and a surface acoustic wave (SAW) device on an electronic circuit use printed board (referred to as a "board" as a representative example in the present specification, and the "board" means a mounting base object on which other components such as an interposer and/or an electronic component are mounted) in a single body (a bear IC in the case of an IC chip) state, and relates to an electronic component unit obtained by mounting the electronic components on the board by the mounting method.

2. Description of the Related Art

In these days, electronic circuit boards have come to be used in various sorts of products, and the performance thereof has been improved day by day with increased frequencies used on the circuit boards. Flip chip mounting, which provides reduced impedance, is a mounting method suitable for electronic equipment that uses high frequencies. There is also demanded flip chip mounting for mounting on a circuit board an IC chip not in a package style but in a bear component style in compliance with the increase in number of portable devices. For this reason, when IC chips are mounted as a single chip on a circuit board or mounted on electronic equipment and a flat panel display, the IC chips include a certain amount of defective eneschips. Other than the flip chip, CSP (Chip Size Package), BGA (Ball Grid Array) and so on have been increasingly employed.

As a conventional method for bonding an IC chip onto the circuit board of electronic equipment (first prior art), there is the method disclosed in Japanese Examined Patent Publication No. 06-66355 and so on. This is shown in FIG. 15. As shown in FIG. 15, there is generally known the method of transferring an Ag paste 74 onto an IC chip 71 provided with bumps 73 for connection to electrodes 75 of a circuit board 76, thereafter hardening the Ag paste 74 and thereafter pouring an encapsulating material 78 between the IC chip 71 and the circuit board 76.

As a method for connecting an IC chip to a liquid crystal display (second prior art), as disclosed in Japanese Examined Patent Publication No. 62-6652 shown in FIG. 16A and FIG. 16B, there is generally known a semiconductor chip connection structure in which an anisotropic conductive film 80 is employed, and by peeling off an anisotropic conducting adhesive layer 81 constituted by adding conductive minute segments 82 into an insulating resin 83 from a separator 85 and applying the film onto a board or the glass of a liquid crystal display 84 and thermocompression-bonding an IC chip 86, the anisotropic conducting adhesive layer 81 is interposed between a lower surface of the IC chip 86 and the board 84 except for spaces under the Au bump 87.

As a third prior art, there is known a method for applying a UV-curing resin onto a board, hardening the resin located between the two by UV irradiation while mounting an IC chip on it with pressurization, and maintaining a contact between the two by the contracting force of the resin.

As described above, the IC chip bonding has been performed by performing the processes of die-bonding an IC chip of a flat package or the like onto a lead frame, connecting the electrodes of the IC chip to the lead frame by wire bonding, forming a package with resin encapsulation, thereafter printing a solder paste on the circuit board, mounting the flat package IC thereon, and subjecting the IC to reflow. According to the above-mentioned method called SMT (Surface Mount Technology), the process of packaging the IC is long and requires much time for the production of IC components, and it has been difficult to miniaturize the circuit board. For example, an IC chip encapsulated in a flat pack occupies an area about four to ten times greater than that of the IC chip, and this has been a factor of hindering the miniaturization.

In contrast to this, the flip chip method for mounting an IC chip in a bear chip style directly on a board for the reduction of process and the reduction in size and weight has come to be adopted lately. With regard to this flip chip method, there are developed many processing methods such as stud bump bonding (SBB) for performing bump formation on an IC chip, bump leveling, Ag.Pd paste transfer, mounting, inspection, encapsulation with encapsulation resin, and inspection and UV resin bonding for concurrently performing bump formation on an IC chip and UV-curing resin coating on a board and thereafter performing mounting, UV-curing of resin and inspection.

However, any of the processing methods has had the drawback that much time is required for the hardening of the paste for bonding the bumps of the IC chip to the electrodes of the board and for the coating and hardening of the encapsulation resin, leading to degraded productivity. There has also been the issue that ceramic or glass of which the quantity of warp is controlled is needed as a circuit board, leading to cost increase.

Moreover, according to the processing method that uses a conductivity paste as in the first prior art for the bonding material, it has been required to level and flatten the IC chip bumps before use in order to stabilize the quantity of transfer.

Moreover, in the bonding structure with an anisotropic conducting adhesive as in the second prior art, there has been developed one that employs glass as a board material of the circuit board. It is required to hold conductive particles between the IC chip side electrode and the board side electrode for electric continuity between the electrodes, and therefore, it is required to uniformly disperse the conductive particles in the conductive adhesive. However, it is difficult to uniformly disperse the conductive particles in the conductive adhesive, and this has disadvantageously caused short circuit due to the abnormal dispersion of the particles and led to the expensive cost of the conductive adhesive and the necessity of the formation of the IC chip bumps by electroplating in order to shape the height of the bumps.

Moreover, according to the method of performing bonding using a UV-curing resin as in the third prior art, it is required to set a bump height variation within a range of ±1 (μm), and there has been the issue that the bonding cannot be achieved in the case of a board of a degraded flatness such as a resin board (glass epoxy board). Moreover, according to the method using solder, it has been required to pour and harden the encapsulation resin in order to alleviate the thermal expansion and shrinkage difference between the board and the IC chip after bonding. A time of two to eight hours has been needed for the hardening of the encapsulation resin, and this has led to the issue that the productivity is extremely degraded.

Accordingly, the object of the present invention is to solve the aforementioned issues and provide an electronic component mounting method and apparatus for bonding electronic components to circuit boards with high productivity and high reliability by interposing an anisotropic conductive layer that has conductive particles needing neither a resin encapsulation process for pouring a resin between an electronic component and a board nor a bump leveling process for shaping the bump height after the electronic component is bonded to the circuit board as well as an electronic component unit obtained by mounting the electronic component on the board by the above-mentioned mounting method.

SUMMARY OF THE INVENTION

In accomplishing these and other aspects, the present invention is constructed as follows.

According to a first aspect of the present invention, there is provided an electronic component mounting method comprising:

forming a ball at a tip of a metal wire by an electric spark similarly to wire bonding and forming a bump by thermocompression-bonding the formed ball to an electrode of an electronic component with supersonic waves by means of a capillary;

mounting the electronic component on a circuit board by aligning in position the electrode of the electronic component with an electrode of the board with interposition of an anisotropic conductive layer in which an insulating resin mixed with an inorganic filler is mixed with a conductive particle; and subsequently bonding the electronic component to the circuit board by hardening the insulating resin of the anisotropic conductive layer interposed between the electronic component and the circuit board while correcting warp of the board and crushing the bump with a pressure force of not smaller than 20 gf per bump applied to the electronic component against the circuit board by means of a tool and heat applied from the electronic component side or heat applied from the board side or heat applied from both the electronic component side and the board side, so that the electrode of the electronic component is electrically connected with the electrode of the circuit board.

According to a second aspect of the present invention, there is provided an electronic component mounting method as defined in the first aspect, wherein, before mounting the electronic component on the board by aligning in position the electrode of the electronic component with the electrode of the circuit board with interposition of the anisotropic conductive layer after the formation of the bump, a tip of the formed bump is shaped so as to prevent collapse of a neck portion of the bump by once pressurizing the bump with a load of not greater than 20 gf.

According to a third aspect of the present invention, there is provided an electronic component mounting method as defined in the first or second aspect, wherein the insulating resin of the anisotropic conductive layer is an insulative thermosetting epoxy resin, and an amount of the inorganic filler mixed with this insulative thermosetting epoxy resin is 5 to 90 wt % of the insulative thermosetting epoxy resin.

According to a fourth aspect of the present invention, there is provided an electronic component mounting method as defined in any one of the first through third aspects, wherein the insulating resin of the anisotropic conductive layer is in a liquid form when applied to the board, and after semi-solidifying the resin by hardening the liquid of the applied insulating resin with the board placed in a furnace or by pressurizing the liquid of the applied insulating resin by means of a heated tool after the application to the board, the electronic component is mounted on the board.

According to a fifth aspect of the present invention, there is provided an electronic component mounting method comprising:

forming a ball at a tip of a metal wire by an electric spark similarly to wire bonding and forming a gold bump by thermocompression-bonding the formed ball to an electrode of an electronic component with supersonic waves by means of a capillary;

mounting the electronic component on a circuit board by aligning in position the electrode of the electronic component with an electrode of the board with interposition of an anisotropic conductive layer in which an insulating resin mixed with an inorganic filler is mixed with a conductive particle without leveling the formed bump;

subsequently metallically bonding the gold bump to the electrode of the board with supersonic waves applied while shaping a tip so as to prevent collapse of a neck portion of the gold bump with a load applied from an upper surface side of the electronic component by means of a tool; and subsequently bonding the electronic component to the circuit board by hardening the insulating resin of the anisotropic conductive layer interposed between the electronic component and the circuit board while correcting warp of the board and crushing the bump with a pressure force of not smaller than 20 gf per bump applied to the electronic component against the circuit board and heat applied from the upper surface side of the electronic component or heat applied from the board side or heat applied from both the electronic component side and the board side, so that the electrode of the electronic component is electrically connected with the electrode of the circuit board.

According to a sixth aspect of the present invention, there is provided an electronic component mounting method as defined in any one of the first through fifth aspects, wherein the electronic component has a plurality of electrodes, a solid anisotropic conductive film sheet that has a configurational dimension smaller than an outline dimension defined by joining the plurality of electrodes of the electronic component is stuck as the anisotropic conductive layer to the circuit board before the positional alignment and thereafter subjected to the positional alignment, and at the bonding time, the insulating resin interposed between the electronic component and the circuit board is hardened by pressurizing the electronic component against the circuit board with heat applied to the anisotropic conductive film sheet while concurrently correcting the warp of the circuit board, so that the electronic component is bonded to the circuit board.

According to a seventh aspect of the present invention, there is provided an electronic component mounting method as defined in any one of the first through sixth aspects, wherein the gold bump that has an approximately conically shaped tip is formed on the electrode of the electronic component by means of the capillary that has a chamfer angle of not greater than 100° when a gold ball is formed by an electric spark at a tip of a gold wire similarly to the wire bonding in forming the bump on the electronic component and a tip shape provided with no flat portion to be brought in contact with the gold ball.

According to an eighth aspect of the present invention, there is provided an electronic component mounting method comprising:

forming a ball at a tip of a metal wire by an electric spark similarly to wire bonding and forming a bump on an electrode of an electronic component by means of a capillary by the formed ball;

mounting the electronic component on a circuit board by aligning in position the electrode of the electronic component with an electrode of the board with interposition of an anisotropic conductive layer in which an insulating resin mixed with an inorganic filler is mixed with a conductive particle without leveling the formed bump;

subsequently hardening the insulating resin of the anisotropic conductive layer interposed between the electronic component and the circuit board while correcting warp of the board with a pressure P1 applied as a pressure force to the electronic component against the circuit board and heat applied from an upper surface of the electronic component by means of a tool heated to a specified temperature; and subsequently bonding the electronic component to the circuit board while alleviating a stress when hardening the insulating resin of the anisotropic conductive layer by reducing the pressure force to a pressure P2 lower than the pressure P1 after a lapse of a specified time, so that the electrode of the electronic component is electrically connected with the electrode of the circuit board.

According to a ninth aspect of the present invention, there is provided an electronic component mounting method as defined in the eighth aspect, wherein the pressure P1 is not smaller than 20 gf per bump, and the pressure P2 is not greater than one-half the pressure P1.

According to a 10th aspect of the present invention, there is provided an electronic component mounting apparatus comprising:
a device for sticking an anisotropic conductive layer, in which an insulating resin mixed with an inorganic filler is mixed with a conductive particle, to an electrode of a circuit board or an electronic component;
a device for forming a bump, without leveling, by forming a ball by an electric spark at a tip of a metal wire on an electrode of the electronic component similarly to wire bonding and forming by thermocompression-bonding this to the electrode of the board with supersonic waves by means of a capillary;
a device for mounting the electronic component on the electrode of the circuit board through positional alignment; and
a device for bonding the electronic component to the circuit board by hardening the insulating resin of the anisotropic conductive layer interposed between the electronic component and the circuit board while correcting warp of the board with a pressure force of not smaller than 20 gf per bump applied to the electronic component against the circuit board and with heating by means of the tool, so that the electrode of the electronic component is electrically connected with the electrode of the circuit board.

According to an 11th aspect of the present invention, there is provided an electronic component mounting apparatus comprising:
a device for sticking an anisotropic conductive layer, in which an insulating resin mixed with an inorganic filler is mixed with a conductive particle, to an electrode of a circuit board or an electronic component;
a device for forming a gold bump, without leveling, by forming a ball by an electric spark at a tip of a metal wire on an electrode of the electronic component similarly to wire bonding and forming by thermocompression-bonding this to the electrode of the board with supersonic waves by means of a capillary;
a device for mounting the electronic component on the electrode of the circuit board through positional alignment;
a device for metallically bonding the gold bump to the electrode of the board with supersonic waves applied while shaping the tip so as to prevent collapse of a neck portion of the gold bump with a load applied from an upper surface of the electronic component by means of a tool; and
a device for bonding the electronic component to the circuit board by hardening the insulating resin of the anisotropic conductive layer interposed between the electronic component and the circuit board while correcting warp of the board and crushing the bump with a pressure force of not smaller than 20 gf per bump applied to the electronic component against the circuit board with heating by means of the tool, so that the electrode of the electronic component is electrically connected with the electrode of the circuit board.

According to a 12th aspect of the present invention, there is provided an electronic component mounting method as defined in any one of the 10th through 11th aspects, wherein the device for forming the gold ball has the capillary, which has a tip shape provided with no flat portion to be brought in contact with the gold ball and of which a chamfer angle is not greater than 100°, and the gold bump that has an approximately conically shaped tip is formed on the electrode of the electronic component by the capillary.

According to a 13th aspect of the present invention, there is provided an electronic component mounting apparatus comprising:
a device for sticking an anisotropic conductive layer, in which an insulating resin mixed with an inorganic filler is mixed with a conductive particle, to a circuit board or an electronic component;
a device for forming a bump, without leveling, by forming a ball by an electric spark at a tip of a metal wire on an electrode of the electronic component similarly to wire bonding and forming this on the electrode of the board by means of a capillary;
a device for mounting the electronic component on the electrode of the circuit board through positional alignment; and
a device for hardening the insulating resin interposed between the electronic component and the circuit board while correcting warp of the board with a pressure P1 applied as a pressure force to the electronic component against the circuit board and heat applied from an upper surface of the electronic component by means of a tool heated to a specified temperature and subsequently bonding the electronic component to the circuit board while alleviating a stress caused when hardening the insulating resin of the anisotropic conductive layer by reducing the pressure force to a pressure P2 lower than the pressure P1 after a lapse of a specified time, so that the electrode of the electronic component is electrically connected with the electrode of the circuit board.

According to a 14th aspect of the present invention, there is provided an electronic component mounting method as defined in any one of the first through third aspects, wherein a mean particle diameter of the inorganic filler mixed with the insulating resin of the anisotropic conductive layer is not smaller than 3 μm.

According to a 15th aspect of the present invention, there is provided an electronic component mounting method as defined in any one of the first through third and 14th aspects, wherein the inorganic filler mixed with the insulating resin of the anisotropic conductive layer is comprised of at least two types of inorganic fillers that have a plurality of different mean particle diameters, and a mean particle diameter of one inorganic filler out of at least two types of inorganic fillers is not less than two times different from a mean particle diameter of the other inorganic filler out of at least two types of inorganic fillers.

According to a 16th aspect of the present invention, there is provided an electronic component mounting method as defined in any one of the first through third, 14th, and 15th aspects, wherein the anisotropic conductive layer has a portion brought in contact with either the electronic component or the board, the portion having a smaller amount of inorganic filler than that of the other portion.

According to a 17th aspect of the present invention, there is provided an electronic component mounting method as defined in the 16th aspect, wherein the anisotropic conductive layer has a portion brought in contact with both the electronic component and the board, the portion having a smaller amount of inorganic filler than that of the other portion.

According to an 18th aspect of the present invention, there is provided an electronic component unit, wherein an electrode of an electronic component is electrically connected to an electrode of a circuit board with a bump formed on the electrode of the electronic component and bonded to the electrode of the circuit board in a state in which the bump is crushed with interposition of an anisotropic conductive layer, in which an insulating resin is mixed with an inorganic filler and hardened, and the anisotropic conductive layer has a portion brought in contact with either the electronic component or the board, the portion having a smaller amount of inorganic filler than that of the other portion.

According to a 19th aspect of the present invention, there is provided an electronic component unit, wherein an electrode of an electronic component is electrically connected to an electrode of a circuit board with a bump formed on the electrode of the electronic component and bonded to the electrode of the circuit board in a state in which the bump is crushed with interposition of an anisotropic conductive layer, in which an insulating resin is mixed with an inorganic filler and hardened, and the anisotropic conductive layer comprises: a first resin layer, which is positioned in a portion brought in contact with either the electronic component or the board and in which an insulating resin identical to the insulating resin is mixed with the inorganic filler; and a second resin layer, which is in contact with the first resin layer and is made of an insulating resin whose amount of the inorganic filler is less than that of the first resin layer.

According to a 20th aspect of the present invention, there is provided an electronic component mounting method as defined in any one of the first through ninth and 14th through 17th aspects, wherein the bump is a bump formed by plating or printing.

According to a 21st aspect of the present invention, there is provided an electronic component unit as defined in any one of the 18th through 19th aspects, wherein the bump is a bump formed by plating or printing.

According to a 22nd aspect of the present invention, there is provided an electronic component mounting method as defined in any one of the first through ninth, 14th through 17th, and 20th aspects, wherein the anisotropic conductive layer is provided by mixing the solid insulating resin mixed with the inorganic filler with a conductive particle that has a mean diameter greater than a mean particle diameter of the inorganic filler.

According to a 23rd aspect of the present invention, there is provided an electronic component mounting apparatus as defined in any one of the 10th through 12th aspects, wherein the anisotropic conductive layer is provided by mixing the solid insulating resin mixed with the inorganic filler with a conductive particle that has a mean diameter greater than a mean particle diameter of the inorganic filler.

According to a 24th aspect of the present invention, there is provided an electronic component unit as defined in any one of the 18th through 19th and 21st aspects, wherein the anisotropic conductive layer is provided by mixing the solid insulating resin mixed with the inorganic filler with a conductive particle that has a mean diameter greater than a mean particle diameter of the inorganic filler.

According to a 25th aspect of the present invention, there is provided an electronic component mounting method comprising:

forming a ball at a tip of a metal wire by an electric spark similarly to wire bonding and forming a bump by thermocompression-bonding the formed ball to an electrode of an electronic component with supersonic waves by means of a capillary;

mounting the electronic component on a circuit board while aligning in position the electrode of the electronic component with an electrode of the board with interposition of a solid or semi-solid insulating resin layer in which an insulating resin is mixed with an inorganic filler without leveling the formed bump; and subsequently bonding the electronic component to the circuit board by hardening the insulating resin layer interposed between the electronic component and the circuit board while correcting warp of the board and crushing the bump with a pressure force of not smaller than 20 gf per bump applied to the electronic component against the circuit board by means of a tool and heat applied from the electronic component side or heat applied from the board side or heat applied from both the electronic component side and the board side, so that the electrode of the electronic component is electrically connected with the electrode of electrically connected the circuit board.

According to a 26th aspect of the present invention, there is provided an electronic component mounting method as defined in the 25th aspect, wherein, before mounting the electronic component on the board while aligning in position the electrode of the electronic component with the electrode of the circuit board with interposition of the solid or semi-solid insulating resin layer in which the insulating resin is mixed with the inorganic filler after the formation of the bump, a tip of the formed bump is shaped so as to prevent collapse of a neck portion of the bump by once pressurizing the bump with a load of not greater than 20 gf.

According to a 27th aspect of the present invention, there is provided an electronic component mounting method as defined in the 25th or 26th aspect, wherein the insulating resin is an insulative thermosetting epoxy resin, and an amount of the inorganic filler mixed with this insulative thermosetting epoxy resin is 5 to 90 wt % of the insulative thermosetting epoxy resin.

According to a 28th aspect of the present invention, there is provided an electronic component mounting method comprising:

forming a ball at a tip of a metal wire by an electric spark similarly to wire bonding and forming a gold bump by thermocompression-bonding the formed ball to an electrode of an electronic component with supersonic waves by means of a capillary;

mounting the electronic component on a circuit board while aligning in position the electrode of the electronic component with an electrode of the board with interposition of a solid or semi-solid insulating resin layer in which an insulating resin is mixed with an inorganic filler without leveling the formed bump;

subsequently metallically bonding the gold bump to the electrode of the board with supersonic waves applied while shaping the tip so as to prevent collapse of a neck portion of the gold bump with a load applied from an upper surface side of the electronic component by means of a tool; and subsequently bonding the electronic component to the circuit board by hardening the insulating resin interposed between the electronic component and the circuit board while correcting warp of the board and crushing the bump with a pressure force of not smaller than 20 gf per bump applied to the electronic component against the circuit board and heat applied from the upper surface side of the electronic component or heat applied from the board side or heat applied from both the electronic component side and the board side, so that the electrode of the electronic component is electrically connected with the electrode of the circuit board.

According to a 29th aspect of the present invention, there is provided an electronic component mounting method as defined in any one of the 25th through 28th aspects, wherein the electronic component has a plurality of electrodes, a solid insulating resin sheet that has a configurational dimension smaller than an outline dimension defined by joining the plurality of electrodes of the electronic component is stuck as the insulating resin layer to the circuit board before the positional alignment and thereafter subjected to the positional alignment, and at the bonding time, the insulating resin interposed between the electronic component and the circuit board is hardened while concurrently correcting the warp of the circuit board by pressurizing the electronic component against the circuit board with heat applied to the insulating resin sheet, so that the electronic component is bonded to the circuit board.

According to a 30th aspect of the present invention, there is provided an electronic component mounting method as defined in any one of the 25th through 29th aspects, wherein the gold bump that has an approximately conically shaped tip is formed on the electrode of the electronic component by means of the capillary that has a chamfer angle of not greater than 100° when a gold ball is formed by an electric spark at a tip of a gold wire similarly to the wire bonding in forming the bump on the electronic component and a tip shape provided with no flat portion to be brought in contact with the gold ball.

According to a 31st aspect of the present invention, there is provided an electronic component mounting method comprising:

forming a ball at a tip of a metal wire by an electric spark similarly to wire bonding and forming a bump on an electrode of an electronic component by means of a capillary by the formed ball;

mounting the electronic component on a circuit board while aligning in position the electrode of the electronic component with an electrode of the board with interposition of a solid or semi-solid insulating resin layer in which an insulating resin is mixed with an inorganic filler without leveling the formed bump;

subsequently hardening the insulating resin interposed between the electronic component and the circuit board while correcting warp of the board with a pressure P1 applied as a pressure force to the electronic component against the circuit board and heat applied from an upper surface of the electronic component by means of a tool heated to a specified temperature; and subsequently bonding the electronic component to the circuit board while alleviating a stress caused when hardening the insulating resin by reducing the pressure force to a pressure P2 lower than the pressure P1 after a lapse of a specified time, so that the electrode of the electronic component is electrically connected with the electrode of the circuit board.

According to a 32nd aspect of the present invention, there is provided an electronic component mounting method as defined in the 31st aspect, wherein the pressure P1 is not smaller than 20 gf per bump, and the pressure P2 is not greater than one-half the pressure P1.

According to a 33rd aspect of the present invention, there is provided an electronic component mounting apparatus comprising:

a device for sticking a solid or semi-solid insulating resin layer, in which an insulating resin is mixed with an inorganic filler, to an electrode of a circuit board or an electronic component;

a device for forming a bump, without leveling, by forming a ball by an electric spark at a tip of a metal wire on an electrode of the electronic component similarly to wire bonding and forming by thermocompression-bonding this to the electrode of the board with supersonic waves by means of a capillary;

a device for mounting the electronic component on the electrode of the circuit board through positional alignment; and a device for bonding the electronic component to the circuit board by hardening the insulating resin interposed between the electronic component and the circuit board while correcting warp of the board with a pressure force of not smaller than 20 gf per bump applied to the electronic component against the circuit board with heating by means of the tool, electrically connecting the electrode of the electronic component with the electrode of the circuit board.

According to a 34th aspect of the present invention, there is provided an electronic component mounting apparatus comprising:

a device for sticking a solid or semi-solid insulating resin layer, in which an insulating resin is mixed with an inorganic filler, to an electrode of a circuit board or an electronic component;

a device for forming a gold bump, without leveling, by forming a ball by an electric spark at a tip of a metal wire on an electrode of the electronic component similarly to wire bonding and forming by thermocompression-bonding this to the electrode of the board with supersonic waves by means of a capillary;

a device for mounting the electronic component on the electrode of the circuit board through positional alignment;

a device for metallically bonding the gold bump to the electrode of the board with supersonic waves applied while shaping the tip so as to prevent collapse of a neck portion of the gold bump with a load applied from an upper surface of the electronic component by means of a tool; and a device for bonding the electronic component to the circuit board by hardening the insulating resin interposed between the electronic component and the circuit board while correcting warp of the board and crushing the bump with a pressure force of not smaller than 20 gf per bump applied to the electronic component against the circuit board with heating by means of the tool, so that the electrode of the electronic component is electrically connected with the electrode of the circuit board.

According to a 35th aspect of the present invention, there is provided an electronic component mounting apparatus comprising:

a device for sticking a solid or semi-solid insulating resin layer, in which an insulating resin is mixed with an inorganic filler, to a circuit board or an electronic component;

a device for forming a bump, without leveling, by forming a ball by an electric spark at a tip of a metal wire on an electrode of the electronic component similarly to wire bonding and forming this on the electrode of the board by means of a capillary;

a device for mounting the electronic component on the electrode of the circuit board through positional alignment; and a device for hardening the insulating resin interposed between the electronic component and the circuit board while correcting warp of the board with a pressure P1 applied as a pressure force to the electronic component against the circuit board and heat applied from an upper surface of the electronic component by means of a tool heated to a specified temperature and subsequently bonding the electronic component to the circuit board while alleviating a stress caused when hardening the insulating resin by reducing the pressure force to a pressure P2 lower than the pressure P1 after a lapse of a specified time, so that the electrode of the electronic component is electrically connected with the electrode of the circuit board.

According to a 36th aspect of the present invention, there is provided an electronic component mounting method as defined in any one of the 25th through 27th aspects, wherein the inorganic filler mixed with the insulating resin is provided by a plurality of types of inorganic fillers, which have different mean particle diameters.

According to a 37th aspect of the present invention, there is provided an electronic component mounting method as defined in any one of the 25th through 27th and 36th aspects, wherein the insulating resin layer has a portion brought in contact with either the electronic component or the board, the portion having a smaller amount of inorganic filler than that of the other portion.

According to a 38th aspect of the present invention, there is provided an electronic component mounting method as defined in the 37th aspect, wherein the insulating resin layer has a portion brought in contact with both the electronic component and the board, the portion having a smaller amount of inorganic filler than that of the other portion.

According to a 39th aspect of the present invention, there is provided an electronic component mounting method as defined in the 37th or 38th aspect, wherein the portion brought in contact with the electronic component is provided by an insulating resin that improves adhesion to a film material used on a surface of the electronic component, and the portion brought in contact with the board is provided by an insulating resin that improves adhesion to a material used on a surface of the board.

According to a 40th aspect of the present invention, there is provided an electronic component mounting method as defined in any one of the 25th through 27th and 36th aspects, wherein the insulating resin layer has a portion brought in contact with either the electronic component or the board, the portion being mixed with no inorganic filler.

According to a 41st aspect of the present invention, there is provided an electronic component unit, wherein an electrode of an electronic component is electrically connected to an electrode of a circuit board with a bump formed on the electrode of the electronic component and bonded to the electrode of the circuit board in a state in which the bump is crushed with interposition of an insulating resin layer, in which an insulating resin is mixed with an inorganic filler and hardened, and the insulating resin layer has a portion brought in contact with either the electronic component or the board, the portion having a smaller amount of inorganic filler than that of the other portion.

According to a 42nd aspect of the present invention, there is provided an electronic component unit, wherein an electrode of an electronic component is electrically connected to an electrode of a circuit board with a bump formed on the electrode of the electronic component and bonded to the electrode of the circuit board in a state in which the bump is crushed with interposition of an insulating resin layer, in which an insulating resin is mixed with an inorganic filler and hardened, and the insulating resin layer comprises: a first resin layer, which is positioned in a portion brought in contact with either the electronic component or the board and in which an insulating resin identical to the insulating resin is mixed with the inorganic filler; and a second resin layer, which is in contact with the first resin layer and is made of an insulating resin whose amount of the inorganic filler is less than that of the first resin layer.

According to a 43rd aspect of the present invention, there is provided an electronic component mounting method as defined in the 5th or 28th aspect, wherein heating is effected from the upper surface side of the electronic component or from the board side or from both the electronic component side and the board side when metallically bonding the gold bump to the electrode of the board with supersonic waves applied.

According to a 44th aspect of the present invention, there is provided an electronic component unit, wherein the electronic component is mounted on the board by the electronic component mounting method defined in any one of the first through ninth, 14th through 17th, 25th through 32nd, 36th through 40th and 43rd aspects.

According to a 45th aspect of the present invention, there is provided an electronic component mounting apparatus as defined in the 11th or 34th aspect, wherein the apparatus for metallically bonding the gold bump to the electrode of the board with supersonic waves applied comprises a heating member for effecting heating from the upper surface side of the electronic component or from the board side or from both the electronic component side and the board side, and the heating is effected by the heating member at a time of metallic bonding.

BRIEF DESCRIPTION OF DRAWINGS

These and other aspects and features of the present invention will become clear from the following description taken in conjunction with the preferred embodiments thereof with reference to the accompanying drawings, in which:

FIG. 1A, FIG. 1B, FIG. 1C, FIG. 1D, FIG. 1E, FIG. 1F, and FIG. 1G are explanatory views showing a method for mounting an electronic component such as an IC chip on a circuit board according to a first embodiment of the present invention;

FIG. 5A, FIG. 5B and FIG. 5C are explanatory views showing a process for bonding an IC chip to a circuit board by the mounting method of the first embodiment of the present invention;

FIG. 7A, FIG. 7B, FIG. 7C, FIG. 7D, FIG. 7E and FIG. 7F are explanatory views for explaining a thermosetting adhesive arranged on a circuit board in place of an anisotropic conductive film sheet according to a modification example of FIG. 6A through FIG. 6E by the mounting method of the third embodiment of the present invention;

FIG. 10A, FIG. 10B, FIG. 10C and FIG. 10D are explanatory views showing a process for bonding an IC chip to a circuit board by a mounting method according to a sixth embodiment of the present invention;

FIG. 11A, FIG. 11B, FIG. 11C, FIG. 11D and FIG. 11E are explanatory views showing a process for bonding an IC chip to a circuit board by the mounting method of the sixth embodiment of the present invention;

FIG. 13 is an explanatory view showing a pressure profile used in a process for bonding an IC chip to a circuit board by the mounting method of the seventh embodiment of the present invention;

FIG. 38A, FIG. 38B, FIG. 38C, FIG. 38D, FIG. 38E, FIG. 38F and FIG. 38G are explanatory views showing a method and apparatus for mounting an electronic component of, for example, an IC chip on a circuit board according to a sixteenth embodiment of the present invention;

FIG. 44A, FIG. 44B, FIG. 44C, FIG. 44D, FIG. 44E and FIG. 44F are explanatory views for explaining a thermosetting adhesive arranged on a circuit board according to modification examples of FIG. 43A through FIG. 43C in place of a thermosetting resin sheet by the mounting method of the eighteenth embodiment of the present invention;

FIG. 48A, FIG. 48B, FIG. 48C, FIG. 48D and FIG. 48E are explanatory views showing a process for bonding an IC chip to a circuit board by the mounting method of the twenty-first embodiment of the present invention;

DETAILED DESCRIPTION OF THE PREFERRED EMBODIMENTS

Figure 2A:
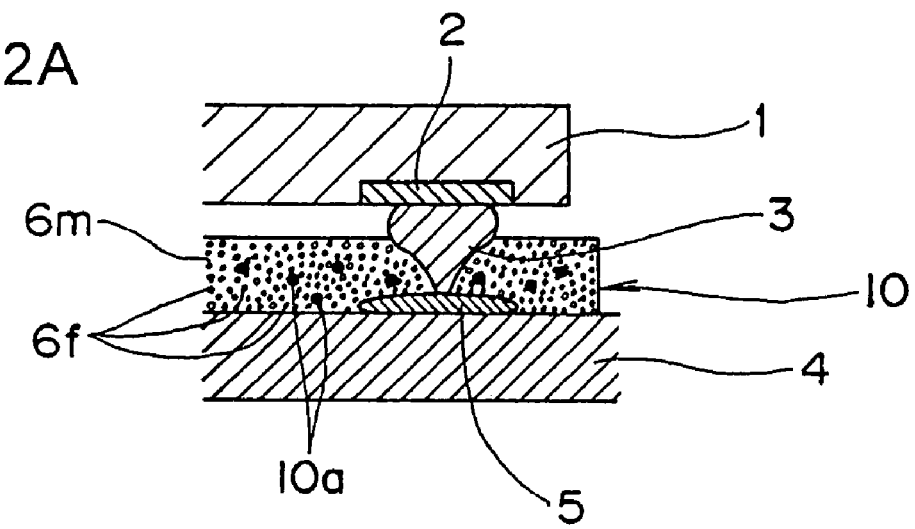
FIG. 2A and FIG. 2B are explanatory views showing a state in which an inorganic filler in a thermosetting resin is forced outwardly of a bump due to a pointed bump that enters the thermosetting resin at the beginning of bonding by a method for mounting an electronic component of, for example, an IC chip on a circuit board according to the first embodiment.

Before the description of the present invention proceeds, it is to be noted that like parts are designated by like reference numerals throughout the accompanying drawings.

Embodiments of the present invention will be described in detail below with reference to the drawings.

First Embodiment

A method and apparatus for mounting an IC chip onto a circuit board as an example of an electronic component mounting method and apparatus and an electronic component unit or module such as a semiconductor device in which the IC chip is mounted on the board by the mounting method, according to a first embodiment of the present invention will be described below with reference to FIG. 1A through FIG. 14.

Reference is first made to the method for mounting an IC chip onto a circuit board according to the first embodiment of the present invention with reference to FIG. 1A through FIG. 4C and FIGS. 6A through 6F.

Figure 3A:
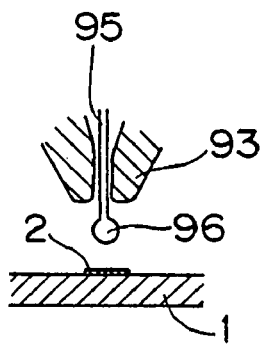
FIG. 3A, FIG. 3B, FIG. 3C, FIG. 3D, FIG. 3E, FIG. 3F, and FIG. 3G are explanatory views showing a bump forming process by means of a wire bonder for an IC chip by the mounting method of the first embodiment of the present invention.
Figure 3B:
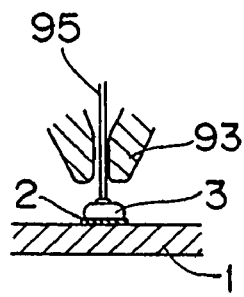
Figure 3C:
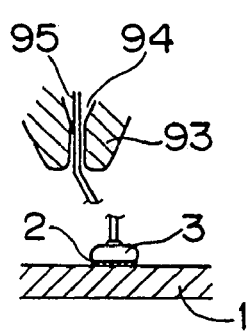
Figure 3D:
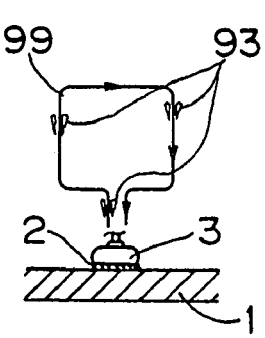
Figure 3E:
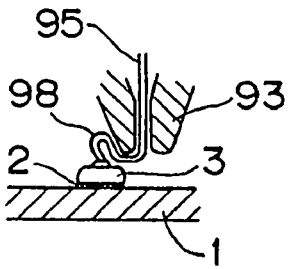
Figure 3G:
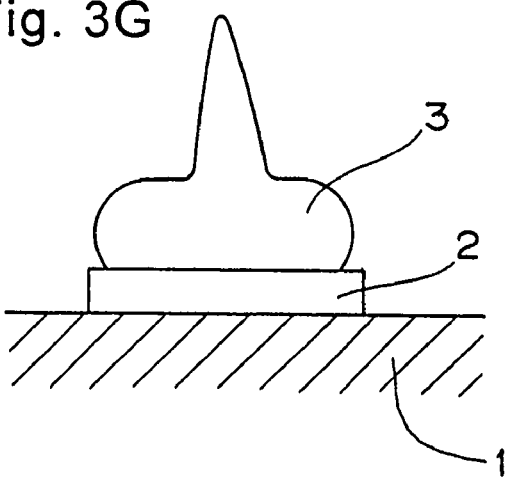
Figure 3F:
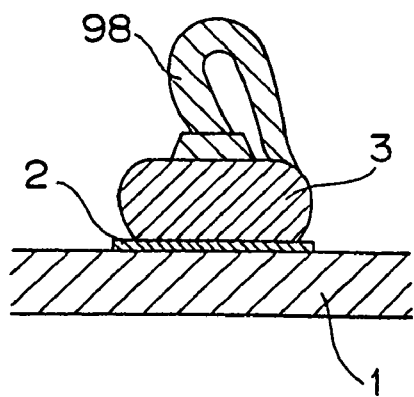

A bump (protruding-electrode) 3 is formed on an Al pad electrode 2 of an IC chip 1, that serves as one example of an electronic component, of FIG. 1A by a wire bonding device through an operation shown in FIG. 3A through FIG. 3F. That is, a ball 96 is formed at a lower end of a wire 95 protruding from a capillary 93 that serves as a holder in FIG. 3A, and the capillary 93 that is holding the wire 95 is lowered in FIG. 3B so as to bond the ball 96 to the electrode 2 of the chip 1, roughly forming a shape of the bump 3. By making the capillary 93 start to move up while downwardly feeding the wire 95 in FIG. 3C, moving the capillary 93 in an approximately rectangle-shaped loop 99 as shown in FIG. 3D to form a curved portion 98 on the bump 3 as shown in FIG. 3E, and tearing the wire, the bump 3 as shown in FIG. 1B and FIG. 3F is formed. Otherwise, by clamping the wire 95 by the capillary 93 and pulling the capillary 93 upwardly in FIG. 3B, the metal wire of, for example, gold (gold line) 95 (note that examples of the metal wire include those made of zinc, aluminum, copper, or an alloy obtained by incorporating a trace element into these metals, and the gold wire (gold line) will hereinafter be referred to as a representative example in the following embodiments) may be torn so as to form a bump 3 of a shape as shown in FIG. 3G. A state in which the bump 3 is thus formed on each electrode 2 of the chip 1 is shown in FIG. 1B.

Figure 36:
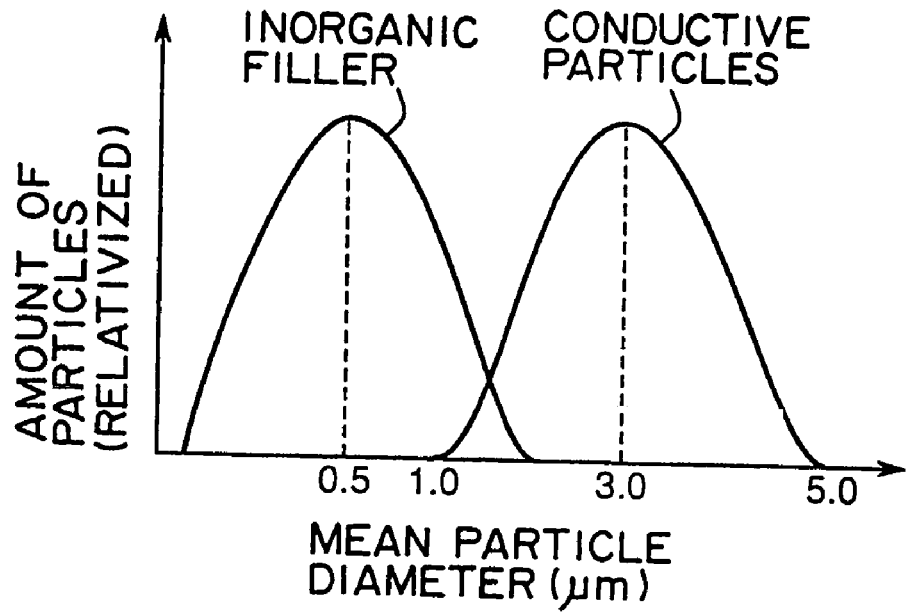
FIG. 36 is a graph of the distribution of the mean diameter of the conductive particles and the mean diameter of the particles of an inorganic filler in one concrete example of the first embodiment.

Next, in the present embodiment, an anisotropic conductive film (ACF) sheet 10 is interposed, as one example of an anisotropic conductive layer, between a circuit board 4 and the IC chip 1 when the IC chip with the electrodes 2, on each of which the bump 3 is formed, is to be mounted onto the circuit board 4. This anisotropic conductive film sheet 10 contains an inorganic filler 6f, of a mean diameter smaller than a mean diameter of conductive particles 10a in the conductive film sheet, that has an insulative thermosetting property. For example, as shown in FIG. 36, assuming that the mean diameter of the conductive particles 10a is set to 0.5 μm smaller than a mean diameter of 1.0 μm of conductive particles 10a of a conventional ACF, then the mean diameter of the particles of the inorganic filler 6f is set to about 3 to 5 μm. As the conductive particles 10a contained in the anisotropic conductive film sheet 10, nickel powder plated with gold is employed. With this arrangement, a connection resistance between electrode 5, located on the board 4, and the bump 3 located on the IC chip can be reduced, more satisfactorily.

More preferably, by providing the conductive particles 10a as conductive particles whose conductive particle bodies 10a-1 are outwardly coated with an insulating layer 10a-2, and setting an amount of the conductive particles 10a more than double that generally employed in an anisotropic conductive film, the conductive particles 10a are held by the bump 3 with a certain probability. This enables an improvement with regard to tolerance of a thermal impact due to swelling caused by absorbed moisture and subsequent reflow. If the conductive particle bodies 10a-1 thus coated with insulation layer 10a-2 is placed between the bump 3 and the board electrode 5, then the insulation layer 10a-2 is abraded away to expose the conductive particle bodies 10a-1, which then perform their function of conduction. Accordingly, the insulation layer 10a-2 is not abraded away at a location that is not placed between the bump 3 and the electrode 5, and therefore, performance of conduction of the conductive particle bodies 10a-1 do not take effect here. Accordingly, a short circuit between the electrode 5 and the electrode 3 is difficult to occur in a surface direction. Moreover, when a stud bump is employed, it is usually difficult to place the conductive particles 10a between the electrode 5 and the bump 3 since its top portion has a small area. Therefore, it is required to incorporate a large amount of conductive particles 10a. However, in doing so, the conductive particles sometimes come into contact with each other, thereby possibly causing a short circuit between the electrodes 2 and 5. Therefore, it is preferable to employ conductive particle bodies that are coated with an insulation layer. Moreover, a reason why a reflow characteristic and the like are improved is because, when an anisotropic conductive film forming adhesive (or anisotropic conductive film sheet) swells in a Z-direction (a direction of thickness of the anisotropic conductive film sheet) caused by swelling due to factors of temperature and humidity, the conductive particles 10a swell more than that, allowing a connection to be maintained. Therefore, it is preferable to employ Au—Ni particle bodies having a repulsion power and coated with plastic, or the like, for the conductive particles 10a.

Next, as shown in FIG. 1D, the anisotropic conductive film sheet 10, which is cut into a size slightly larger than a size of the chip 1 and includes inorganic filler 6f, is arranged on the electrodes 5 of the circuit board 4 of FIG. 1C, and the anisotropic conductive film sheet 10 is adhered to the board 4 with a pressure force of, for example, about 5 to 10 kgf/cm$^2$ by virtue of a pressing tool 7 heated to, for example, 80 to 120° C. Subsequently, by peeling off a separator 10g, removably arranged on the pressing tool side of the anisotropic conductive film sheet 10, a preparation process of the board 4 is completed. This separator 10g is to prevent the anisotropic conductive film sheet 10, that contains a solid or semi-solid thermosetting resin mixed with the inorganic filler 6f, from adhering to the pressing tool 7. In this case, as shown in FIG. 1G, which is an enlarged view of portion G of FIG. 1F, the anisotropic conductive film sheet 10 is preferably provided by mixing an insulating resin 6m with an inorganic filler 6f of ceramics of spherical or pulverized silica, alumina or the like, having a mean diameter smaller than a mean diameter of the conductive particles 10a in dispersion, flattening this mixture by a doctor blade method or the like, and vaporizing a solvent component for solidification. The conductive film sheet 10 preferably has a heat resistance sufficient for tolerating a high temperature in a subsequent reflow process (for example, a heat resistance capable of tolerating a temperature of 240° C. for ten seconds). The insulating resin 6m can be, for example, an insulative thermosetting resin (for example, epoxy resin, phenol resin, and polyimide) or an insulative thermoplastic resin (for example, polyphenylene sulfide (PPS), polycarbonate, and modified polyphenylene oxide (PPO)), a mixture of an insulative thermosetting resin with an insulative thermoplastic resin, or the like. In this case, description will be continued with the insulative thermosetting resin taken as a representative example. This insulative thermosetting resin 6m generally has a glass transition point of about 120 to 200° C. When only a thermoplastic resin is employed, the resin is once initially softened by heating and then hardened by being naturally cooled with the heating stopped. When a mixture of an insulative thermosetting resin with an insulative thermoplastic resin is employed, this resin mixture is hardened by being heated similarly to a case of only using a thermosetting resin because the thermosetting resin functions predominantly.

Figure 2B:
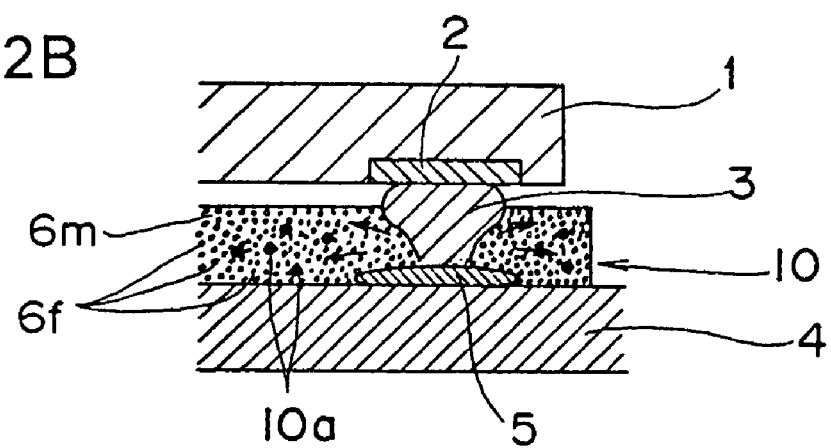
Figure 2C:
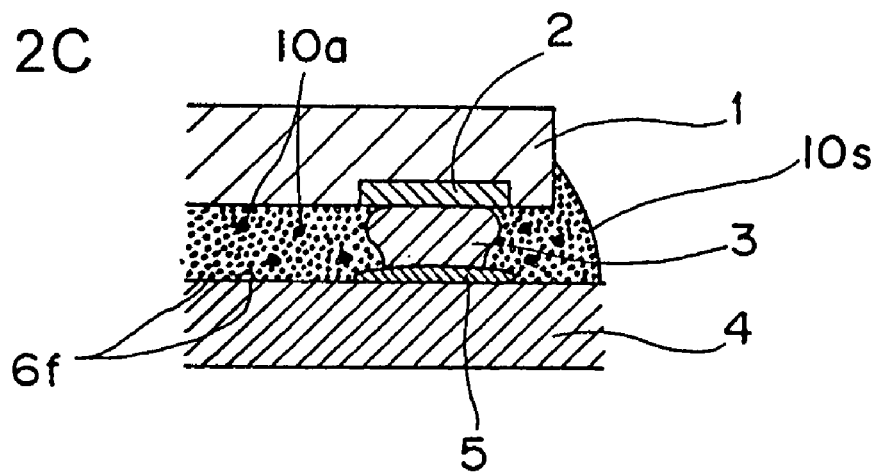
FIG. 2C is an explanatory view of a state in which no inorganic filler enters a space between the bump and the board electrode.
Figure 4A:
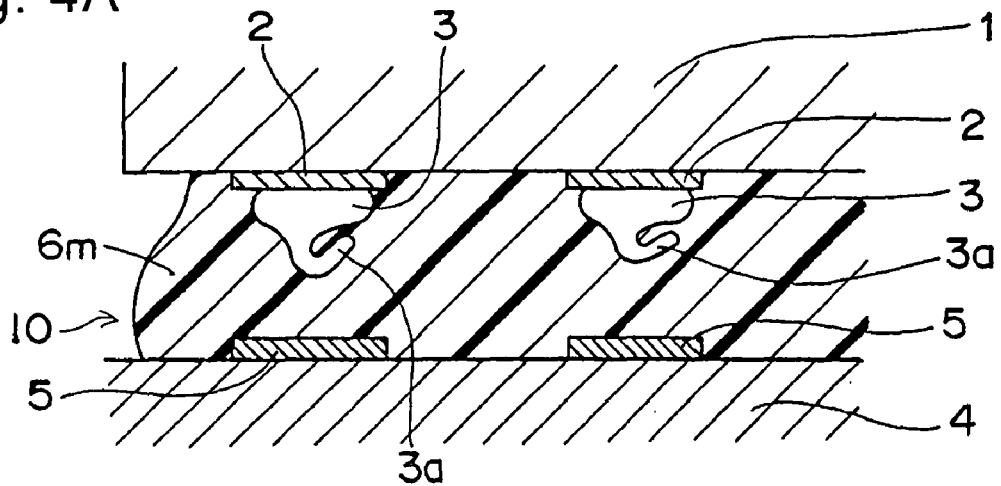
FIG. 4A, FIG. 4B and FIG. 4C are explanatory views showing a process for bonding an IC chip to a circuit board by the mounting method of the first embodiment of the present invention.
Figure 4B:
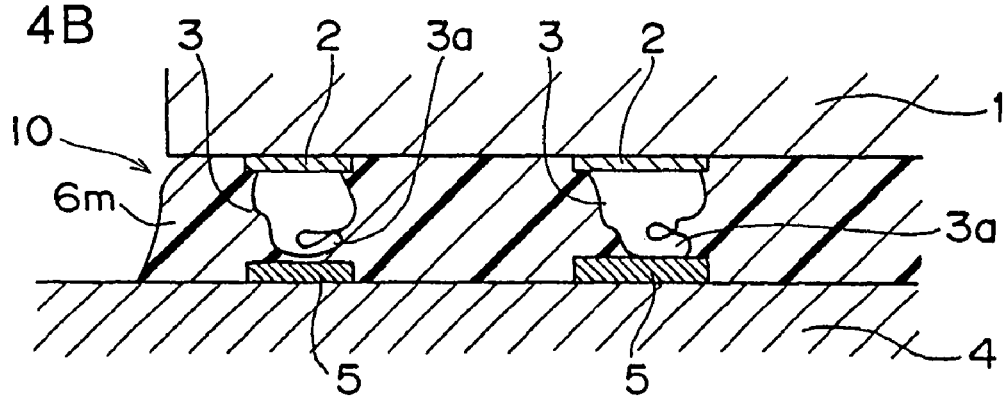
Figure 4C:
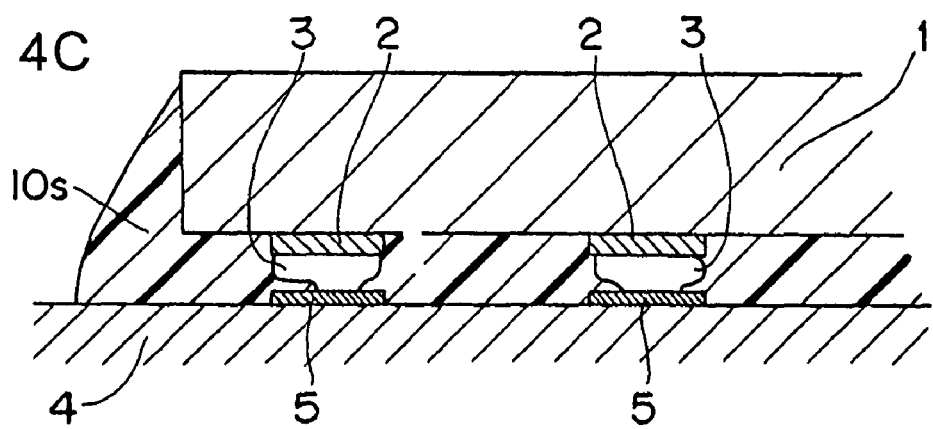
Figure 17:
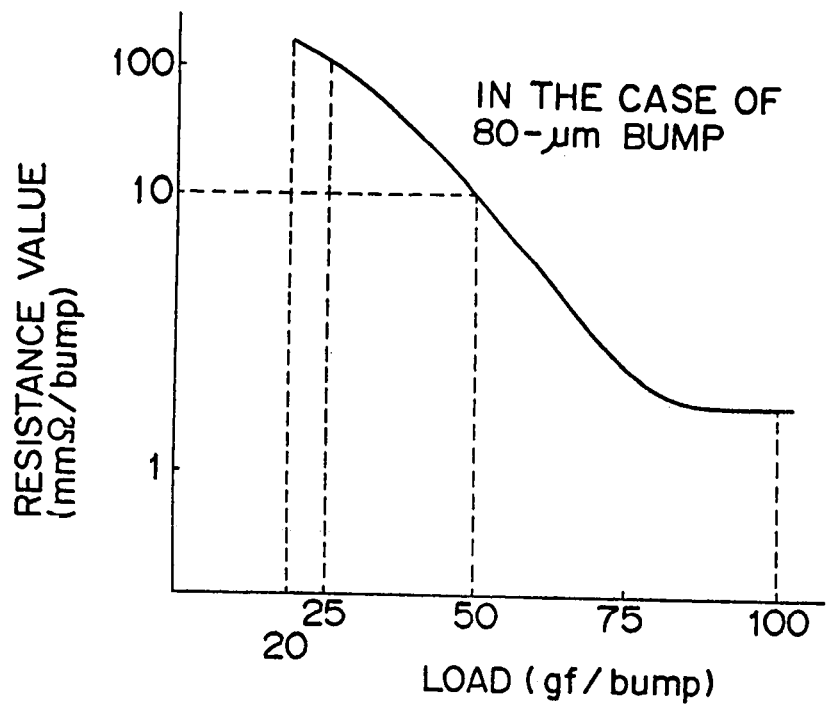
FIG. 17 is a graph of a relation between a resistance value and a load in the case of a bump that has an outside diameter of 80 µm in the first embodiment.
Figure 18:
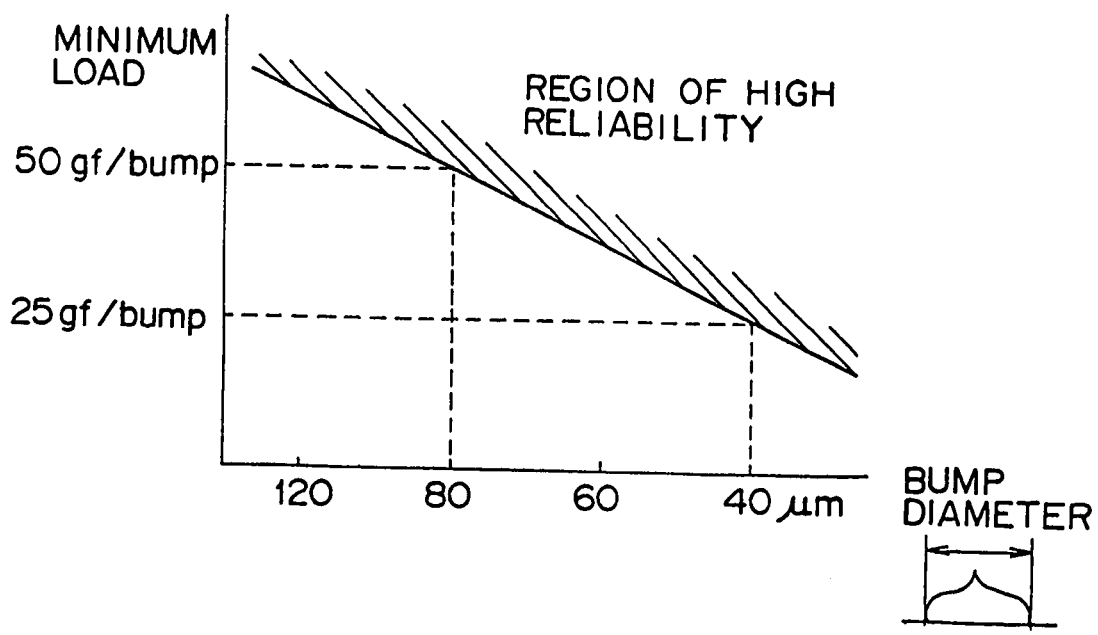
FIG. 18 is a graph showing a region of high reliability based on a relation between bumps that have outside diameters of 80 µm and 40 µm and a minimum load in the first embodiment.
Figure 20:
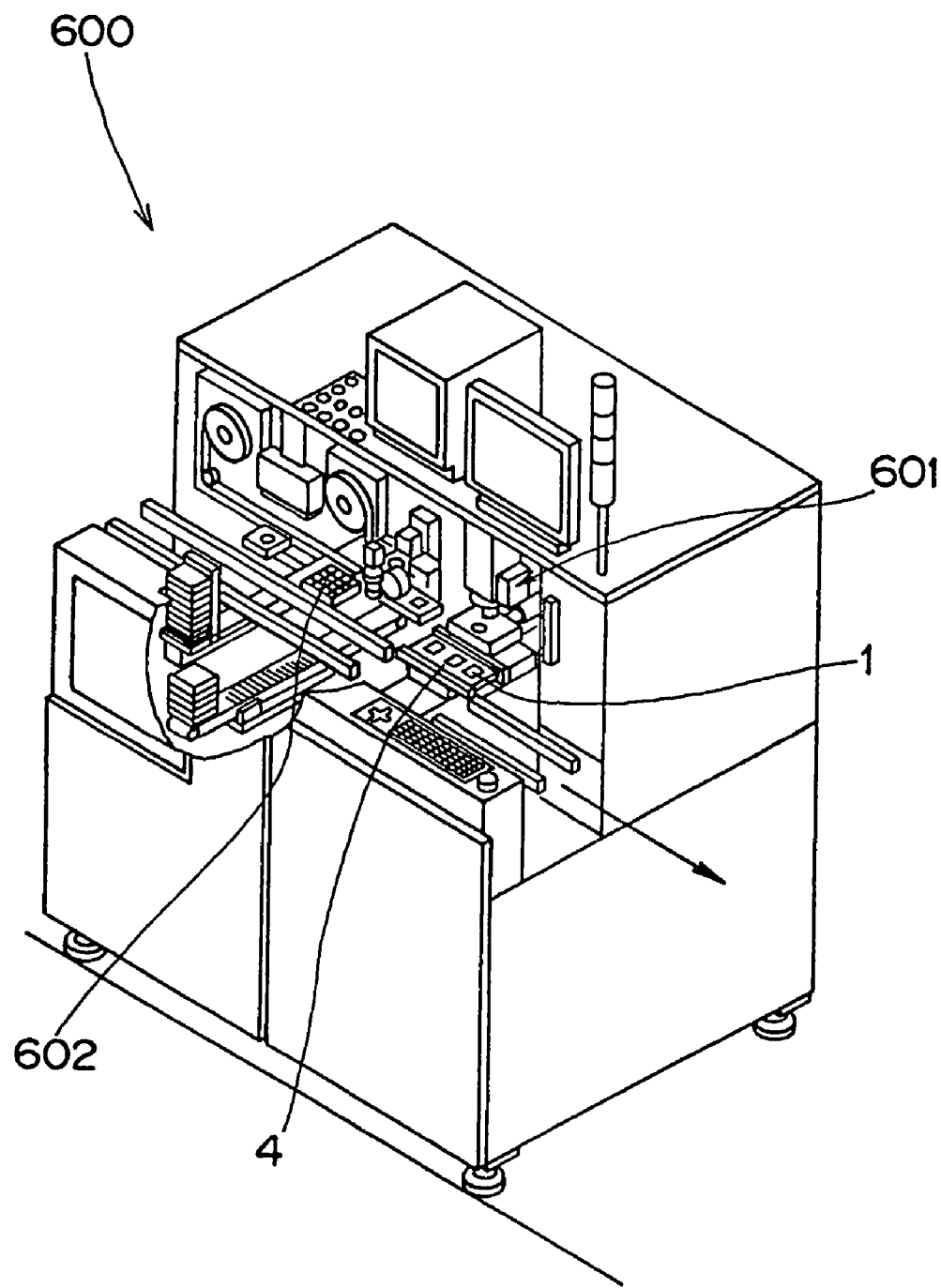
FIG. 20 is a perspective view of an electronic component mounting apparatus used in the first embodiment.
Figure 21A:
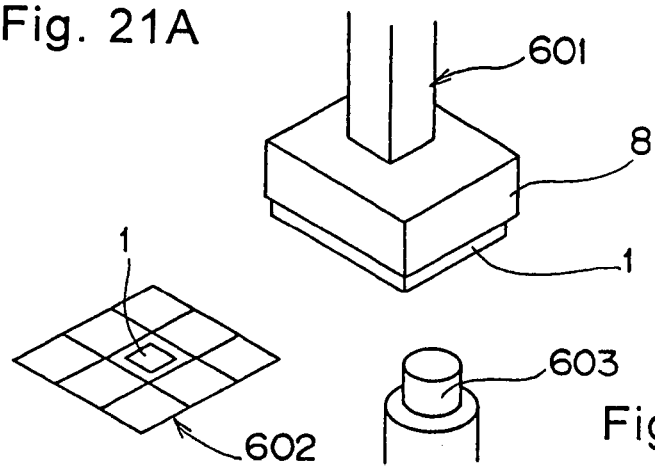
FIG. 21A, FIG. 21B, FIG. 21C and FIG. 21D are a perspective view showing a position recognizing operation on the component side of the electronic component mounting apparatus of FIG. 20, a view of a position recognition image of the component, a perspective view showing a position recognizing operation on the board side, and a view of a position recognition image of the board, respectively.
Figure 21B:
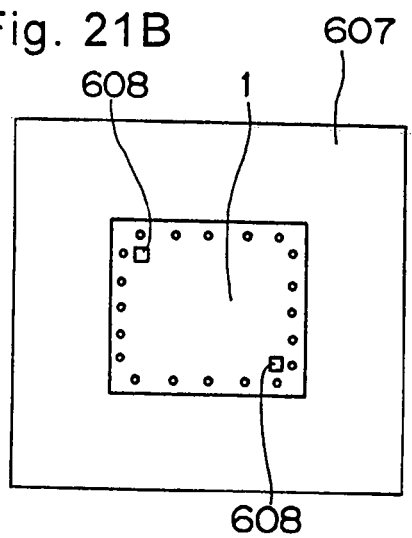
Figure 21C:
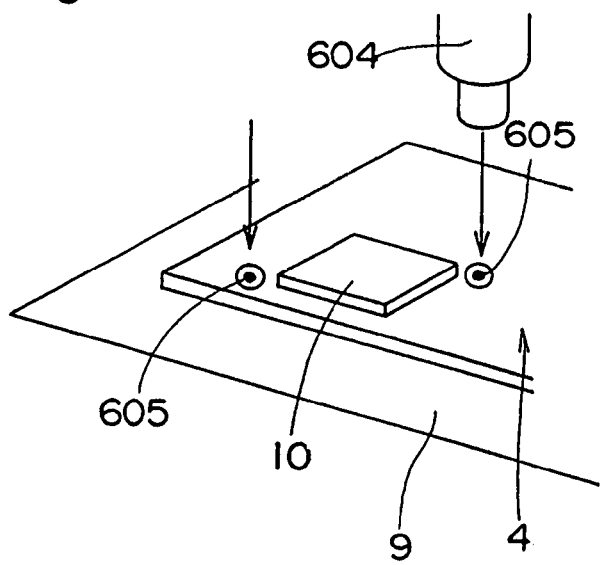
Figure 21D:
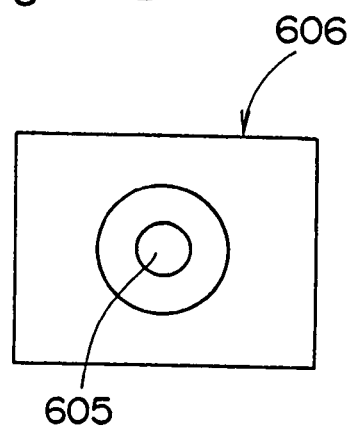

Next, as shown in FIG. 1E and FIG. 1F, in an electronic component mounting apparatus 600 shown in FIG. 20, the chip 1 on which the bumps 3 are formed through the aforementioned process is sucked, and held, from a tray 602 by a heated bonding tool 8 located at a tip of a component holding member 601, and the IC chip 1 is pressed against the board 4 via an anisotropic conductive film sheet 10 while being aligned in position with the electrodes 5 of the board 4 corresponding to the electrodes 2 of the IC chip 1, with the board 4 having been prepared through the aforementioned preceding process and mounted on a stage 9. This positional alignment is performed by a well-known position recognizing operation. For example, as shown in FIG. 21C, a positional recognition mark(s) 605 or a lead(s) or a land pattern(s) formed on the board 4 is recognized by a board recognizing camera 604 of the electronic component mounting apparatus 600. As shown in FIG. 21D, a position of the board 4 is recognized by recognizing an XY coordinate position of the board in orthogonal XY directions on the stage 9 and rotational position of the board relative to an origin of an XY coordinate system on a basis of an image 606 obtained by the camera 604. On the other hand, a mark(s) 608 or a circuit pattern for recognizing a position of the IC chip 1, sucked and held by the bonding tool 8, is recognized by an IC chip position recognizing camera 603 as shown in FIG. 21A, and the position of the IC chip 1 is recognized by recognizing an XY coordinate position of the IC chip in the orthogonal XY directions and a rotational position of the chip relative to the origin of the XY coordinate system on a basis of an image 607 obtained by the camera 603 as shown in FIG. 21B. Then, the bonding tool 8 or the stage 9 is moved, on a basis of position recognition results of the board 4 and the IC chip 1, to perform positional alignment so that the electrodes 2 of the IC chip 1 are positioned on the corresponding electrodes 5 of the board 4, and thereafter, the IC chip 1 is pressed against the board 4 by heated bonding tool 8. At this time, the bump 3 is pressed against the electrode 5 of the board 4 in a manner that a head portion 3a of the bump 3 is deformed as shown in FIG. 4B and FIG. 4C. At this time, as shown in FIG. 2A and FIG. 2B, the inorganic filler 6f in the thermosetting resin 6m is forced outwardly of the bump 3 because of the bump 3 entering the thermosetting resin 6m at a beginning of bonding. Moreover, as shown in FIG. 2C, there is produced an effect of reducing a connection resistance value by an arrangement in that the inorganic filler 6f does not enter a space between the bump 3 and the board electrode 5 due to this outward forcing action. At this time, even if a certain amount of inorganic filler 6f enters the space between the bump 3 and the board electrode 5, there is no problem of the bump 3 not being brought into direct contact with the board electrode 5. At this time, a load is applied, which differs depending on an outside diameter of the bump 3, so that a folded portion of the head 3a may be deformed without fail as shown in FIG. 4C. At this time, when the conductive particles 10a in the anisotropic conductive film sheet 10 are resin balls plated with a metal as shown in FIG. 6E, the conductive particles 10a are required to be deformed. When the conductive particles 10a in the anisotropic conductive film sheet 10 are metal particles of nickel or the like, it is required to apply a load to an extent that the particles get stuck in the bump 3 and the electrode 5 located on the board 4 as shown in FIG. 6D. This load is required to be at least 20 gf per bump. That is, a resistance value becomes excessively increased to a resistance value of at least 100 mmΩ/bump when the load is smaller than 20 gf per bump, according to a graph showing a relationship between the resistance value and the load in a case of a bump having an outside diameter of 80 μm as shown in FIG. 17, thus resulting in practical problems, and therefore, a load of not smaller than 20 gf per bump is preferable. FIG. 18 is a graph showing a region of high reliability based on a relationship between bumps having outside diameters of 80 μm and 40 μm and a minimum load. According to this graph, it is presumed that a bump having an outside diameter of not smaller than 40 μm is preferably loaded with a minimum load of not smaller than 25 gf per bump, and reliability is high when the minimum load is not smaller than about 20 gf per bump in a case of a bump having an outside diameter smaller than 40 μm. It is also presumed that, in the future when a bump outside diameter is reduced to 40 μm or less with a reduction in lead pitch, a load tends to reduce in proportion to the second power of a projected area of the bump depending on the projected area of the bump. Therefore, the minimum load applied via the IC chip 1 is preferably at least 20 gf per bump. An upper limit of the load applied via the IC chip 1 is set to an extent that none of the IC chip 1, the bump 3, the circuit board 4, and so on is damaged. According to circumstances, a maximum load may sometimes exceed 100 gf per bump or 150 gf per bump. At this time, if an inorganic filler 6f whose mean diameter is smaller than the mean diameter of the conductive particles is employed, there can be produced an effect of increasing an elastic modulus of the thermosetting resin 6m and reducing a coefficient of thermal expansion thereof.

It is to be noted that reference numeral 10s in the figure denotes a resin resulting from the thermosetting insulating resin 6m that has been melted by heat of the bonding tool 8 and thereafter thermally hardened into the anisotropic conductive film sheet 10.

It is also acceptable to perform the process of aligning in position the electrodes 2, on which the bumps 3 have been formed through the aforementioned preceding process, with the electrodes 5 of the board 4 as shown in FIG. 1E, with the board 4 being prepared by the preceding process, and the process of performing pressure bonding as shown in FIG. 1F after positional alignment by use of one positional alignment and pressure bonding apparatus, for example, the position aligning and pressure bonding apparatus of FIG. 1E. However, it is also acceptable to perform the positional alignment process and the pressure bonding process by separate units, for example, a positional alignment device of FIG. 5B and a bonding device of FIG. 5C, respectively, in order to improve productivity by concurrently performing positional alignment work and pressure bonding work when continuously manufacturing, for example, many boards. FIG. 5C shows two bonding devices 8 provided for a purpose of improving productivity, by which two portions of one circuit board 4 can be concurrently subjected to pressure bonding.

In each of the aforementioned and undermentioned embodiments, the circuit board 4 is a multilayer ceramic board, a glass fabric laminate epoxy board (glass epoxy board), an aramid unwoven fabric board, a glass fabric laminate polyimide resin board, an FPC (flexible printed circuit), or an aramid unwoven fabric epoxy board (for example, a resin multilayer board sold with a registered trademark of "ALIVH" and produced by Matsushita Electric Industrial Co., Ltd.), or the like.

These boards 4 are not always planar since warps and undulations are generated due to thermal history, cutting, and processing. Accordingly, as shown in FIG. 5A and FIG. 5B, by locally applying heat and load to circuit board 4 via IC chip 1 from a bonding tool side toward stage 9 side by virtue of bonding tool 8 and stage 9, each of which has its parallelism controlled to, for example, about at most 10 μm or less, warpage of the circuit board 4 at an applied portion is corrected.

IC chip 1 can be warped so as to be concave about a center of an active surface. By pressurizing such IC chip with a heavy load of not smaller than 20 gf per bump at a time of bonding, warps and undulations of both the board 4 and the IC chip 1 can be corrected. Warpage of the IC chip 1 is generated by an internal stress caused when a thin film is formed on Si while forming the IC chip 1. Quantity of deformation of each bump 3 is about 10 to 25 μm, which becomes tolerated by each bump, which adapts itself with deformation of the bump to an influence of an undulation that appears on a surface of an inner layer copper foil originally on a board of this grade.

Thus, heat of, for example, 140 to 230° C. is applied to the anisotropic conductive film sheet 10 located between the IC chip 1 and the circuit board 4 for, for example, about several seconds to 20 seconds in a state in which warpage of the circuit board 4 is corrected, and this anisotropic conductive film sheet 10 is hardened. At this time, the thermosetting resin 6m, which constitutes part of the anisotropic conductive film sheet 10, flows first and encapsulates the IC chip 1 up to an edge of the IC chip 1. Moreover, the resin, which is naturally initially softened when heated, generates fluidity of a flow to the edge as described above. By making a volume of the thermosetting resin 6m greater than a volume of a space between the IC chip 1 and the circuit board 4, the resin flows and leaks out of this space, allowing an encapsulation effect to be produced. Subsequently, the heated bonding tool 8 is moved up, by which a heating source disappears to rapidly reduce temperatures of the IC chip 1 and the anisotropic conductive film sheet 10. The anisotropic conductive film sheet 10 looses its fluidity, and as shown in FIG. 1F and FIG. 4C, the IC chip 1 is fixed onto the circuit board 4 with the resin 10s that is the anisotropic conductive film sheet 10 after being softened and then hardened. Moreover, if the circuit board 4 is heated by a heater 9a of the stage 9 or the like, a temperature of the bonding tool 8 can further be reduced.

With this arrangement, a thermosetting resin mixed with an inorganic filler of a mean particle diameter smaller than the mean diameter of the conductive particles 10a can be used for the anisotropic conductive film sheet 10. Furthermore, by using nickel powder plated with gold as the conductive particles 10a contained in the anisotropic conductive film sheet 10, a connection resistance value can be reduced, more preferably.

According to the first embodiment, by mixing the inorganic filler 6f, that has a mean particle diameter smaller than the mean diameter of the conductive particles 10a, with the thermosetting resin 6m, reliability can further be improved without hindering operation of the conductive particles 10a. That is, the conductive particles 10a are placed between the bump 3 and the electrode 5 of the board 4. At this time, even if the inorganic filler 6f is concurrently placed between the bump and electrode, conductivity is not hindered since the mean particle diameter of the inorganic filler 6f is smaller than the mean diameter of the conductive particles 10a. Furthermore, the elastic modulus of the thermosetting resin 6m is increased and the coefficient of thermal expansion thereof is reduced, thereby improving reliability of bonding of the IC chip 1 to the board 4.

Second Embodiment

A method and apparatus for mounting an electronic component, for example, an IC chip onto a circuit board, and an electronic component unit or module, for example, a semiconductor device in which the IC chip is mounted onto the board by the mounting method, according to a second embodiment of the present invention will be described next.

This second embodiment is made more preferable than the first embodiment by setting a ratio of the inorganic filler 6f, in the anisotropic conductive film sheet 10 that contains an insulating thermosetting resin, to the insulative thermosetting resin to 5 to 90 wt % of the insulative thermosetting resin. When the ratio is lower than 5 wt %, the presence of the inorganic filler 6f is meaningless. When the ratio exceeds 90 wt %, adhesive strength is extremely reduced, and it is difficult to form a sheet, leading to a disadvantage. As an example, from a point of view of maintaining high reliability, it is preferable to set the ratio to 20 to 40 wt % in a case of a resin board, and to 40 to 70 wt % in a case of a ceramic board. In a case of a glass epoxy board, a coefficient of linear expansion of a sheet encapsulant can be considerably reduced at a ratio of about 20 wt %, thereby producing an effect on the glass epoxy board. The ratio is set to about half a percentage by weight in terms of volume percentage, or in proportions of 1 part epoxy resin to about 2 parts silica in terms of specific gravity. In a normal case, the ratio of this inorganic filler to the insulating thermosetting resin is determined by manufacturing conditions in forming the thermosetting resin into a sheet, by an elastic modulus of board 4, and finally by a result of a reliability test.

By providing the inorganic filler 6f at the aforementioned ratio to the thermosetting resin, the elastic modulus of the thermosetting resin 6m of the anisotropic conductive film sheet 10 can be increased, and reliability of bonding of IC chip 1 to the board 4 can be improved by reducing the coefficient of thermal expansion. Moreover, the ratio of the inorganic filler 6f to the thermosetting resin can be determined so that a material constant of the thermosetting resin 6m, i.e., an elastic modulus and a coefficient of linear expansion are optimized according to material of the board 4. It is to be noted that the coefficient of linear expansion tends to be reduced although the elastic modulus is increased as the ratio of the inorganic filler 6f to the thermosetting resin 6m is increased.

The first embodiment and the second embodiment have advantages in that the anisotropic conductive film sheet 10, which is not liquid but solid, is easy to handle and is able to be formed of polymer since no liquid component exists, thereby allowing an anisotropic conductive film sheet having a high glass transition point to be easily formed.

Figure 14A:
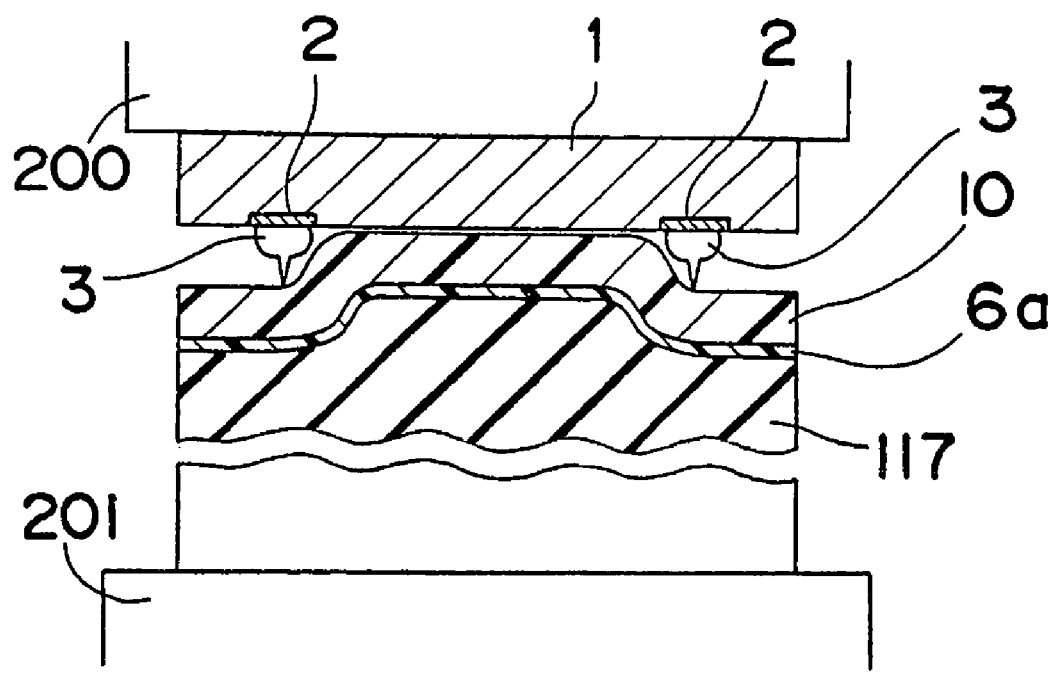
FIG. 14A and FIG. 14B are an explanatory view showing a modification example of the first embodiment in which a thermosetting resin sheet is formed on an IC chip 1 side and an explanatory view showing a modification example of the first embodiment in which a thermosetting adhesive is formed on the IC chip 1 side.
Figure 14B:
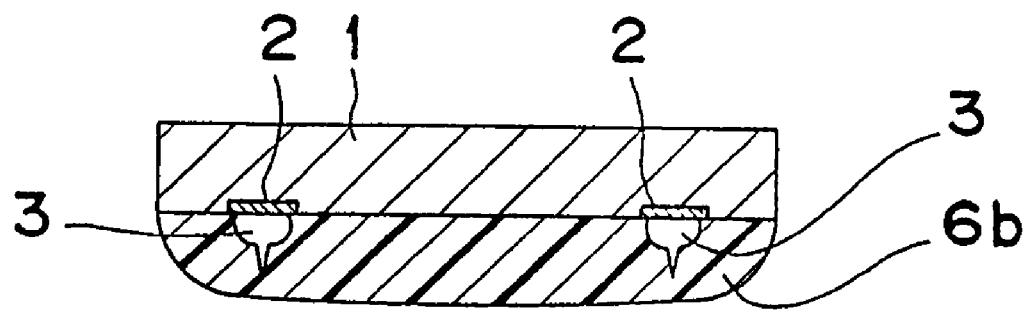
Figure 15:
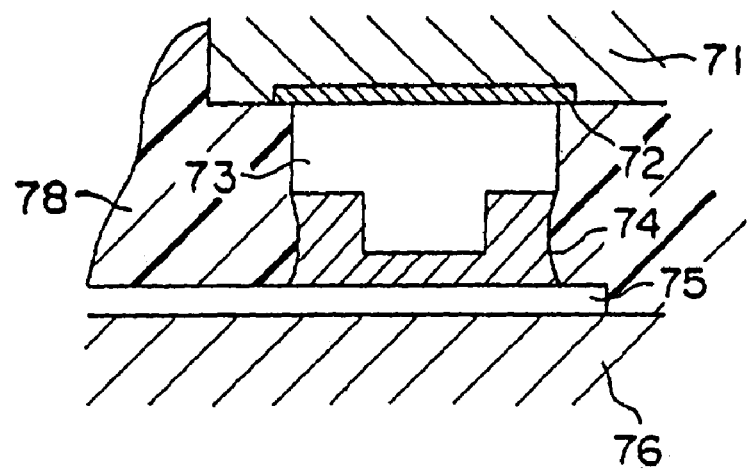
FIG. 15 is a sectional view showing a conventional method for bonding an IC chip to a circuit board.
Figure 16A:
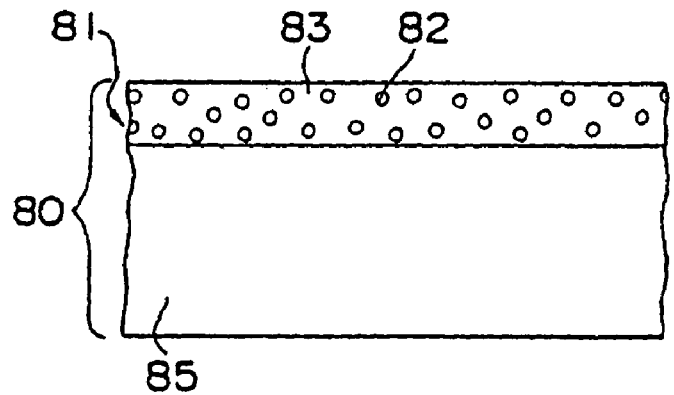
FIG. 16A and FIG. 16B are explanatory views showing a conventional method for bonding an IC chip to a circuit board.
Figure 16B:
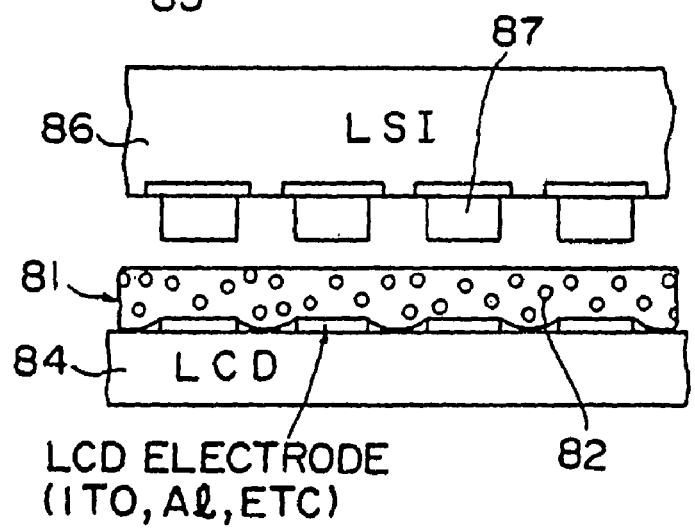

With reference to FIG. 1A through FIG. 1G, FIG. 2A through FIG. 2C, FIG. 6A through FIG. 6E, and FIG. 7A through FIG. 7F described later, formation of anisotropic conductive film sheet 10 that contains thermosetting resin as one example of the anisotropic conductive layer, or the anisotropic conductive film forming thermosetting adhesive 6b on the circuit board 4, has been described. However, without being limited to this, the sheet or adhesive may be formed on the IC chip 1 and thereafter bonded to the board 4 as shown in FIG. 14A or FIG. 14B. In the case of, in particular, an anisotropic conductive film sheet 10 that contains thermosetting resin, it is acceptable to adhere the anisotropic conductive film sheet 10 to the IC chip 1 along a configuration of bumps 3 by pressing the IC chip 1 held by a holding member 200, such as a suction nozzle, against an elastic body 117, such as rubber on a stage 201, together with a separator 6a removably arranged on the circuit board side of the anisotropic conductive film sheet 10.

Third Embodiment

A method and apparatus for mounting an electronic component, for example, an IC chip onto a circuit board, and an electronic component unit or module, for example, a semiconductor device in which the IC chip is mounted onto the board by the mounting method, according to a third embodiment of the present invention will be described next with reference to FIG. 6A through FIG. 6C and FIG. 7A through FIG. 7F.

Figure 6A:
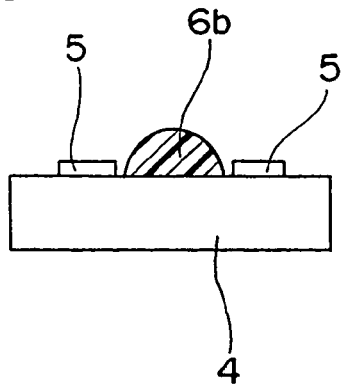
FIG. 6A, FIG. 6B and FIG. 6C are explanatory views for explaining a thermosetting adhesive arranged on a circuit board in place of an anisotropic conductive film sheet by a mounting method according to a third embodiment of the present invention.

According to this third embodiment, instead of adhering the anisotropic conductive film sheet 10 that contains a thermosetting resin onto board 4 as in the first embodiment, an anisotropic conductive film forming thermosetting adhesive 6b that has a liquid form, and serves as one example of the anisotropic conductive layer, is applied, printed or transferred onto the circuit board 4 by a dispenser 502 or the like as shown in FIG. 6A and FIGS. 7A and 7D, and thereafter solidified into a semi-solid state, or a state of a so-called B stage. Subsequently, IC chip 1 is mounted onto the board 4 similarly to the first or second embodiment.

Figure 6B:
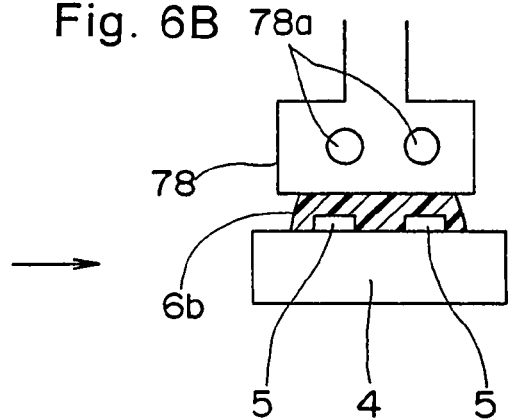
Figure 6C:
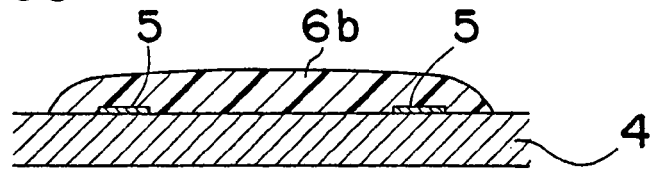
Figure 6D:
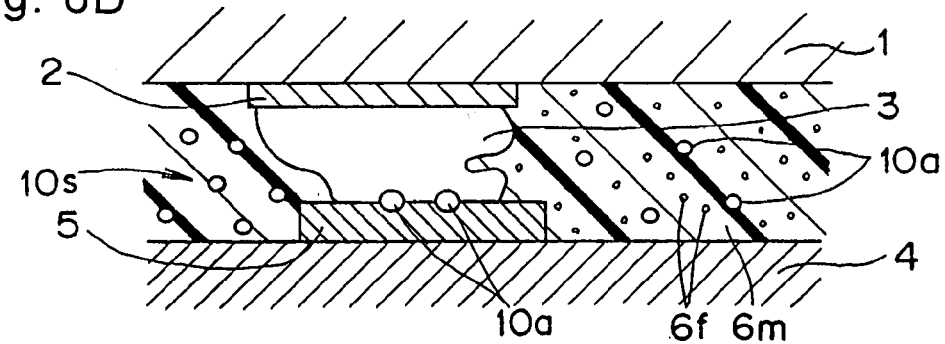
FIG. 6D and FIG. 6E are enlarged explanatory views of the bonded state of the first embodiment.
Figure 6E:
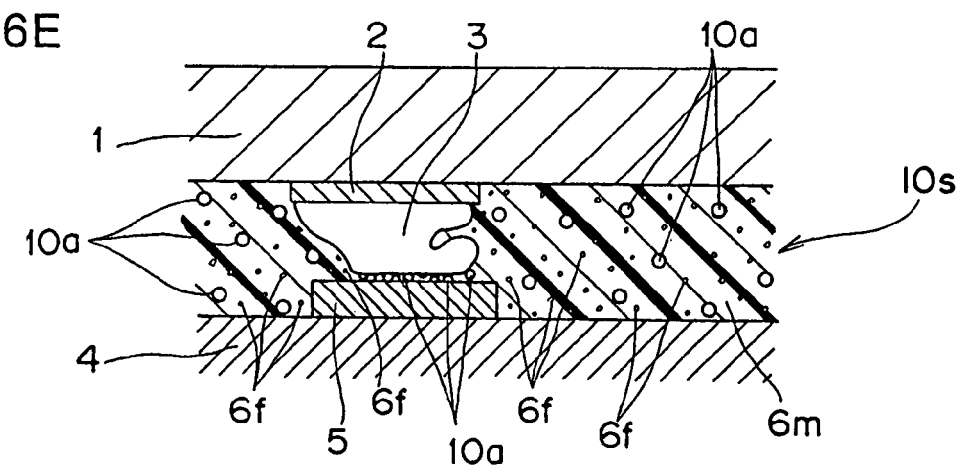

In detail, as shown in FIG. 6A, the anisotropic conductive film forming thermosetting adhesive 6b in liquid form is applied, printed or transferred onto the circuit board 4 by the dispenser 502 or the like, which can be moved in two directions that are orthogonal to a board surface, and a discharge rate of the thermosetting adhesive is controlled with air pressure as shown in FIG. 7A. Next, the adhesive is solidified into a semi-solid state, or the state of the so-called B stage as shown in FIG. 6C, by applying heat and pressure via a tool 78 that has a built-in heater 78a as shown in FIG. 6B.

Otherwise, in a case where the anisotropic conductive film forming thermosetting adhesive 6b in liquid form has a low viscosity, the liquid thermosetting adhesive 6b is applied to a specified position on board 4 by use of the dispenser 502 as shown in FIG. 7A, and thereafter, the thermosetting adhesive 6b naturally spreads on the board, since its viscosity is low, and enters into a state as shown in FIG. 7B. Subsequently, by putting the board 4 into a furnace 503 by use of a conveying unit 505, as shown in FIG. 7C, and hardening the liquid thermosetting adhesive 6b via a heater 504 of the furnace 503, the adhesive is solidified into a semi-solid state, i.e., the state of the so-called B stage.

In a case where the anisotropic conductive film forming thermosetting adhesive 6b in liquid form has a high viscosity, the liquid thermosetting adhesive 6b is applied to a specified position on board 4 by use of the dispenser 502 as shown in FIG. 7D, and thereafter, the thermosetting adhesive 6b is spread flat by a squeegee 506 as shown in FIGS. 7E and 7F, since the adhesive does not naturally spread on the board due to the high viscosity of the thermosetting adhesive 6b. Subsequently, by putting the board 4 into the furnace 503 by use of the conveying unit 505, as shown in FIG. 7C, and hardening the liquid thermosetting adhesive 6b via the heater 504 of the furnace 503, the adhesive is solidified into a semi-solid state, i.e., the state of the so-called B stage.

Figure 19:
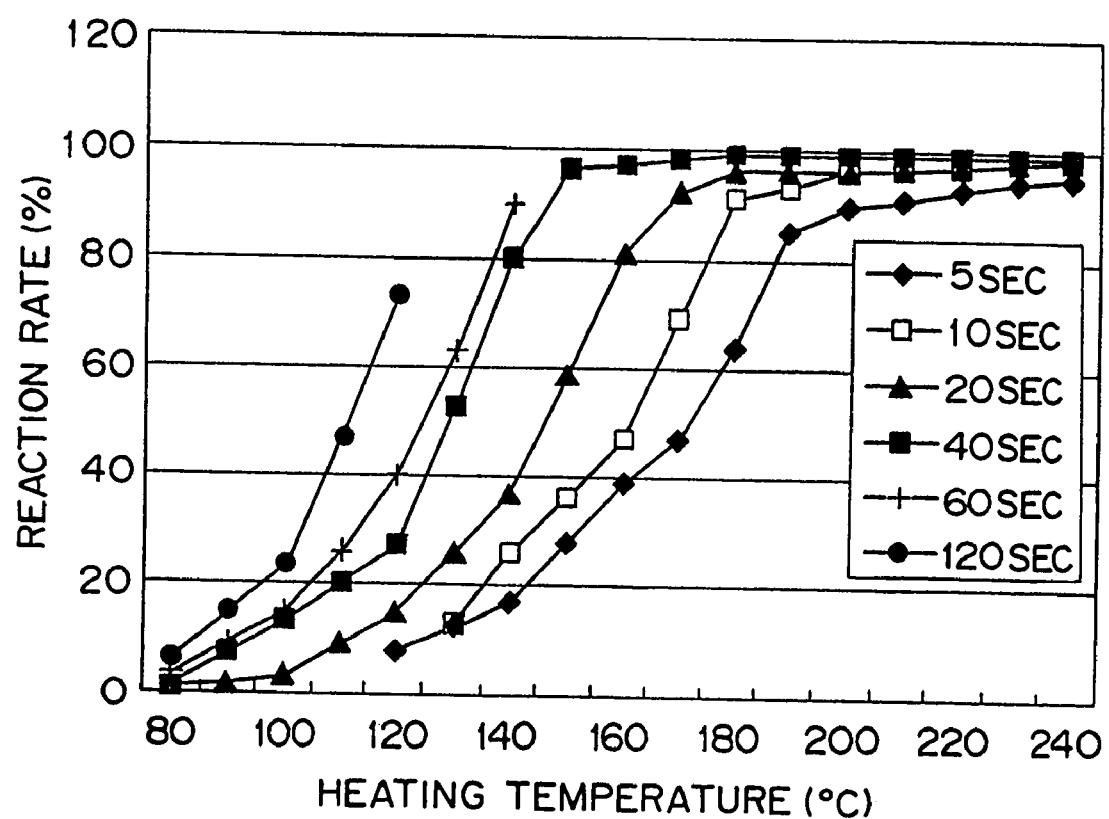
FIG. 19 is a graph of a relation between a heating temperature and a reaction rate of a resin sheet (anisotropic conductive film sheet) in the third embodiment.

As described above, although there is a difference depending on characteristics of the thermosetting resin in the thermosetting adhesive 6b when the anisotropic conductive film forming thermosetting adhesive 6b is semi-solidified, pressurization is effected at a temperature of 80 to 130° C., which is 30 to 80% of a glass transition point of the thermosetting resin. The pressurization is normally performed at a temperature of about 30% of the glass transition point of the thermosetting resin. A reason why the temperature is 30 to 80% of the glass transition point of the thermosetting resin is that a further range for reaction can remain for subsequent processes within the range of 80 to 130° C., according to a graph of heating temperature of the anisotropic conductive film sheet with respect to its reaction rate, as shown in FIG. 19. In other words, reaction rate of the insulating resin, or for example, epoxy resin can be restrained to about 10 to 50%, also depending on time, within the temperature range of 80 to 130° C., and therefore, no problem occurs at a time of IC chip pressure bonding in subsequent processes. That is, a prescribed quantity of pressure can be secured at the time of pressure-bonding the IC chip, and this rarely incurs a problem in that press-cutting cannot be performed. It is also possible to perform semi-solidification by vaporizing only a solvent component while restraining a reaction.

When a plurality of IC chips 1 are mounted on board 4 after the thermosetting adhesive 6b is semi-solidified as described above, productivity is further improved by preliminarily performing the semi-solidifying process of the thermosetting adhesive 6b as a pre-arranging process at a plurality of portions which belong to the board 4 and to which the plurality of IC chips 1 are mounted, supplying the thus pre-arranged board 4, and bonding the plurality of IC chips 1 to the plurality of portions of the board 4. In subsequent processes, even when the thermosetting adhesive 6b is used, a process basically identical to the process employing the anisotropic conductive film sheet 10 of the aforementioned first or second embodiment is performed. By adding the semi-solidifying process, the liquid anisotropic conductive film forming thermosetting adhesive 6b can be employed similarly to the anisotropic conductive film sheet 10, and this arrangement has an advantage in that handling is easy because of solidness and an advantage in that an adhesive having a high glass transition point can be formed since the adhesive can be formed of polymer because of non-existence of a liquid component. When the anisotropic conductive film forming thermosetting adhesive 6b having fluidity is employed as described above, there is a co-existent advantage in that the adhesive can be applied, printed or transferred in an arbitrary size to arbitrary positions of the board 4 as opposed to a case where a solid anisotropic conductive film sheet 10 is employed.

Fourth Embodiment

Figure 22:
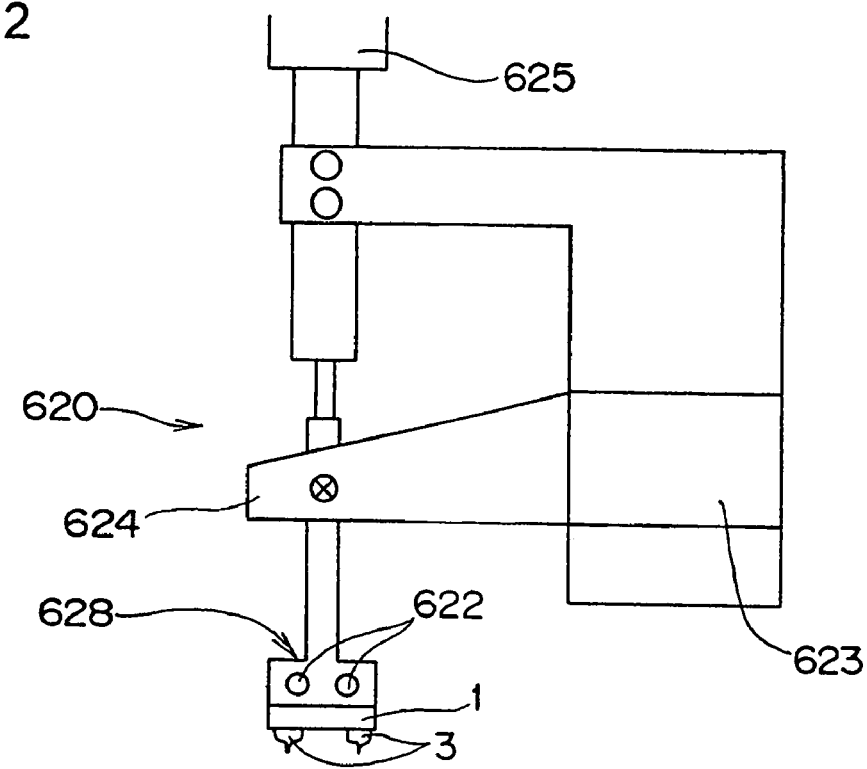
FIG. 22 is a schematic view of a supersonic wave applying device used in the fourth embodiment.
Figure 23:
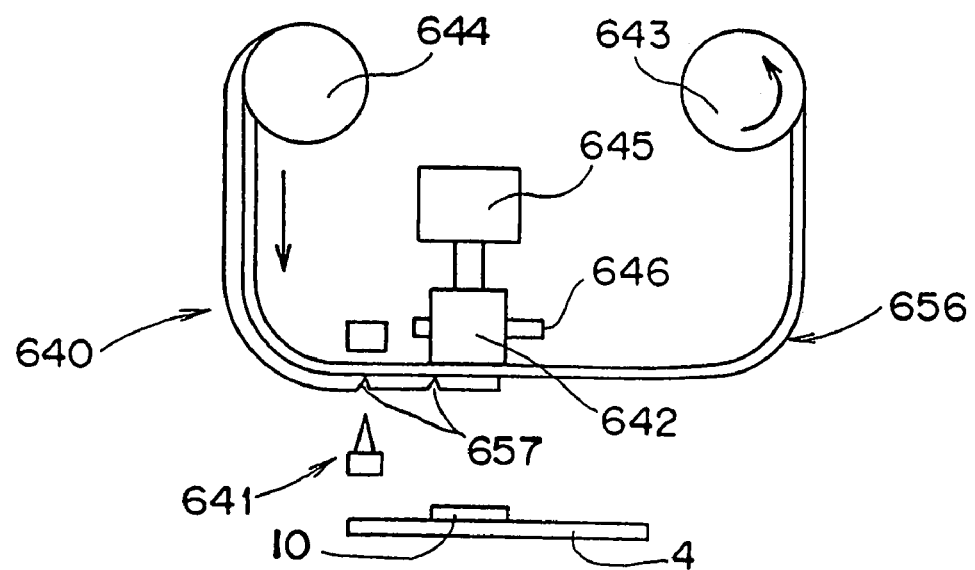
FIG. 23 is a schematic view of a sticking device used in the fifth embodiment.

A method and apparatus for mounting an electronic component, for example, an IC chip onto a circuit board, and an electronic component unit or module of, for example, a semiconductor device in which the IC chip is mounted on the board by the mounting method, according to a fourth embodiment of the present invention will be described next with reference to FIG. 22. The fourth embodiment differs from the first embodiment in that a bump tip is shaped so as to prevent short circuit with adjacent bumps or electrodes due to collapse of a neck (whisker) portion at a tip of the bump 3, caused by tearing at a time of bump formation, by pressurizing the bump 3 with a load of not greater than 20 gf without leveling the bump 3 with supersonic waves applied in addition to the load when IC chip 1 is bonded to board 4. The IC chip 1 is thereafter mounted onto the board 4 while aligning in position the IC chip 1 with the board 4, and metal bumps 3 are subjected to thermocompression-bonding with supersonic waves to metals of the electrode surface on the board. A state in which the IC chip 1 is bonded to the board 4 is similar to those of FIG. 2 and FIG. 6 of the aforementioned embodiments.

When metallically bonding gold bumps to electrodes of the board with supersonic waves applied, it is acceptable to apply heat from an upper surface side of the IC chip 1 or from the board side, or from both the IC chip 1 side and the board side.

According to this fourth embodiment, solid anisotropic conductive film sheet 10 or a liquid anisotropic conductive film forming thermosetting adhesive 6b semi-solidified as described above, obtained by mixing insulating thermosetting resin 6m with inorganic filler 6f, is adhered to the board 4, or the anisotropic conductive film forming thermosetting adhesive 6b that contains the thermosetting resin is applied to the board 4 and semi-solidified. Thereafter, ball 96 is formed by applying an electric spark to a tip of gold wire 95 through the operation as shown in FIG. 3A through FIG. 3F, similar to wire bonding of electrodes 5 of the board 4 and electrodes 2 of the IC chip 1, and the IC chip 1 is mounted onto the board 4 by aligning in position the bumps 3, each of which is formed by thermocompression-bonding this ball 96 to a board electrode 5 with supersonic waves by virtue of capillary 93, without leveling the bumps 3. In this case, the aforementioned "liquid anisotropic conductive film forming thermosetting adhesive 6b semi-solidified as described above" is an object obtained by semi-solidifying the liquid anisotropic conductive film forming thermosetting adhesive 6b as described in connection with the third embodiment, approximately similar to an object put in the B stage. At this time, in a supersonic wave applying device 620 as shown in FIG. 22, gold bumps 3 are metallically bonded to gold plating located on board 4 while shaping tips of the bump so as to prevent collapse of neck portions at tips of the gold bumps 3 by effecting a load of an air cylinder 625 applied from an upper surface of the IC chip 1, sucked and held by a pre-heated bonding tool 628 with a built-in heater 622, and supersonic waves that are generated by a supersonic wave generating element 623 such as a piezo-electric element and applied via a supersonic wave horn 624. Next, the IC chip 1 is pressed against the circuit board 4 with a pressure force of not smaller than 20 gf per bump while heating the IC chip 1 from the upper surface side of the IC chip 1 and/or from the board side so as to correct warpage of the board 4 and crush the bumps 3, and the anisotropic conductive film sheet 10 or the thermosetting adhesive 6b interposed between the IC chip 1 and the circuit board 4 is hardened by heat so as to bond the IC chip 1 to the circuit board 4, electrically connecting together both the electrodes 2 and 5. It is also acceptable to apply heat from the upper surface side of the IC chip 1 or from the board side or from both the IC chip 1 side and the board side at the time of the metallic bonding performed by the supersonic wave applying device 620. That is, it is acceptable to apply heat to the IC chip 1 from the upper surface side by the built-in heater 622 or apply heat to the circuit board 4 from the board side by heater 9a of stage 9, or apply heat from both the IC chip 1 side and the board side by the built-in heater 622 and the heater 9a of stage 9.

A reason why a pressure force of not smaller than 20 gf per bump is needed is that bonding cannot be achieved since frictional heat rarely occurs even by bonding using supersonic waves as described above. Also, when bonding gold to gold, frictional heat is generated by pressing the bump with a specified constant load and applying supersonic waves to a portion of the bump, by which the metals are bonded together. Therefore, even in this case, a specified load sufficient for pressurizing the bump, i.e., a pressure force of not smaller than 20 gf per bump is needed. For example, the pressure force is set to 50 gf or more per bump.

According to the fourth embodiment, the metal bumps 3 and the metal plating of the board 4 are subjected to metallic diffusion bonding, and this arrangement is therefore appropriate for giving a strength to each bump portion, or further reducing a connection resistance value.

Fifth Embodiment

A method and apparatus for mounting an electronic component, for example, an IC chip onto a circuit board, and an electronic component unit or module, for example, a semiconductor device in which the IC chip is mounted onto the board by the mounting method, according to a fifth embodiment of the present invention will be described next with reference to FIG. 8A through FIG. 8C and FIG. 9A through FIG. 9C. The fifth embodiment differs from the first embodiment in that an encapsulation process can be eliminated.

Figure 8A:
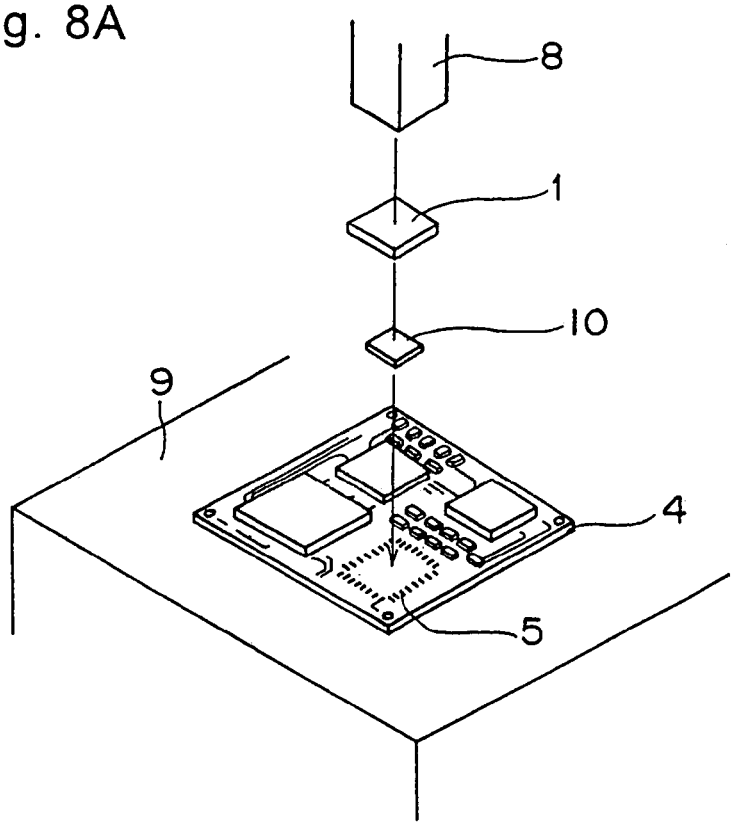
FIG. 8A, FIG. 8B and FIG. 8C are explanatory views showing a process for bonding an IC chip to a circuit board by a mounting method according to a fifth embodiment of the present invention.
Figure 8B:
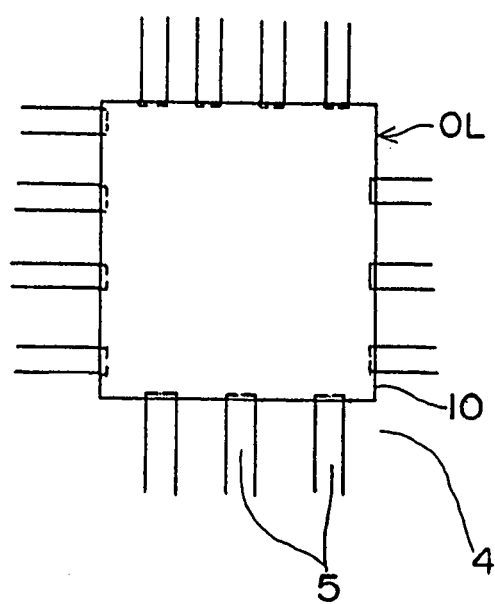
Figure 8C:
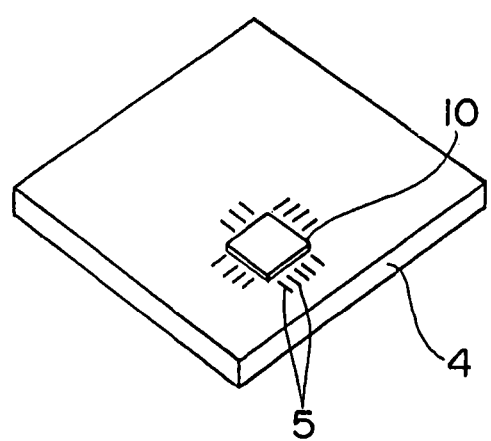
Figure 9A:
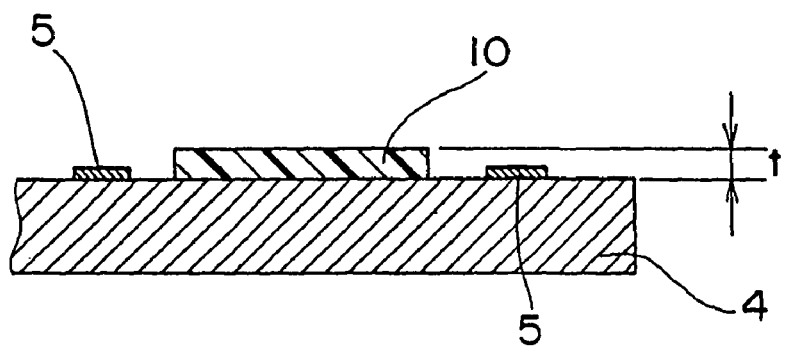
FIG. 9A, FIG. 9B and FIG. 9C are explanatory views showing a process for bonding an IC chip to a circuit board by the mounting method of the fifth embodiment of the present invention.
Figure 9B:
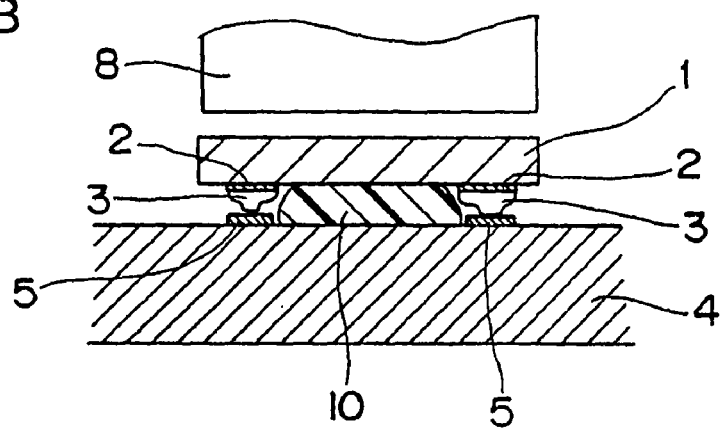
Figure 9C:
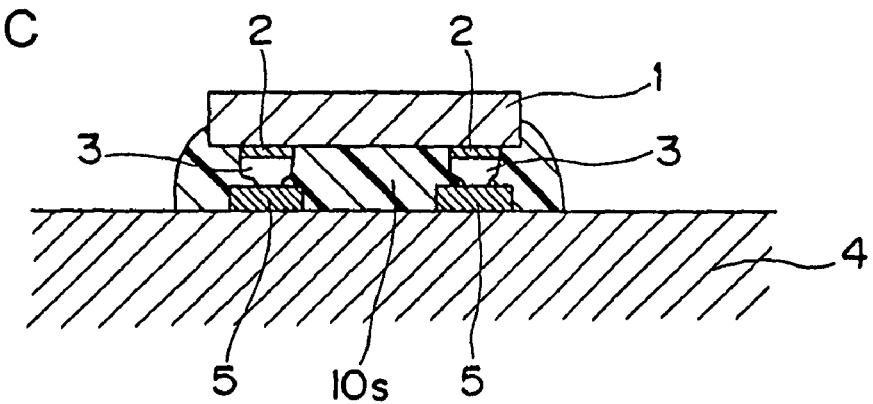

As described above, protruding electrodes (bumps) 3 are preparatorily formed on electrodes 2 of IC chip 1. On circuit board 4, as shown in FIG. 8B, FIG. 8C, FIG. 9A and FIG. 23, a rectangular sheet-shaped anisotropic conductive film sheet 10, or a thermosetting adhesive 6b, that has a configurational dimension smaller than an approximately rectangular-shaped outline dimension OL, defined by joining inner edges of the electrodes 2 of the IC chip 1, is preparatorily adhered or applied to a central portion of a region defined by joining electrodes 5 of the circuit board 4. At this time, a thickness of the sheet-shaped anisotropic conductive film sheet 10 or the thermosetting adhesive 6b is set so that its volume becomes slightly greater than a gap between the IC chip 1 and the board 4. By use of the pressing device 640 of FIG. 23, a rectangular sheet-shaped anisotropic conductive film sheet 656 that is unwound from an un-winding roll 644 and wound around a winding roll 643 is cut along a portion, preliminarily provided with a notch 657 by upper and lower cutter blades 641, into a configurational dimension smaller than the approximately rectangular-shaped outline dimension OL defined by joining the inner edges of the plurality of electrodes 2 of the IC chip 1. The anisotropic conductive film sheet 10 having this rectangular sheet-like shape is sucked and held by a sticking head 642, which is pre-heated by a built-in heater 646, and adhered the central portion of the region defined by joining the electrodes 5 of the circuit board 4. Next, the bumps 3 and the electrodes 5 of the circuit board 4 are aligned in position and, as shown in FIG. 8A and FIG. 9B, the IC chip 1 is pressed against the circuit board 4 by bonding tool 8 which is heated by the heater 8a, so as to concurrently perform correction of warp of the board 4 and harden the anisotropic conductive film sheet 10 or the thermosetting adhesive 6b interposed between the IC chip 1 and the circuit board 4. At this time, the anisotropic conductive film sheet 10 or the thermosetting adhesive 6b is softened as described hereinabove, by heat applied from the bonding tool 8 via the IC chip 1, and flows outwardly by being pressurized from a position to which it has been adhered or applied, as shown in FIG. 9C. This outflow anisotropic conductive film sheet 10 or thermosetting adhesive 6b becomes an encapsulation material (underfill), which remarkably improves reliability of bonding of the bumps 3 to the electrodes 5. After a lapse of a specified time, hardening of the anisotropic conductive film sheet 10 or the thermosetting adhesive 6b gradually progresses, and hardened resin 6s finally bonds the IC chip 1 to the circuit board 4. By moving upwardly the bonding tool 8, that is pressurizing the IC chip 1, bonding of the IC chip 1 to the electrodes 5 of the circuit board 4 is completed. Strictly speaking, in a case of thermosetting resin, reaction of the thermosetting resin progresses during heating, and fluidity almost disappears with a moving-up motion of the bonding tool 8. According to the above-mentioned method, neither the anisotropic conductive film sheet 10 nor the thermosetting adhesive 6b covers the electrodes 5 before bonding, and therefore, the bumps 3 are brought into direct contact with the electrodes 5 at a time of bonding. Then, neither the anisotropic conductive film sheet 10 nor the thermosetting adhesive 6b enters spaces under the electrodes 5, and a value of connection resistance between each bump 3 and its corresponding electrode 5 can be reduced. If the circuit board is heated, then a temperature of the bonding head 8 can be reduced. If this method is applied to the third embodiment, bonding of gold bumps to gold electrodes (for example, copper or tungsten plated with nickel or gold) of the circuit board can easily be achieved.

Sixth Embodiment

A method and apparatus for mounting an electronic component, for example, an IC chip on a circuit board, and an electronic component unit or module, for example, a semiconductor device in which the IC chip is mounted onto the board by the mounting method, according to a sixth embodiment of the present invention will be described next with reference to FIG. 10A through FIG. 10D and FIG. 11A through FIG. 11E. The sixth embodiment differs from the first embodiment in that high-reliability bonding can be achieved even if a bump 103 is mounted on electrode 5 of circuit board 4 while being shifted.

According to the sixth embodiment, as shown in FIG. 10A, a gold ball is formed from a gold wire 95 by subjecting the wire to an electric spark. Next, a ball 96a of a diameter $\Phi$d-Bump denoted by 95a is formed while adjusting a size of the ball by duration of application of the electric spark, and the thus-formed ball 96a having diameter $\Phi$d-Bump is formed by controlling a parameter of time or voltage for generating the electric spark so that a chamfer diameter $\phi$D denoted by 93a of a capillary 193, whose chamfer angle $\theta$c is not greater than 100°, becomes one-half to three-fourths the gold ball diameter $\Phi$d-Bump. Instead of forming a bump 3 as shown in FIG. 10D via provision of a flat portion 93b in a portion of the capillary that is to be brought into contact with the gold ball as shown in FIG. 10C, a bump 103 as shown in FIG. 10B is formed on electrode 2 of IC chip 1 by performing supersonic wave thermocompression-bonding via capillary 193 whose tip portion 193a is provided with a non-flat shape, which tip portion is to be brought into contact with the gold ball 96a as shown in FIG. 10A. By using capillary 193 having the above-mentioned shape, an approximately conically tipped bump 103 as shown in FIG. 10B can be formed on the electrode 2 of the IC chip 1. Even when the approximately conically tipped bump 103 formed by the above-mentioned method is mounted on electrode 5 of circuit board 4 while being shifted as shown in FIG. 11C, the bump 103 can be partially brought into contact with the electrode 5 of the board 4 without fail since the bump 103 has the approximately conically shaped tip, so long as the bump is not shifted more than half an outside diameter of the bump 103.

In contrast to this, in a case of a bump 3 as shown in FIG. 11D, when the bump 3 is mounted on electrode 5 of circuit board 4 while being shifted by a dimension Z as shown in FIG. 11C, a so-called base 3g of a width dimension d partially comes into contact with the electrode 5 as shown in FIG. 11E. However, this contact is mere partial contact, leading to bonding in an unstable contact state. If the board 4 exhibiting this unstable bonding state is subjected to a thermal shock test or reflow, then a bond may become broken and defective. In contrast to this, according to the sixth embodiment, even when the approximately conically tipped bump 103 is mounted on the electrode 5 of the circuit board 4 while being shifted by the dimension Z as shown in FIG. 11C, the bump 103 can partially come into contact with the electrode 5 of the board 4 without fail so long as dimension Z is not greater than half an outside diameter of the bump 103, since the bump 103 has the conical tip shape, and this can prevent a possible occurrence of defective bonding even when the board is subjected to a thermal shock test or reflow.

Seventh Embodiment

A method and apparatus for mounting an electronic component, for example, an IC chip onto a circuit board, and an electronic component unit or module, for example, a semiconductor device in which the IC chip is mounted on the board by the mounting method, according to a seventh embodiment of the present invention will be described next with reference to FIG. 12A through 12D and FIG. 13. According to this seventh embodiment, stress of the IC chip 1 and the circuit board 4 in the first embodiment can be alleviated when the thermosetting resin is hardened after bonding of the IC chip 1 to the circuit board 4.

Figure 12A:
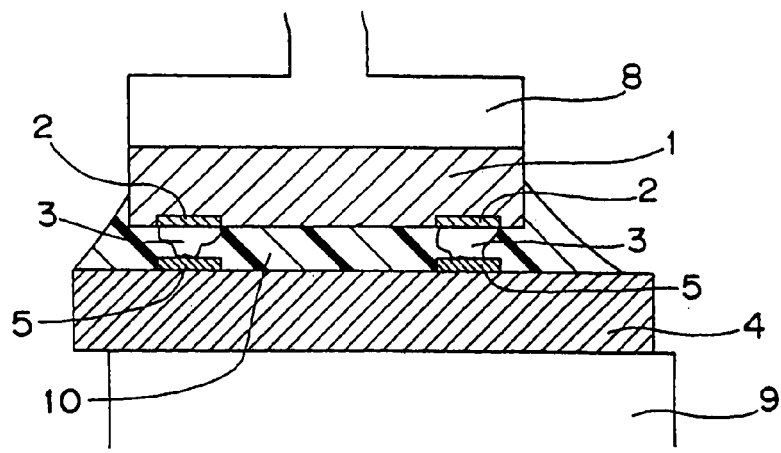
FIG. 12A, FIG. 12B, FIG. 12C and FIG. 12D are explanatory views showing a process for bonding an IC chip to a circuit board by a mounting method according to a seventh embodiment of the present invention.
Figure 12B:
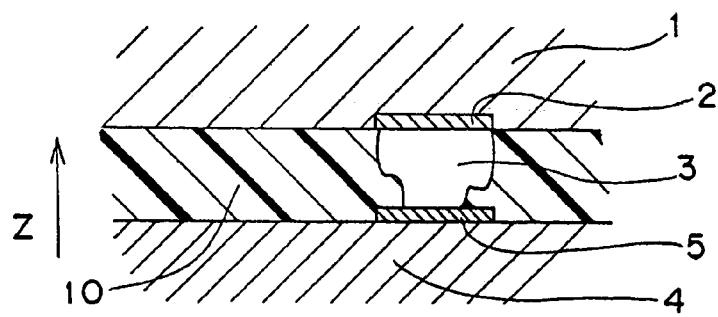
Figure 12C:
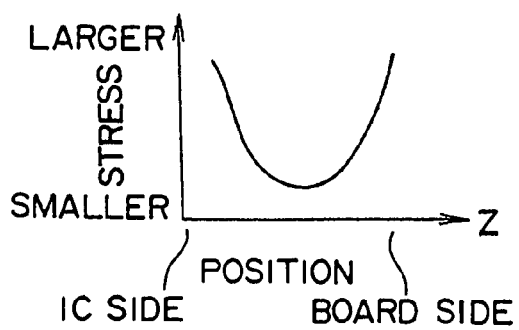

In the seventh embodiment, the bump 3 formed on the electrode 2 of the IC chip 1 is aligned in position with the electrode 5 of the circuit board 4, without leveling the bump, with interposition of a solid or semi-solid anisotropic conductive film sheet 10 or a thermosetting adhesive 6b obtained by mixing an insulating resin 6m with an inorganic filler 6f. The IC chip 1 is pressed against the circuit board 4 with a pressure force P1 of not smaller than 80 gf per bump in a case of a ceramic board while heating the IC chip 1 from its rear surface side by tool 8 heated to a specified temperature of, for example, about 230° C. to correct warp of the board 4, and the anisotropic conductive film sheet 10 or the thermosetting adhesive 6b interposed between the IC chip 1 and the circuit board 4 is hardened by heat. Next, assuming that a total pressing time is, for example, 20 seconds, then, after a lapse of a specified time t1, i.e., after a lapse of five to ten seconds (one-fourth to one-half the total pressing time), also depending on a reaction rate of material, or in other words, before the reaction rate of the material reaches 90%, the pressure force applied by the tool is reduced to a pressure P2, which is lower than pressure P1, to alleviate stress when the thermosetting adhesive 6b is hardened, and the IC chip 1 and the circuit board 4 are bonded together to electrically interconnect both electrodes 2 and 5. Preferably, by setting pressure P1 to 20 gf or more per bump for a reason that a minimum of about 20 gf is required for deformation of the bump, i.e., in order to obtain a pressure required for deformation and adaptation of the bump and force out excessive resin from between the IC chip 1 and the board 4, and setting pressure P2 to less than 20 gf per bump in order to remove hardening distortion unevenly distributed inside the resin before deformation of the bump, reliability is improved. Detailed reasons are as follows. A stress distribution of thermosetting resin in the anisotropic conductive film sheet 10 or the thermosetting adhesive 6b is increased on the IC chip 1 side and the board 4 side at a time of pressure bonding as shown in FIG. 12C.

Figure 12D:
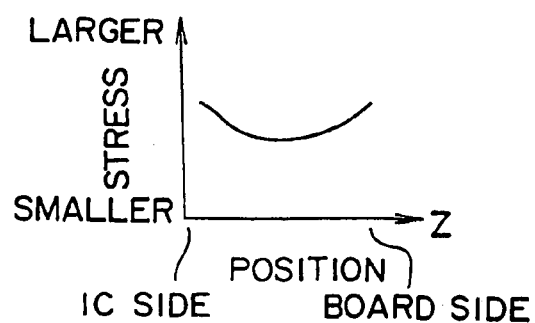

In this maintained state, if fatigue is repetitively given through a reliability test and normal long-term use, then the thermosetting resin in the anisotropic conductive film sheet 10 or the thermosetting adhesive 6b is sometimes unable to endure stress and may separate from the IC chip 1 or the board 4. If the above state occurs, then adhesive strength of the IC chip 1 and the circuit board 4 becomes insufficient and a bonded portion becomes open. Accordingly, by adopting a two-step pressure profile of higher pressure P1 and lower pressure P2 as shown in FIG. 13, pressure can be reduced to pressure P2, lower than pressure P1, when the thermosetting adhesive 6b is hardened, and stress of the IC chip 1 and the circuit board 4, can be alleviated (in other words, a degree of stress concentration can be reduced), as shown in FIG. 12D, by removing a hardening distortion unevenly distributed inside the resin with pressure P2. Subsequently, by increasing pressure to pressure P1, a pressure required for deformation and adaptation of a bump can be obtained, and a excessive resin can be forced out of a space between the IC chip 1 and the board 4, thereby improving reliability.

It is to be noted that the aforementioned "adhesive strength of the IC chip 1 and the circuit board 4" means a force to make the IC chip 1 and the board 4 adhere to each other. In this regard, the IC chip 1 and the board 4 are bonded together by three forces: (1) an adhesive strength provided by the adhesive; (2) a hardening shrinkage force when the adhesive is hardened; and (3) a shrinkage force (for example, a shrinkage force generated when the adhesive heated to a temperature of, for example, 180° C. shrinks when returning to normal temperature) in a Z-direction.

Eighth Embodiment

A method and apparatus for mounting an electronic component, for example, an IC chip onto a circuit board, and an electronic component unit or module, for example, a semiconductor device in which the IC chip is mounted on the board by the mounting method, according to an eighth embodiment of the present invention will be described next with reference to FIG. 24A and FIG. 24B. According to this eighth embodiment, the inorganic filler 6f mixed with the insulating resin 6m in each of the aforementioned embodiments has a mean particle diameter of not smaller than 3 μm. It is to be noted that a maximum mean particle diameter of the inorganic filler 6f is assumed to have a dimension that does not exceed a gap dimension between IC chip 1 and board 4 after bonding.

If fine particles having a mean particle diameter smaller than 3 μm are used as the inorganic filler 6f when the insulating resin 6m is mixed with the inorganic filler 6f, then a surface area of those particles becomes large as a whole, and this possibly leads to moisture absorption in a periphery of the inorganic filler 6f having a mean particle diameter smaller than 3 μm, which is disadvantageous in terms of bonding of the IC chip 1 to the board 4.

Therefore, when the inorganic filler 6f of the same weight is mixed, an amount of moisture absorption in a periphery of the inorganic filler 6f can be reduced by employing an inorganic filler 6f that has a mean particle diameter of not smaller than 3 μm, and this allows moisture resistance to be improved. Moreover, the inorganic filler of a larger mean particle diameter (in other words, average grain size) is generally less expensive, and this is preferable in terms of cost.

Figure 24A:
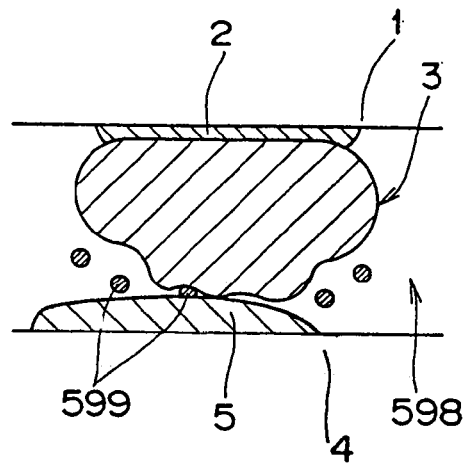
FIG. 24A and FIG. 24B are enlarged sectional views in the vicinity of a bump for explaining a comparison between an ACF processing method and the processing method of the above embodiment.
Figure 24B:
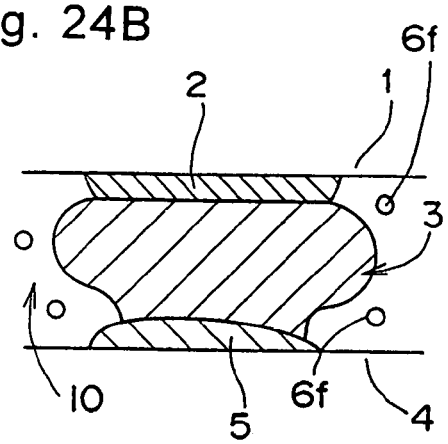

As shown in FIG. 24A, according to a processing method that employs conventional ACF (Anisotropic Conductive Film) 598 for bonding of IC chip 1 to board 4, it is required to place conductive particles 599 in the ACF 598 between bump 3 and board electrode 5 without fail, and concurrently effect conductivity by crushing the conductive particles from a diameter of 3 to 5 μm to a diameter of 1 to 3 μm. However, in each of the aforementioned embodiments of the present invention, the conductive particles 10a, which may exist, are not necessarily placed between bump 3 and board electrode 5. As shown in FIG. 24B, the bump 3 is pressure-bonded to board electrode 5 while being crushed, and therefore, inorganic filler 6f also slips out of a space between the bump 3 and the board electrode 5 together with anisotropic conductive layer 10 located between the bump 3 and the board electrode 5 at a time of this pressure bonding. Because almost no hindrance of conductivity occurs due to placement of unnecessary inorganic filler 6f between the board electrode 5 and the bump 3, the inorganic filler 6f that has a large mean particle diameter of not smaller than 3 μm can be employed. That is, according to the present embodiment, even if conductive particles 10a are not placed between the bump 3 and the board electrode 5 by chance, and conductivity is not effected by crushing of the conductive particles from a diameter of 3 to 5 μm to a diameter of 1 to 3 μm, electrical conductivity is obtained by direct electrical contact of the bump 3 with the board electrode 5 by virtue of crushing of the bump 3 by the board electrode 5. Accordingly, there is no problem, and reliability can be improved without receiving influence of the inorganic filler. That is, there is produced an additional effect that the conductive particles 10a can reduce a value of the connection resistance between board electrode 5 located on the board and bump 3 located on the IC chip when placed between the bump 3 and the board electrode 5 through direct bonding of the bump 3 to the board electrode 5.

Ninth Embodiment

Figure 25:
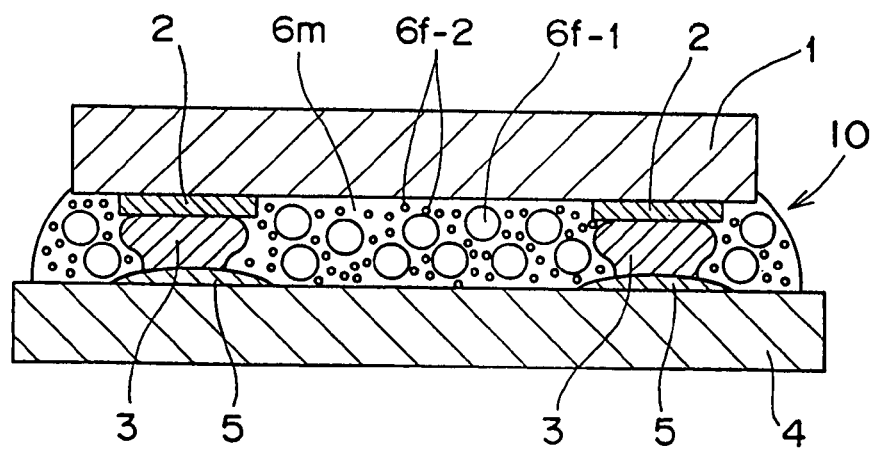
FIG. 25 is a schematic sectional view of a bonded state produced by a method and apparatus for mounting an electronic component of, for example, an IC chip on a circuit board according to a ninth embodiment of the present invention.
Figure 26:
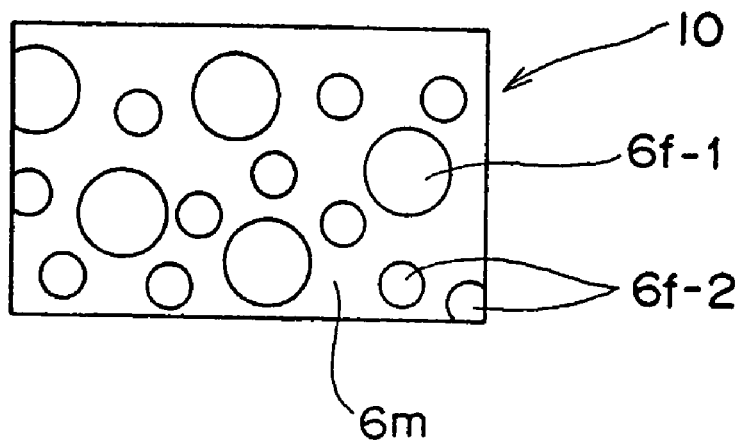
FIG. 26 is a partially enlarged schematic sectional view of a resin sheet employed by the method and apparatus for mounting the electronic component of, for example, an IC chip on the circuit board of the ninth embodiment.

A method and apparatus for mounting an electronic component, for example, an IC chip onto a circuit board, and an electronic component unit or module, for example, a semiconductor device in which the IC chip is mounted on the board by the mounting method, according to a ninth embodiment of the present invention will be described next with reference to FIG. 25 and FIG. 26. FIG. 25 and FIG. 26 are a schematic sectional view of a bonded state produced by the method and apparatus for mounting an electronic component, for example, an IC chip onto a circuit board, and a partially enlarged schematic sectional view of an anisotropic conductive film sheet 10 employed in this method and apparatus, according to the ninth embodiment. According to this ninth embodiment, the inorganic filler 6f to be mixed with the insulating resin 6m of the anisotropic conductive layer 10 in each of the aforementioned embodiments includes inorganic fillers 6f-1 and 6f-2, which have a plurality of different mean particle diameters. As a concrete example, an inorganic filler having a mean particle diameter of 0.5 μm and an inorganic filler having a mean particle diameter of 2 to 4 μm are employed.

According to the ninth embodiment, by mixing the insulating resin 6m with the inorganic fillers 6f-1 and 6f-2, which have the plurality of different mean particle diameters, an amount of the inorganic filler 6f to be mixed with the insulating resin 6m can be increased, and an amount of moisture absorption in a periphery of the inorganic filler can be reduced. This enables improvement in terms of moisture resistance and facilitates film formation (solidification). That is, in terms of percentage by weight, an amount of the inorganic filler per unit volume can be increased when inorganic fillers of different particle diameters are mixed as opposed to when one type of inorganic filler is employed. This enables an increase in amount of the inorganic filler 6f to be part of the anisotropic conductive film sheet 10 or anisotropic conductive film forming thermosetting adhesive 6b, that serves as an encapsulation sheet and enables reduction in a coefficient of linear expansion of the anisotropic conductive film sheet 10 or the anisotropic conductive film forming thermosetting adhesive 6b, thereby allowing an operating life to be increased for improvement of reliability.

Tenth Embodiment

Next, according to a method and apparatus for mounting an electronic component, for example, an IC chip onto a circuit board, and an electronic component unit or module, for example, a semiconductor device in which the IC chip is mounted on the board by the mounting method, according to a tenth embodiment of the present invention will be described. In order to further ensure an effect of the ninth embodiment, a mean particle diameter of one inorganic filler 6f-1, of the inorganic fillers 6f-1 and 6f-2, is two or more times different from a mean particle diameter of the other inorganic filler 6f-2. As a concrete example, an inorganic filler having a mean particle diameter of 0.5 μm and an inorganic filler having a mean particle diameter of 2 to 4 μm are employed.

With this arrangement, the effect of the ninth embodiment can further be improved. That is, by mixing insulating resin 6m with inorganic fillers 6f-1 and 6f-2, which have the plurality of different mean particle diameters and in which the mean particle diameter of inorganic filler 6f-1 is two or more times different from the mean particle diameter of inorganic filler 6f-2, an amount of the inorganic filler 6f to be mixed with the insulating resin 6m can be more reliably increased. This arrangement facilitates film formation (solidification), increases loadings (mixed amount) of the inorganic filler 6f in the anisotropic conductive film sheet 10 or the anisotropic conductive film forming adhesive 6b, and enables further reduction in the coefficient of linear expansion of the anisotropic conductive film sheet 10 or the anisotropic conductive film forming adhesive 6b, thereby allowing the operating life to be increased for further improvement of reliability.

Eleventh Embodiment

Next, according to a method and apparatus for mounting an electronic component, for example, an IC chip onto a circuit board, and an electronic component unit or module, for example, a semiconductor device in which the IC chip is mounted on the board by the mounting method, according to an eleventh embodiment of the present invention will be described. In order to further ensure an effect of the ninth embodiment, it is preferable to have the inorganic filler 6f, to be mixed with the insulating resin 6m, include at least two types of inorganic fillers 6f-1 and 6f-2, which have a plurality of different mean particle diameters, with one inorganic filler 6f-1 having a mean particle diameter exceeding 3 μm and the other inorganic filler 6f-2 having a mean particle diameter of not greater than 3 μm. As a concrete example, an inorganic filler having a mean particle diameter of 0.5 μm and an inorganic filler having a mean particle diameter of 2 to 4 μm are employed.

Twelfth Embodiment

Next, according to a method and apparatus for mounting an electronic component, for example, an IC chip onto a circuit board, and an electronic component unit or module, for example, a semiconductor device in which the IC chip is mounted on the board by the mounting method, according to a twelfth embodiment of the present invention will be described. Based on each of the aforementioned embodiments, it is acceptable to have the inorganic filler 6f, to be mixed with the insulating resin 6m, include at least two types of inorganic fillers 6f-1 and 6f-2, which have different mean particle diameters, and constitute inorganic filler 6f-1; having the larger mean particle diameter, from a material identical to that of the insulating resin 6m, thereby producing a stress alleviating effect. As a concrete example, an inorganic filler having a mean particle diameter of 0.5 μm and an inorganic filler having a mean particle diameter of 2 to 4 μm are employed.

According to this twelfth embodiment, a stress alleviating effect can be produced, in addition to an operative effect of the ninth embodiment, by virtue of an arrangement that the inorganic filler 6f-1 having the larger mean particle diameter is made of the material identical to that of the insulating resin 6m, and integration of the inorganic filler 6f-1 with the insulating resin 6m when a stress is exerted on the insulating resin 6m.

Thirteenth Embodiment

Next, according to a method and apparatus for mounting an electronic component, for example, an IC chip onto a circuit board, and an electronic component unit or module, for example, a semiconductor device in which the IC chip is mounted on the board by the mounting method, according to a thirteenth embodiment of the present invention will be described. Based on each of the aforementioned embodiments, it is acceptable to have the inorganic filler 6f, to be mixed with the insulating resin 6m, include at least two types of inorganic fillers 6f-1 and 6f-2, which have different mean particle diameters, and make inorganic filler 6f-1 having the larger mean particle diameter softer than an epoxy resin of the insulating resin 6m, thereby producing a stress alleviating effect by compression of the inorganic filler 6f-1.

Figure 27:
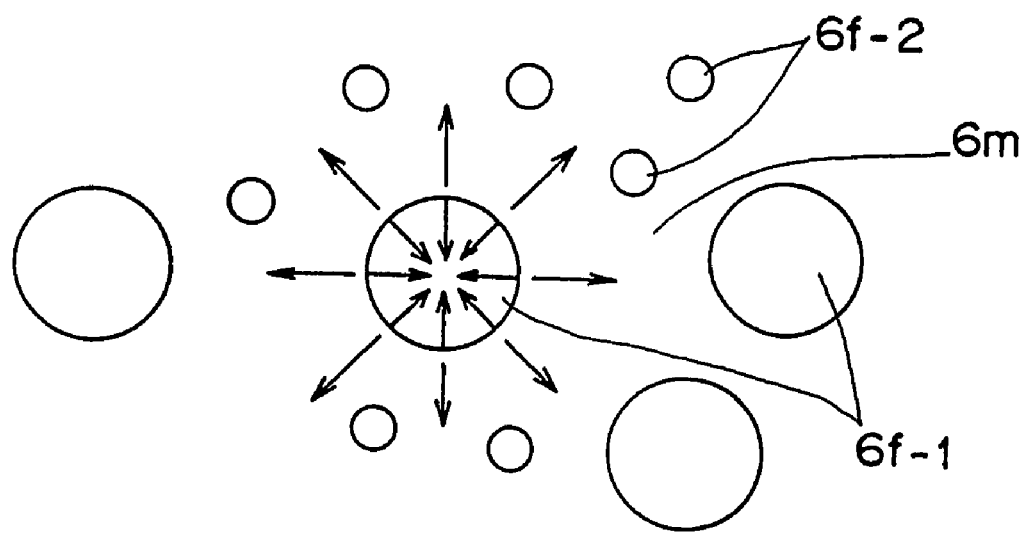
FIG. 27 is a schematic sectional view of an insulating resin and an inorganic filler in a bonded state achieved by a method and apparatus for mounting an electronic component of, for example, an IC chip on a circuit board according to a thirteenth embodiment of the present invention.

According to this thirteenth embodiment, the stress alleviating effect can be produced, in addition to the operative effect of the ninth embodiment, by virtue of an arrangement that the inorganic filler 6f-1 having the larger mean particle diameter is made of the material identical to that of the insulating resin 6m, and an arrangement that the inorganic filler 6f-1 is softer than the epoxy resin of the insulating resin 6m. As a consequence, the inorganic filler 6f-1 is compressed as shown in FIG. 27 to disperse a tension force, of a reactive force against compression, therearound when a stress is exerted on the insulating resin 6m.

Fourteenth Embodiment

Figure 28A:
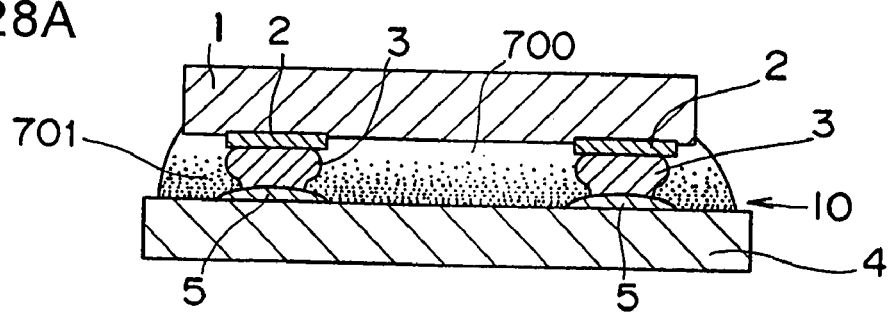
FIG. 28A, FIG. 28B, FIG. 28C and FIG. 28D are schematic sectional views of various examples of electronic component units of an anisotropic conductive layer employed by a method and apparatus for mounting an electronic component of, for example, an IC chip on a circuit board according to a fourteenth embodiment of the present invention.
Figure 28B:
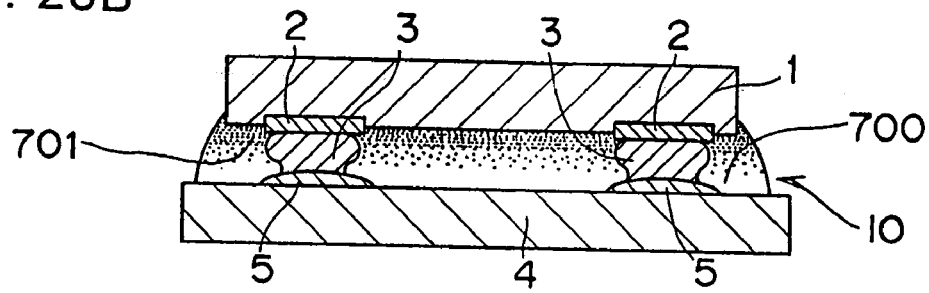

Next, according to a method and apparatus for mounting an electronic component, for example, an IC chip onto a circuit board, and an electronic component unit or module, for example, a semiconductor device in which the IC chip is mounted on the board by the mounting method, according to a fourteenth embodiment of the present invention will be described. Based on each of the aforementioned embodiments, it is further acceptable to provide a portion 700 or a layer 6x, which belongs to anisotropic conductive layer 10 and is brought into contact with IC chip 1 or board 4, with a smaller amount of inorganic filler than another portion 701 or a layer 6y, or with no inorganic filler, as shown in FIGS. 28A and 28B, FIGS. 29A and 29B, FIG. 30 and FIG. 31. In this case, it is acceptable to gradually vary an amount of inorganic filler without definitely distinguishing the portion 700 brought into contact with the IC chip 1 or the board 4 from the other portion 701, as shown in FIGS. 28A and 28B, or to definitely distinguish them from each other as shown in FIGS. 29A and 29B, FIG. 30 and FIG. 31. That is, in FIGS. 29A and 29B, FIG. 30 and FIG. 31, the anisotropic conductive layer 10 is of a multilayer structure provided with a first resin layer 6x that is positioned in a portion brought into contact with the IC chip 1 or the board 4, and in which an insulating resin, identical to the insulating resin 6m, is mixed with the inorganic filler 6f, as well as a second resin layer 6y constructed of the insulating resin mixed with a smaller amount of inorganic filler than the first resin layer 6x, or with no inorganic filler 6f.

With this arrangement, the following effects can be produced. That is, if the inorganic filler 6f is mixed by the same weight percentage (wt %) with the whole body of the anisotropic conductive layer, then the inorganic filler 6f might increase on the IC chip side or the board side or in the vicinity of the opposite surfaces of both of them and conversely decreases in a portion located in the middle of the IC chip 1 and the board 4. As a result, there is a greater amount of filler 6f on the IC chip side or the board side or in the vicinity of the opposite surfaces of both of them, and therefore, the adhesive strength is sometimes reduced between the anisotropic conductive layer 10 and the IC chip 1 or the board 4 or both of them. According to the fourteenth embodiment, with the arrangement that the portion 700 or the layer 6x brought in contact with either one of the IC chip 1 and the board 4 is mixed with a smaller amount of inorganic filler than the other portion 701 or the layer 6y or with no inorganic filler 6f, the reduction in the adhesive strength due to the large amount of inorganic filler can be prevented.

A variety of modification examples of this fourteenth embodiment will be described below.

Figure 28C:
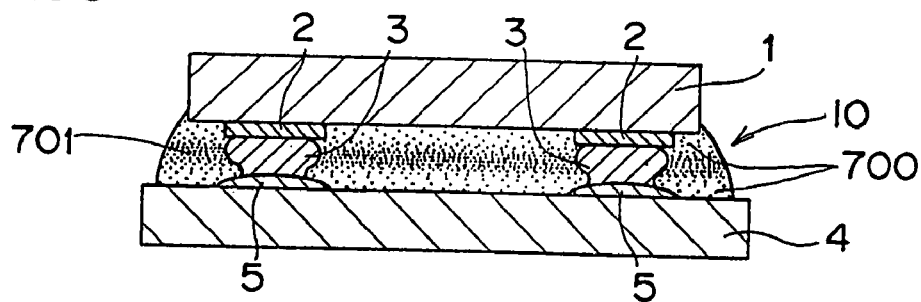
Figure 29A:
FIG. 29A, FIG. 29B, FIG. 29C and FIG. 29D are schematic sectional views of various examples of an anisotropic conductive layer employed by a method and apparatus for mounting an electronic component of, for example, an IC chip on a circuit board according to modification examples of the fourteenth embodiment of the present invention.
Figure 29B:
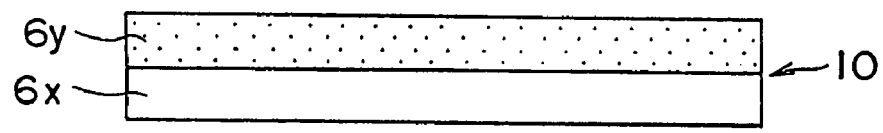
Figure 29C:
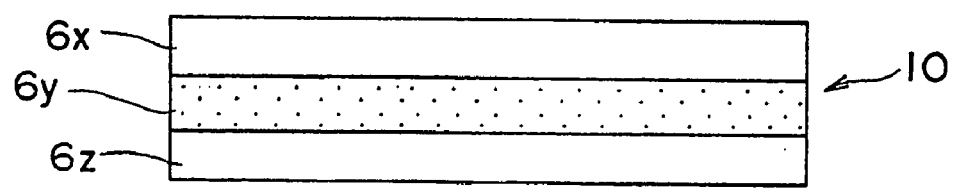
Figure 32A:
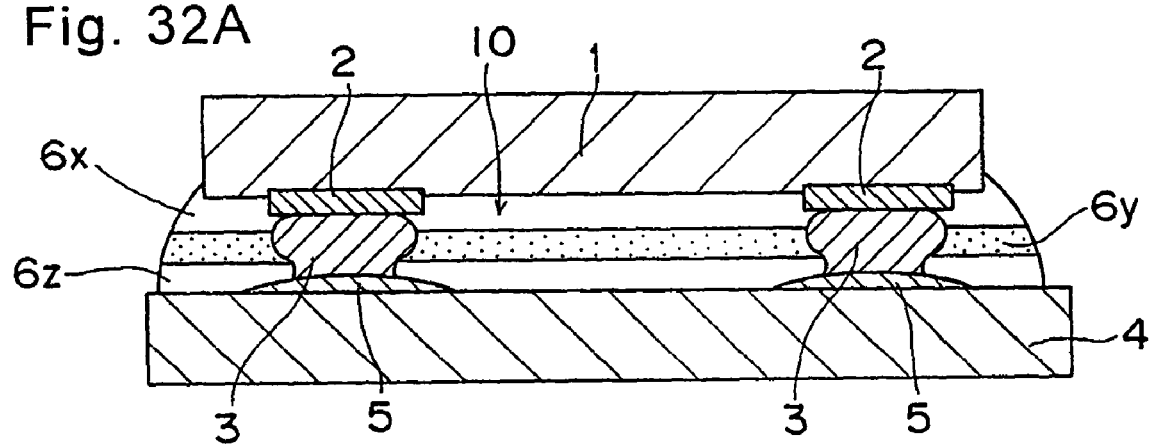
FIG. 32A and FIG. 32B are schematic sectional views of a bonded state achieved by using the anisotropic conductive layer employed by the method and apparatus for mounting the electronic component of, for example, an IC chip on the circuit board of the fourteenth embodiment shown in FIG. 29C and FIG. 29D.

First, as a first modification example, as shown in FIG. 28C, FIG. 29C and FIG. 32A, the anisotropic conductive layer 10 can be constructed so that the portion 700 brought in contact with both the IC chip 1 and the board 4 is mixed with a smaller amount of inorganic filler than the other portion 701 or with no inorganic filler 6f. Also, in this case, it is acceptable to gradually vary the amount of inorganic filler without definitely distinguishing the portion 700 brought in contact with both the IC chip 1 and the board 4 from the other portion 701 as shown in FIG. 28C or to definitely distinguish them from each other as shown in FIG. 29C and FIG. 32A. That is, in FIG. 29C and FIG. 32A, it is acceptable to make the anisotropic conductive layer 10 have a multilayer structure further provided with a third resin layer 6z that is located on the opposite side of the first resin layer 6x with respect to the second resin layer 6y and is constructed of the insulating resin mixed with a smaller amount of inorganic filler than the first resin layer 6x or no inorganic filler 6f and bring the first resin layer 6x and the third resin layer 6z in contact with the IC chip 1 and the board 4, respectively.

Furthermore, as another modification example, it is acceptable to mix the portion 700 brought in contact with the IC chip 1 or the board 4 or both of them with the inorganic filler by less than 20 wt % or with no inorganic filler 6f and mix the other portion 701 with the inorganic filler by not less than 20 wt %. In this case, it is acceptable to gradually vary the amount of inorganic filler without definitely distinguishing the portion 700 brought in contact with the IC chip 1 or the board 4 or both of them from the other portion 701 as shown in FIGS. 28A, 28B and 28C or to definitely distinguish them from each other as shown in FIGS. 29A, 29B and 29C, FIG. 30, FIG. 31 and FIG. 32A. That is, it is possible to mix the first resin layer 6x or the first resin layer 6x and the third resin layer 6z with the inorganic filler by less than 20 wt % or with no inorganic filler 6f and mix the second resin layer 6y with the inorganic filler by not less than 20 wt %.

As a concrete example, assuming that the insulating resin 6m is provided by thermosetting epoxy resin, then the second resin layer 6y occupies 50 wt % in the case of a ceramic board or 20 wt % in the case of a glass epoxy board. As an example, the first resin layer 6x or the third resin layer 6z or both of them are made to have a thickness of 15 µm, while the second resin layer 6y is made to have a thickness of 40 to 60 µm. The thickness of the anisotropic conductive layer 10 is made to have a dimension larger than the gap dimension obtained after the bonding of the IC chip 1 to the board 4, so that the space between the IC chip 1 and the board 4 is completely filled with the layer at the time of bonding of the IC chip 1 to the board 4, further ensuring the connection.

Figure 28D:
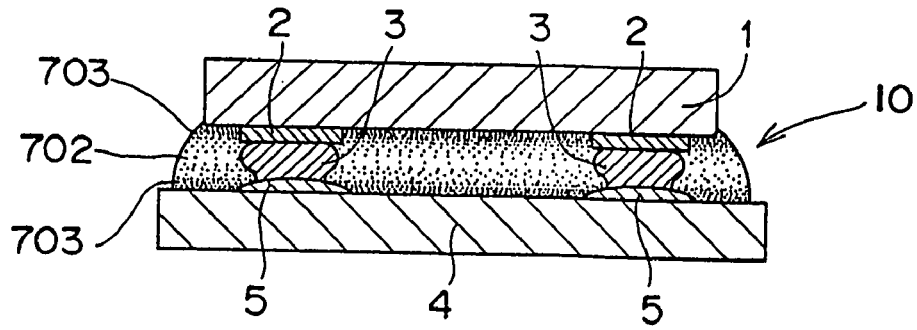
Figure 29D:
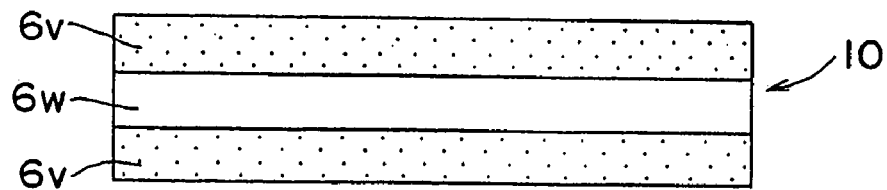
Figure 32B:
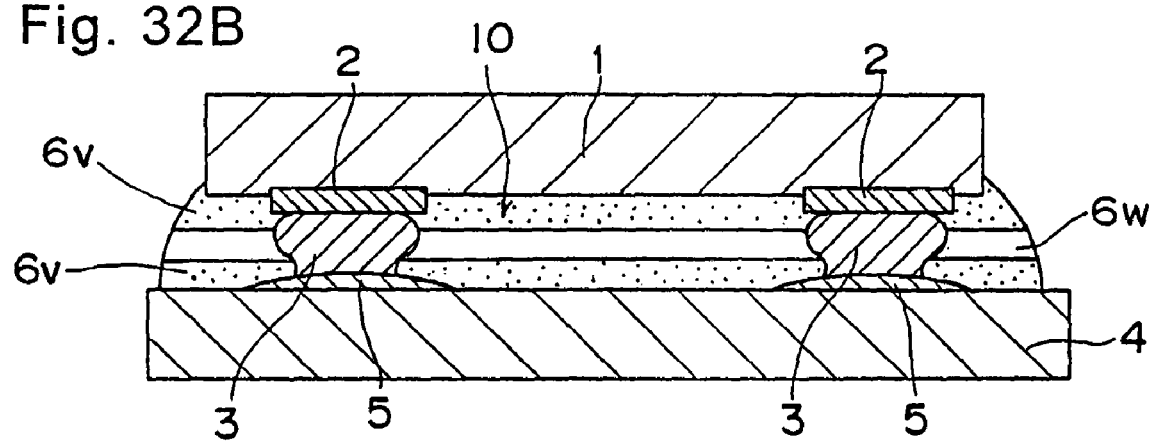

As another modification example, it is acceptable to reverse the loadings of the inorganic filler with respect to the modification example shown in FIG. 28C, FIG. 29C and FIG. 32A. That is, as shown in FIG. 28D, it is acceptable to make a middle portion 702 of the portion 703 that belongs to the anisotropic conductive layer 10 and is brought in contact with both the IC chip 1 and the board 4 is mixed with a smaller amount of inorganic filler than the portion 703 brought in contact with both the IC chip 1 and the board 4 or with no inorganic filler 6f. Also in this case, it is acceptable to gradually vary the amount of inorganic filler without definitely distinguishing the portion 703 brought in contact with both the IC chip 1 and the board 4 from the middle portion 702 or to definitely distinguish them from each other as shown in FIG. 29D and FIG. 32B. That is, as shown in FIG. 29D and FIG. 32B, the anisotropic conductive layer 10 can be provided with a fourth resin layer 6v constructed of the insulating resin 6m that is positioned in the portion brought in contact with the IC chip 1 and the board 4 and mixed with the inorganic filler 6f and a fifth resin layer 6w constructed of the insulating resin 6m that is positioned in the middle portion between the IC chip 1 and the board 4 and mixed with a smaller amount of inorganic filler than the fourth resin layer 6v or with no inorganic filler.

With this arrangement, the middle portion 702 located between the IC chip 1 and the board 4 or the fifth resin layer 6w is mixed with a smaller amount of inorganic filler than that of the portion 703 or the fourth resin layer 6v brought in contact with the IC chip 1 and the board 4 or with no inorganic filler, and therefore, the elastic modulus is reduced, allowing the stress alleviation effect to be produced. By selectively employing an insulating resin of high adhesion to the IC chip 1 and the board 4 as the insulating resin of the portion 703 or the fourth resin layer 6v brought in contact with the IC chip 1 and the board 4, it is allowed to select the loadings or material of the inorganic filler 6f so that the portion 703 brought in contact with the IC chip 1 or the fourth resin layer 6v located in the vicinity of the IC chip 1 comes to have a coefficient of linear expansion closer to that of the IC chip 1 and select the loadings or material of the inorganic filler 6f so that the portion 703 brought in contact with the board 4 or the fourth resin layer 6v located in the vicinity of the board 4 comes to have a coefficient of linear expansion closer to that of the board 4. As a result, the coefficient of linear expansion of the portion 703 brought in contact with the IC chip 1 or the fourth resin layer 6v located in the vicinity of the IC chip 1 comes close to that of the IC chip 1. Therefore, both the members are hard to separate, and since the coefficient of linear expansion of the portion 703 brought in contact with the board 4 or the fourth resin layer 6v located in the vicinity of the board 4 comes close to that of the board 4, both the members are hard to separate.

Figure 33A:
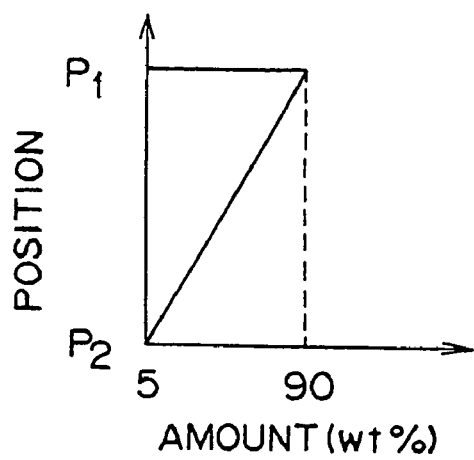
FIG. 33A, FIG. 33B, FIG. 33C, FIG. 33D, FIG. 33E and FIG. 33F are graphs showing various relations between the amount of the inorganic filler of the anisotropic conductive layer employed by the method and apparatus for mounting the electronic component of, for example, an IC chip on the circuit board of the fourteenth embodiment and the position in the direction of thickness of the anisotropic conductive layer.
Figure 33B:
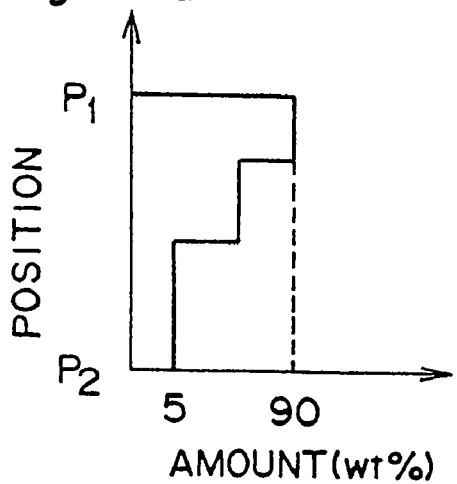

Furthermore, as indicated by the solid lines in FIGS. 33A and 33B, the anisotropic conductive layer 10 can also be constructed so that the amount of the inorganic filler is reduced gradually or in steps from the portion P1 brought in contact with either the IC chip 1 or the board 4 toward the other portion P2.

Figure 33C:
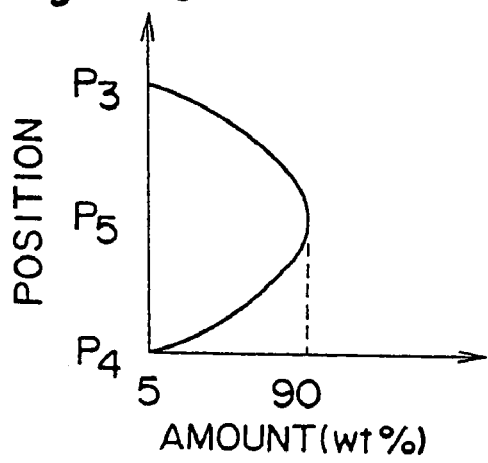
Figure 33D:
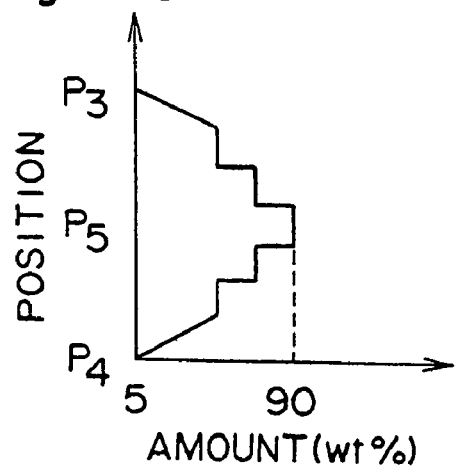

As indicated by the solid lines in FIGS. 33C and 33D, the anisotropic conductive layer 10 can also be constructed so that the amount of the inorganic filler is reduced gradually or in steps from portions P3 and P4 brought in contact with the IC chip 1 and the board 4, respectively, toward another portion, i.e., a middle portion P5 located between the IC chip 1 and the board 4.

Figure 33E:
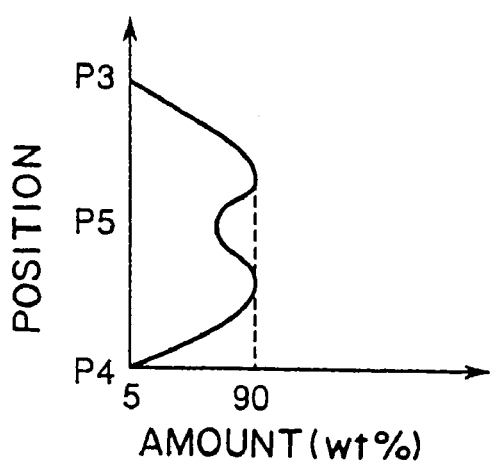

As indicated by the solid line in FIG. 33E, the anisotropic conductive layer 10 can also be constructed so that the amount of the inorganic filler is gradually reduced from a portion brought in contact with the IC chip 1 and the board 4 (portion corresponding to the contact portion 703 in the modification example of FIG. 28D) toward a middle portion (portion corresponding to the middle portion 702 in the modification example of FIG. 28D) located between the IC chip 1 and the board 4.

Figure 33F:
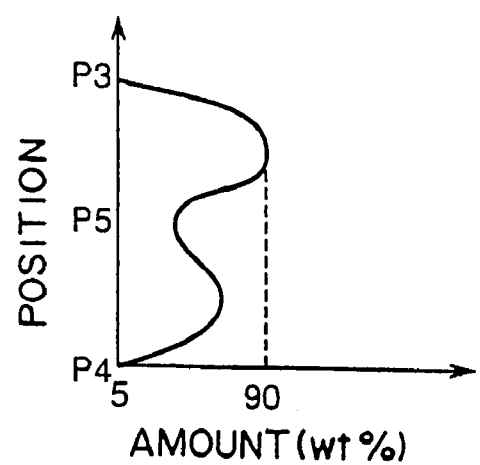

As indicated by the solid line in FIG. 33F, the anisotropic conductive layer 10 can also be constructed so that the amount of the inorganic filler is mixed less in the order of a portion located in the vicinity of the IC chip 1, a portion located in the vicinity of the board 4, and a middle portion located between the vicinity of the IC chip 1 and the vicinity of the board 4. Although the amount of the inorganic filler is gradually reduced in the above-mentioned order as shown by example in FIG. 33F, without being limited to this, the amount may be reduced in steps.

With the arrangements of the modification examples of FIGS. 33E and 33F, the middle portion located between the IC chip 1 and the board 4 is mixed with a smaller amount of inorganic filler than that of the portions brought in contact with the IC chip 1 and the board 4 or with no inorganic filler. Therefore, the elastic modulus becomes reduced, allowing the stress alleviation effect to be produced. By selectively employing an insulating resin of high adhesion to the IC chip 1 and the board 4 as the insulating resin of the portion brought in contact with the IC chip 1 and the board 4, it is allowed to select the loadings or material of the inorganic filler 6f so that the portion brought in contact with the IC chip 1 comes to have a coefficient of linear expansion closer to that of the IC chip 1 and select the loadings or material of the inorganic filler 6f so that the portion brought in contact with the board 4 comes to have a coefficient of linear expansion closer to that of the board 4. If the loadings of the inorganic filler 6f is determined from this point of view, then, as indicated by the solid line in FIG. 33F, the amount of the inorganic filler is mixed less in the order of a portion located in the vicinity of the IC chip 1, a portion located in the vicinity of the board 4, and a middle portion located between the vicinity of the IC chip 1 and the vicinity of the board 4. With this construction, the coefficient of linear expansion of the portion brought in contact with the IC chip 1 comes close to that of the IC chip 1. Therefore, both the members are hard to separate, and since the coefficient of linear expansion of the portion brought in contact with the board 4 comes close to that of the board 4, both the members are hard to separate.

In any one of the cases of FIG. 33A through 33F, it is practically preferable to set the amount of the inorganic filler within a range of 5 to 90 wt %. When the ratio is lower than 5 wt %, the mixture of the inorganic filler 6f is meaningless. When the ratio exceeds 90 wt %, the adhesive strength is extremely reduced, and it is difficult to form a sheet, leading to a disadvantage.

When the IC chip 1 is thermocompression bonded to the board 4 employing a film of a multilayer structure constructed of the plurality of resin layers 6x and 6y or resin layers 6x, 6y, and 6z as described above as an anisotropic conductive layer, the insulating resin 6m is softened and melted by heat at the time of bonding, causing the mixture of the resin layers. Therefore, finally, the definite boundaries between the resin layers disappear, and the inclined inorganic filler distributions as shown in FIG. 33 result.

Furthermore, in the fourteenth embodiment or the modification examples, it is also possible to employ different insulating resins for anisotropic conductive layer that has a portion or layer including the inorganic filler 6f or the anisotropic conductive layer in which the inorganic filler distribution is inclined, according to the portion or the resin layer. For example, it is also possible to employ an insulating resin that improves the adhesion to the film material to be used on the IC chip surface for the portion or the resin layer brought in contact with the IC chip 1 and employ an insulating resin that improves the adhesion to the material of the board surface for the portion or the resin layer brought in contact with the board 4.

According to the fourteenth embodiment and the various modification examples thereof, no or a smaller amount of inorganic filler 6f exists in the bonding interface of the IC chip 1 or the board 4 and the anisotropic conductive layer 10, and the innate adhesion of the insulating resin is effected. This increases the insulating resin of high adhesion in the bonding interface, allowing the adhesion strength of the IC chip 1 or the board 4 and the insulating resin 6m and improving the adhesion to the IC chip 1 or the board 4. With this arrangement, the operating life is improved during a variety of reliability tests, and the peel strength to bending is improved.

If an inorganic filler 6f, which does not contribute to the bonding itself but has the effect of reducing the coefficient of linear expansion, is uniformly distributed in the insulating resin 6m, then the inorganic filler 6f comes in contact with the surface of the board 4 or the IC chip. This leads to a reduction in the amount of adhesive contributing to the bonding and to degraded adhesion. As a result, if the separation between the IC chip 1 or the board 4 and the adhesive occurs, moisture enters the portion, causing the corrosion of the electrode of IC chip 1 or the like. If the separation progresses from the separated portion, then the very bonding of the IC chip 1 to the board 4 becomes defective, causing a defective electrical connection.

In contrast to this, according to the fourteenth embodiment and the various modification examples thereof as described above, the adhesive strength can be improved with the effect of reducing the coefficient of linear expansion by the inorganic filler 6f kept provided. This improves the adhesion strength to the IC chip 1 and the board 4 and improves the reliability.

Furthermore, when the portion 700 or the resin layer 6x that has a small amount of inorganic filler 6f is arranged on the IC chip side or when the inorganic filler distribution is reduced on the IC chip side, the portion 700 or the resin layer 6x is able to have an improved adhesive strength to the passivation film made of silicon nitride or silicon oxide on the IC chip surface. It is also possible to properly select and employ an insulating resin that improves adhesion to the film material used on the IC chip surface. Moreover, by reducing the elastic modulus in the vicinity of the IC chip, the stress concentration in the encapsulating sheet material, which is one example of the anisotropic conductive layer, is alleviated. If such a structure is adopted when the material used for the board 4 is as hard as ceramic (with high elastic modulus), then there is advantageously provided matching with the encapsulating sheet material in the vicinity of the board in terms of elastic modulus and the coefficient of linear expansion.

In the case where the portion 700 or the resin layer 6x having a small amount of inorganic filler 6f is arranged on the board side or in the case where the inorganic filler distribution is reduced on the board side, if a bending stress is applied when the board 4 is assembled into the casing of electric equipment when a bending force is applied to the board 4 as in the case of a resin board or a flexible board (FPC), then the portion or layer can be used for the purpose of improving the adhesion strength exerted between the board 4 and the encapsulating sheet that serves as an example of the anisotropic conductive layer. In the case where the surface layer on the IC chip side is constructed of a protecting film formed of a polyimide film, the elastic modulus and the coefficient of linear expansion vary continuously or in steps from the IC chip 1 to the board 4 when the adhesion of the insulating resin is generally satisfactory and has no problem, allowing the encapsulating sheet to be made of a hard material on the IC chip side and of a soft material on the board side. With this arrangement, the stress generation inside the encapsulating sheet is reduced, and therefore, the reliability is improved.

Furthermore, in the case where the portion 700 or the resin layers 6x and 6z having a small amount of inorganic filler 6f are arranged on both the IC chip side and the board side or in the case where the inorganic filler distribution is reduced on both the IC chip side and the board side, a compatibility is assured on both the IC chip side and the board side. This enables the improvement in adhesion on both the IC chip side and the board side and the connection of both the IC chip 1 and the board 4 with high reliability with a reduced coefficient of linear expansion. Moreover, it is allowed to select and employ an insulating resin of excellent adhesion and resin wettability according to the material of the surface on the IC chip side and the board material. Moreover, the inclination of the loadings of the inorganic filler 6f can be freely changed, and therefore, it is possible to provide matching with the board material by extremely reducing the thickness of the portion or layer that has a small amount of inorganic filler 6f or taking similar measures.

Fifteenth Embodiment

Figure 34:
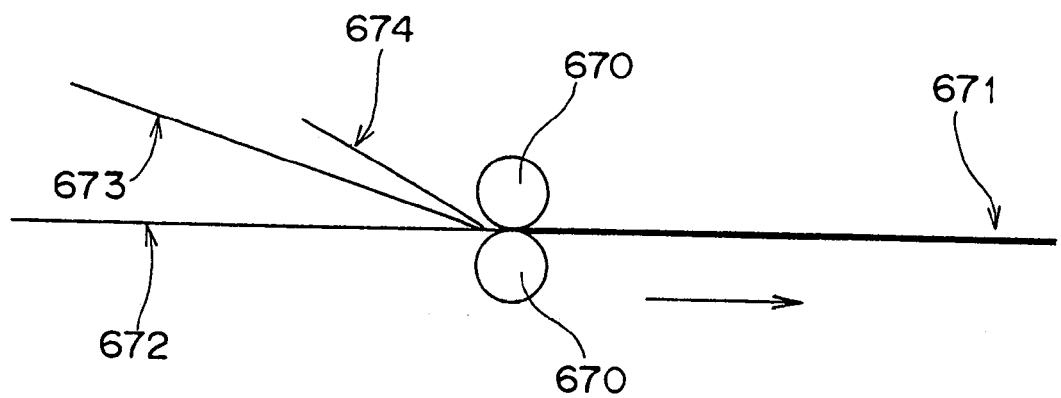
FIG. 34 is an explanatory view of a manufacturing process of the anisotropic conductive layer employed by a method and apparatus for mounting an electronic component of, for example, an IC chip on a circuit board according to a fifteenth embodiment of the present invention.
Figure 35:
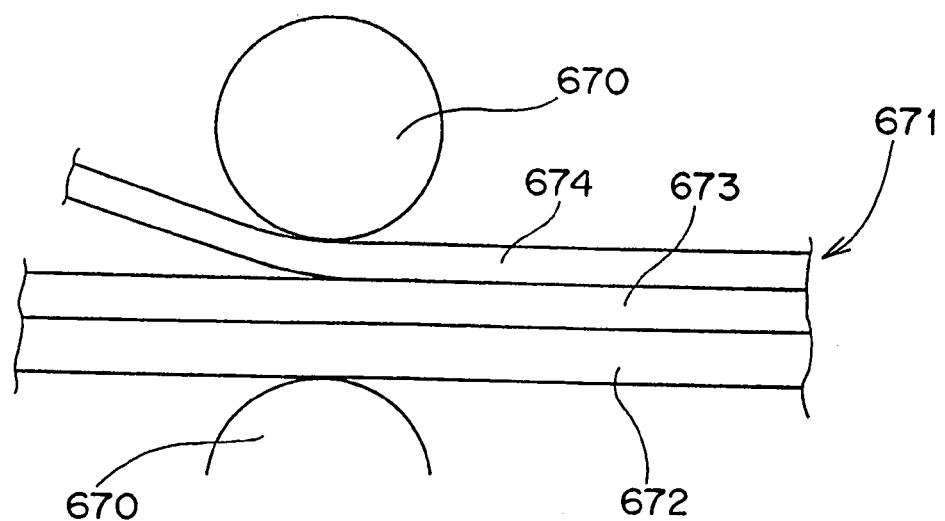
FIG. 35 is a partially enlarged view of FIG. 34.

According to a fifteenth embodiment of the present invention, a process for producing an anisotropic conductive layer to be used for the methods and apparatuses for mounting electronic components of, for example, IC chips on circuit boards and electronic component units or modules of, for example, semiconductor devices in which the IC chips are mounted on the boards by the mounting methods according to the eighth through fourteenth embodiments and the modification examples thereof will be described next with reference to FIG. 34 and FIG. 35.

First of all, when forming an anisotropic conductive layer directly on the circuit board 4, a first resin sheet is stuck onto the circuit board 4, and a second resin sheet is stuck onto the sheet.

Figure 30:
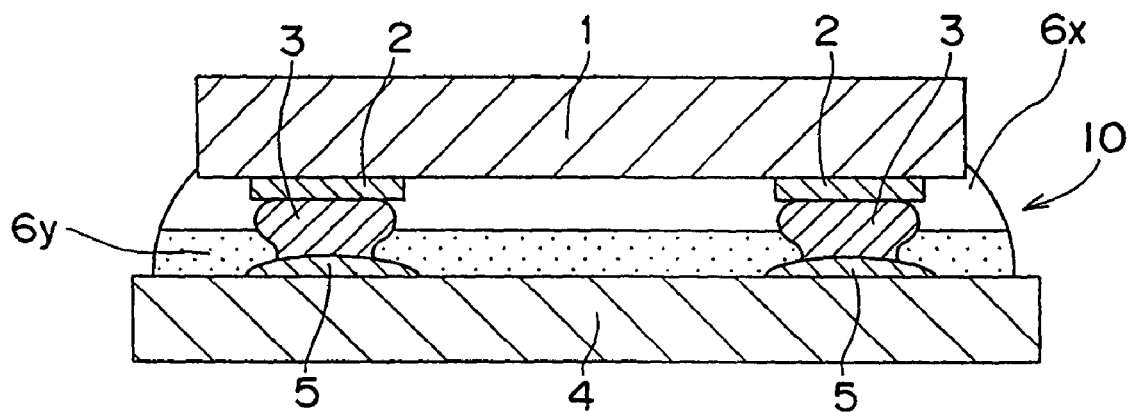
FIG. 30 is a schematic sectional view of a bonded state achieved by using the anisotropic conductive layer employed by the method and apparatus for mounting the electronic component of, for example, an IC chip on the circuit board of the fourteenth embodiment shown in FIG. 29A.
Figure 31:
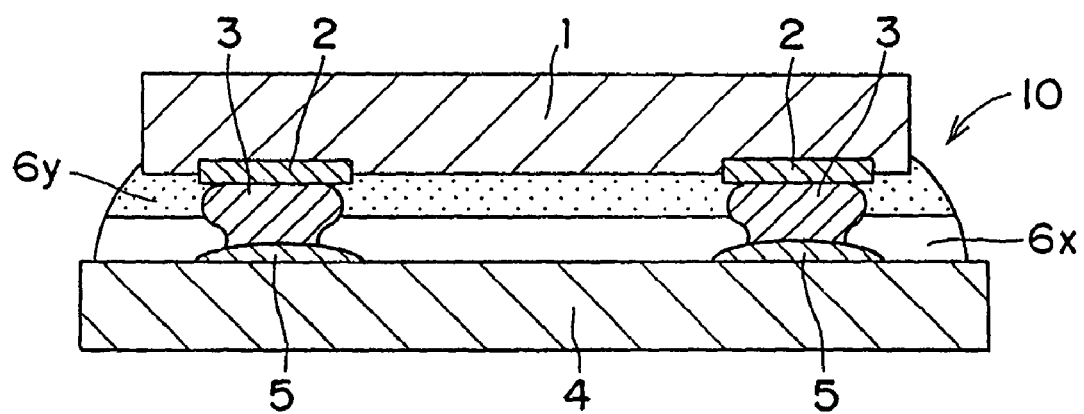
FIG. 31 is a schematic sectional view of a bonded state achieved by using the anisotropic conductive layer employed by the method and apparatus for mounting the electronic component of, for example, an IC chip on the circuit board of the fourteenth embodiment shown in FIG. 29B.

When there is a great amount of inorganic filler 6f in the first resin sheet at this time, there is the result as shown in FIG. 28A or FIG. 30. In the converse case, there is the result as shown in FIG. 28B or FIG. 31. That is, in the former case, the first resin sheet is a resin sheet corresponding to the portion 701 or the second resin layer 6y that has a great amount of inorganic filler 6f. In the latter case, the sheet is a resin sheet corresponding to the portion 700 or the first resin layer 6x that has a small amount of inorganic filler 6f.

When a third resin sheet is further formed on the second resin sheet together with the first resin sheet and the third resin sheet corresponding to the portion 700 or the first resin layer 6x that has a small amount of inorganic filler 6f, there is the result as shown in FIG. 28C or FIG. 32A.

It is also acceptable to preliminarily form a first resin sheet 673 and a second resin sheet 674 on a base film 672 that is called a separator in this order (only this case is shown in FIG. 34 and FIG. 35) or reversely or together with a third resin sheet stuck as shown in FIG. 34 and FIG. 35. In this case, as shown in FIG. 34 and FIG. 35, the plurality of resin sheets 673 and 674 are stuck while heating at need by means of a vertical pair of heatable rollers 670 and 270 as shown in FIG. 34 and FIG. 35. Subsequently, by cutting the formed resin sheet body 671 every prescribed dimension, there is the anisotropic conductive film sheet 10 as shown in any one of FIGS. 28A through 28C, FIGS. 29A through 29C and FIGS. 30 through 32.

When producing an anisotropic conductive film sheet body of the continuous anisotropic conductive film sheets 10 as another modification example, epoxy and inorganic fillers dissolved in a solvent are applied to a base film called a separator by the doctor blade method or the like. This solvent is dried to produce the anisotropic conductive film sheet body.

At this time, a liquid insulating resin in which the density of the inorganic filler 6f is low or no inorganic filler 6f is contained is once applied as a first layer to the base film, and according to circumstances, the applied first layer is dried. When the layer is not dried, a certain amount of the inorganic filler 6f of the second layer is mixed with the first layer, providing a structure in which the inorganic filler distribution is inclined as shown in FIG. 33.

A liquid insulating resin mixed with a greater amount of inorganic filler 6f than that of the first layer is applied as a second layer onto the first layer formed that has been applied and formed. By drying the second layer, there is formed an anisotropic conductive film sheet body of a two-layer structure in which the first layer and the second layer are formed on the base film. By cutting the anisotropic conductive film sheet body every specified dimension, there is an anisotropic conductive film sheet 10 as shown in FIG. 28A, FIG. 29A and FIG. 30.

When the layer that has a small amount of inorganic filler 6f is arranged on the board side, the anisotropic conductive film sheet body of a two-layer structure can be formed by a process reverse to the above, i.e., by forming the second layer on the base film and thereafter forming the first layer on the second layer. By cutting the anisotropic conductive film sheet body every specified dimension, there is an anisotropic conductive film sheet 10 as shown in FIG. 28B, FIG. 29B and FIG. 31.

The insulating resin 6m in which the density of the inorganic filler 6f is low or no inorganic filler 6f is contained is once applied and dried as the first layer (sometimes omitted), and an insulating resin mixed with a greater amount of the inorganic filler 6f or with no inorganic filler 6f is applied onto the first layer and dried as the second layer (sometimes omitted). The third layer in which the amount of the inorganic filler is smaller than that of the second layer is applied onto the second layer. By drying this, there can be formed an anisotropic conductive film sheet body of a three-layer structure in which the first layer, the second layer, and the third layer are formed on the base film. By cutting the anisotropic conductive film sheet body every specified dimension, there is an anisotropic conductive film sheet 10 as shown in FIG. 28C, FIG. 29C and FIG. 32A.

According to the method for forming the anisotropic conductive layer directly on the circuit board 4, on a side of manufacturing the electronic component unit, the resin material most appropriate for the electronic component is selected and arranged on the electronic component side of the anisotropic conductive layer, while the resin material most appropriate for the board can be selected and arranged on the board side, so that the degree of freedom of selecting the resin can be improved.

In contrast to this, according to the method of manufacturing the anisotropic conductive film sheet body, a lot of the anisotropic conductive film sheets 10 can be collectively manufactured although the degree of freedom of selection is less than the above-mentioned case. This leads to a satisfactory manufacturing efficiency and an inexpensive cost and needs only one sticking device.

As described above, according to the aforementioned embodiments of the present invention, many processes that have conventionally been needed for bonding the electronic component of, for example, an IC chip to the circuit board can be eliminated, and the productivity can be remarkably improved. That is, in the case of, for example, the stud bump bonding and the solder bump bonding described as prior art examples, it is required to inject an encapsulating material after flip chip bonding and put the board in a batch type furnace to perform hardening. A time of several minutes per unit is required for the injection of the encapsulating material, and a time of two to five hours are required for the hardening of the encapsulating material. The stud bump bonding mounting further needs a process for transferring an Ag paste to the bump as pre-processing, mounting this on a board and thereafter hardening the Ag paste. Two hours are required for this process. In contrast to this, according to the methods of the aforementioned embodiments, the encapsulating process can be eliminated, allowing the productivity to be remarkably improved. Furthermore, according to the aforementioned embodiment, employing the solid or semi-solid insulating resin encapsulating sheet etc. allows the employment of, for example, epoxy resin of a great molecular weight, allows the achievement of bonding in a short time of about 10 to 20 seconds, allows the reduction in bonding time and allows the productivity to be further improved. Furthermore, the following effects can also be produced.

(1) Bump Formation

According to the method of forming a bump with plating (third prior art), a special bump forming process is required to be performed by the semiconductor manufacturer, and therefore, the bump formation can be formed only by the limited manufacturers. However, according to the aforementioned embodiments of the present invention, IC chips for general-purpose wire bonding can be employed by means of a wire bonding device, and IC chips can easily be obtained. The reason why the IC chips for general-purpose wire bonding can be employed is that bumps can be formed on an ordinary IC pad on which Al pads are formed by means of a wire bonding device or a bump bonding apparatus so long as the IC chips are for wire bonding use. On the other hand, in order to form a plating bump by the method of forming a bump with plating (third prior art), there are the processes of forming a barrier metal of Ti, Cu, Cr, or the like on an Al pad, applying a resist by spin coating, and forming a hole by exposure only in the bump forming portion. The bump is formed by electrifying this and plating the hole portion with Au or the like. Therefore, a large-scale plating apparatus and a waste disposal plant of hazardous substances such as cyanides are needed to form the plating bump, and therefore, it is practically impossible to do so in a factory that carries out the ordinary assembly processes.

Moreover, the bump leveling for stabilizing the amount of transfer of the adhesive in an unstable transfer process of transfer such as the transfer of the conductive adhesive becomes unnecessary by comparison with the method of the first prior art, and the leveling device for such a leveling process becomes unnecessary. The above is because it is not required to preliminarily level only the bumps since the bumps are crushed on the electrodes of the board while pressurizing the bumps.

Moreover, if the following method is adopted to the embodiments, bonding of high reliability can also be achieved even when a bump 103 is bonded to the electrode 5 of the circuit board 4 as mounted with a shift. That is, when forming the bump 3 on the IC chip 1, a gold ball 96a is formed by subjecting the gold wire to an electric spark similarly to the wire bonding. Next, a ball 96a of a Φd-Bump of the diameter denoted by 95a is formed, and a bump 103 is formed on the electrode 2 of the IC chip 1 by supersonic waves and thermocompression-bonding by means of a capillary 193 designed so that a chamfer diameter φD denoted by 93a of the capillary 193 whose chamfer angle θc is not greater than 100° becomes one-half to three-fourths the gold ball diameter d-Bump and no flat portion is provided in the portion to be brought in contact with the gold ball 96a of a capillary 193 in terms of tip shape. By using the capillary 193 that has the above-mentioned configuration, an approximately conically tipped bump 103 as shown in FIG. 10B can be formed on the electrode 2 of the IC chip 1. Even when the bump 103 formed by the aforementioned method is mounted on the electrode 5 of the circuit board 4 while being shifted by a dimension Z as shown in FIG. 11C, the bump 103 can partially come in contact with the electrode 5 of the board 4 without fail so long as the shift is not greater than half the outside diameter of the bump 103 since the bump 103 has the approximately conically tipped shape. The so-called base 3g of a width dimension d of the bump 3 partially comes in contact with the electrode in FIG. 11D of the conventional bump 3. However, this contact is mere partial contact, leading to unstable bonding. If this is subjected to a thermal shock test or reflow, the bonded portion becomes open. The present invention can eliminate the above-mentioned unstable bonding and provide the bonding of high production yield and high reliability.

(2) Bonding of IC Chip to Circuit Board

According to the method of the second prior art, the connection resistance has been depended on the number of conductive particles that exist between the bump and the electrode of the circuit board. However, according to the aforementioned embodiments of the present invention, it is not required to place conductive particles between both the electrodes for the electrical continuity between the IC chip side electrode and the board side electrode, and the bump 3 can be directly connected to the electrode 5 by being pressed against the electrode 5 of the circuit board 4 with a load (for example, a pressure force of not smaller than 20 gf per bump 3) heavier than in the first and second prior art examples without being leveled in the leveling process as an independent process. Therefore, the connection resistance value does not depend on the number of interposed particles, and the connection resistance value can be stably obtained. That is, the conductive particles 10a produce the additional effect that the value of the connection resistance between the electrode 5 located on the board side and the bump 3 located on the IC chip side can be reduced when the conductive particles 10a are placed between the bump 3 and the board electrode 5 in directly bonding the bump 3 to the board electrode 5.

Although the conventional leveling process has been performed in order to shape the bump height constant at the time of bonding to the board electrode, the crushing of the bump 3 can be performed concurrently with the bonding to the electrode 2 or 5 in each of the embodiments of the present invention. Therefore, no independent leveling process is needed, and the bonding can be achieved while correcting the warp and undulation of the circuit board 4 by deforming the same at the time of bonding, or the bonding is achieved while correcting the warp and undulation of the circuit board 4 by deforming the same at the time of bonding without the need for the leveling process of the bumps 3 and 103 by hardening the conductive paste stuck to the bumps 3 and 103 and deforming the conductive paste at the time of bonding. Accordingly, this arrangement tolerates the warp and undulation.

There are needed a high-accuracy board 4 and the uniform leveling of the bumps 3 and 103, as exemplified by 10 μm per IC chip (meaning that a thickness warp dimension accuracy of 10 μm per IC chip is needed) in the first prior art, 2 μm per IC chip in the second prior art, and 1 μm per IC chip in the third prior art (bump height variation of not greater than ±1 μm). In practice, a glass board represented by LCD is employed. In contrast to this, according to the aforementioned embodiments of the present invention, the bonding is achieved while correcting the warp and undulation of the circuit board 4 by deforming the same at the time of bonding. Therefore, a board of a degraded surface flatness including warp and undulation, exemplified by a resin board, a flexible board, a multilayer ceramic board, or the like, can be employed, and a less expensive versatile IC chip bonding method can be provided.

If the volume of the thermosetting resin 6m located between the IC chip 1 and the circuit board 4 is set greater than the volume of the space between the IC chip 1 and the circuit board 4, then the resin flows out of this space, producing the encapsulating effect. Therefore, it is not required to lay an encapsulation resin (underfill coat) under the IC chip after the bonding of the IC chip to the circuit board with the conductive adhesive, which has been needed in the first prior art, and the process can be shortened.

By mixing the inorganic filler 6f with the thermosetting resin 6m by about 5 to 90 wt % of the thermosetting resin 6m, the elastic modulus and the coefficient of thermal expansion of the thermosetting resin can be controlled to be optimum for the board 4. In addition to this, if this is utilized for the ordinary plating bump, then the inorganic filler enters the space between the bump and the circuit board, degrading the bonding reliability. However, if the stud bump (forming method utilizing wire bonding) is employed as in the aforementioned embodiments of the present invention, then the inorganic filler 6f and also the thermosetting resin 6m are forced outwardly of the bumps 3 and 103 by the pointed bumps 3 and 103 that enter the thermosetting resin 6m at the beginning of the bonding. By this operation, the inorganic filler 6f and the thermosetting resin 6m are forced outwardly of the space between the bumps 3 and 103 and the electrodes 5 and 2 in the process of the deformation of the pointed bumps 3 and 103, and the unnecessary interposed object can be eliminated, allowing the reliability to be further improved.

According to the present invention described above, the method and apparatus for bonding electronic components such as IC chips to a circuit boards can be provided with higher productivity and lower cost than those of the conventional bonding method.

Figure 37A:
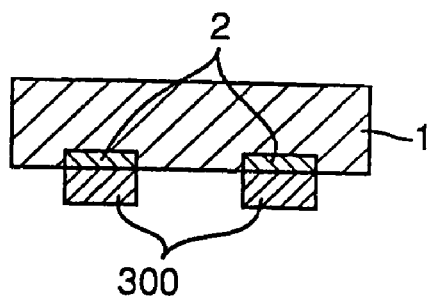
FIG. 37A and FIG. 37B are views showing examples of the bumps that can be employed according to modification examples of the first embodiment.
Figure 37B:
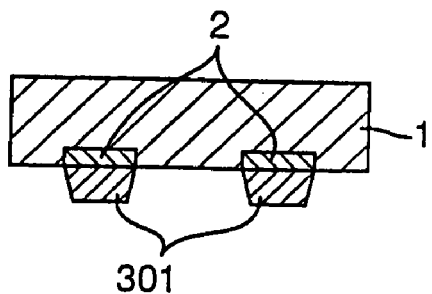

The aforementioned first embodiment can also be applied to the bonding of an IC chip 1 that has the leveled stud bumps 300 and 301 as shown in FIGS. 37A and 37B besides the bumps 3 that are not leveled as shown in FIG. 1 to the board 4. In this case, although the leveling process is necessary, the other effects that the encapsulating process becomes unnecessary can be produced. The aforementioned bump can also be provided by a bump that is formed roughly similarly to FIGS. 37A and 37B in terms of appearance by plating or printing. For example, it is possible to form a bump of titanium, nickel, and gold provided by plating in this order on the IC chip electrode or print a paste obtained by mixing aluminum, nickel, or the like with a synthetic resin on the IC chip electrode and drying or hardening the same to form a polymer bump. Particularly when a leveled bump or a bump formed by plating or printing is employed, it is concerned that the electrical connection between the bump and the board electrode might become unstable due to the possible occurrence of the unintended placement of the inorganic filler between the bump and the board electrode since the deformation of the bump is little. However, the conductive particles 10a are to be placed between the bump and the board electrode, and the continuity between the bump and the board electrode can be secured with this conductive particles 10a.

As described above, the present invention is able to eliminate the processes that have conventionally been needed for bonding an electronic component to a circuit board and remarkably improve the productivity.

The following effects can also be produced.

(1) Bump Formation

According to the method of forming a bump with plating (third prior art), a special bump forming process is required to be performed by the semiconductor manufacturer, and therefore, the bump formation can be formed only by the limited manufacturers. However, according to the present invention, IC chips for general-purpose wire bonding can be employed as an example of the electronic component by means of a wire bonding device, and IC chips can easily be available.

Moreover, the bump leveling for stabilizing the amount of transfer of the adhesive in an unstable transfer process of transfer such as the transfer of the conductive adhesive becomes unnecessary by comparison with the method of the first prior art, and the leveling device for such a leveling process becomes unnecessary.

If the approximately conically tipped bump is formed on the electrode of an electronic component, even when the bump is mounted on the electrode of the circuit board while being shifted, the bump can partially come in contact with the electrode of the board without fail so long as the shift is not greater than half the outside diameter of the bump since the bump has the approximately conically tipped shape. According to the conventional bump, the so-called base of the bump partially comes in contact with the electrode. However, this contact is mere partial contact, leading to unstable bonding. If this is subjected to a thermal shock test or reflow, the bonded portion becomes open. The present invention can eliminate the above-mentioned unstable bonding and provide the bonding of high production yield and high reliability.

(2) Bonding of IC Chip to Circuit Board

According to the method of the second prior art, the connection resistance has been depended on the number of conductive particles that exist between the bump and the electrode of the circuit board. However, according to the present invention, it is not required to place conductive particles between both the electrodes for the electrical continuity between the electronic component side electrode and the board side electrode, and the bump can be directly connected to the electrode by being pressed against the electrode of the circuit board with a load (for example, a pressure force of not smaller than 20 gf per bump) heavier than in the first and second prior art examples without being leveled in the leveling process as an independent process. Therefore, the connection resistance value does not depend on the number of interposed particles, and the connection resistance value can be stably obtained. That is, the conductive particles produce the additional effect that the value of the connection resistance between the electrode located on the board side and the bump located on the electronic component side can be reduced when the conductive particles are placed between the bump and the board electrode in directly bonding the bump to the board electrode.

Although the conventional leveling process has been performed in order to shape the bump height constant at the time of bonding to the board electrode, the crushing of the bump can be performed concurrently with the bonding to the electrode according to the present invention. Therefore, no independent leveling process is needed, and the bonding can be achieved while correcting the warp and undulation of the circuit board by deforming the same, or the bonding is achieved while correcting the warp and undulation of the circuit board by deforming the same at the time of bonding without the need for the leveling process of the bumps by hardening the conductive paste stuck to the bumps and deforming the conductive paste at the time of bonding. Accordingly, this arrangement tolerates the warp and undulation.

There are needed a high-accuracy board and the uniform leveling of the bumps, as exemplified by 10 µm per IC chip (meaning that a thickness warp dimension accuracy of 10 µm per IC chip is needed) in the first prior art, 2 µm per IC chip in the second prior art, and 1 µm per IC chip in the third prior art (bump height variation of not greater than ±1 µm). In practice, a glass board represented by LCD is employed. In contrast to this, according to the present invention, the bonding is achieved while correcting the warp and undulation of the circuit board by deforming the same at the time of bonding. Therefore, a board of a degraded surface flatness including warp and undulation, exemplified by a resin board, a flexible board, a multilayer ceramic board, or the like, can be employed, and a less expensive versatile IC chip bonding method can be provided.

If the volume of the insulating resin located between the electronic component and the circuit board is set greater than the volume of the space between the electronic component and the circuit board, then the resin flows out of this space, producing the encapsulating effect. Therefore, it is not required to lay an encapsulation resin (underfill coat) under the IC chip after the bonding of the IC chip to the circuit board with the conductive adhesive, which has been needed in the first prior art, and the process can be shortened.

By mixing the inorganic filler with the insulating resin by about 5 to 90 wt % of the insulating resin, the elastic modulus and the coefficient of thermal expansion of the insulating resin can be controlled to be optimum for the board. In addition to this, if this is utilized for the ordinary plating bump, then the inorganic filler enters the space between the bump and the circuit board, degrading the bonding reliability. However, if the stud bump (forming method utilizing wire bonding) is employed as in the present invention, then the inorganic filler and also the insulating resin are forced outwardly of the bumps by the pointed bumps that enter the insulating resin at the beginning of the bonding. By this operation, the inorganic filler and the insulating resin are forced outwardly of the space between the bumps and the electrodes in the process of the deformation of the pointed bumps, and the unnecessary interposed object can be eliminated, allowing the reliability to be further improved.

When the inorganic filler of the same weight is mixed, by employing larger inorganic filler that has a mean particle diameter of not smaller than 3 µm, employing an inorganic filler that has a plurality of different mean particle diameters, employing inorganic fillers in which the mean particle diameter of one inorganic filler is two times or more different from the mean particle diameter of the other inorganic filler, or employing at least two types of inorganic fillers in which one inorganic filler has a mean particle diameter exceeding 3 µm and the other inorganic filler has a mean particle diameter of not greater than 3 µm, the amount of moisture absorption to the periphery of the inorganic filler can be reduced to allow the moisture resistance to be improved and allow the amount of the inorganic filler to be increased, facilitating the film formation (solidification). Furthermore, the coefficient of linear expansion of the anisotropic conductive layer of, for example, the anisotropic conductive film sheet or the anisotropic conductive film forming adhesive can be reduced, allowing the operating life to be increased, for the improvement in reliability.

Furthermore, if the one inorganic filler of the larger mean particle diameter is made of a material identical to the aforementioned insulating resin, then the stress alleviating effect can be produced. If the inorganic filler of the larger mean particle diameter is made softer than the epoxy resin that serves as the insulating resin and the one inorganic filler is compressed, then the stress alleviating effect can also be produced.

Moreover, if the inorganic filler is not existing or reduced in amount in the bonding interface between the electronic component or the board and the anisotropic conductive layer, the innate adhesion of the insulating resin is effected. This increases the insulating resin of high adhesion in the bonding interface, allowing the adhesion strength of the electronic component or the board and the insulating resin to be improved and improving the adhesion of the insulating resin to the electronic component or the board with the effect of reducing the coefficient of linear expansion by the inorganic filler kept intact. With this arrangement, the operating life is improved during a variety of reliability tests, and the peel strength to bending is improved.

Furthermore, by employing an insulating resin, which improves the adhesion to the film material used on the surface of the electronic component in the portion or layer brought in contact with the electronic component and employing the insulating resin, which improves the adhesion to the material of the board surface, in the portion or layer brought in contact with the board, the adhesion can further be improved.

As described above, according to the present invention, there can be provided the method and apparatus for bonding electronic components to boards with high productivity and high reliability without needing the resin encapsulating process to pour resin between the electronic component and the board and the bump leveling process for regulating the bump height constant after the bonding of the electronic component to the circuit board.

Sixteenth Embodiment

A method and apparatus for mounting an electronic component of, for example, an IC chip on a circuit board and an electronic component unit or module of, for example, a semiconductor device in which the IC chip is mounted on the board by the mounting method, according to a sixteenth embodiment of the present invention will be described below with reference to FIG. 38A through FIG. 51.

Figure 39A:
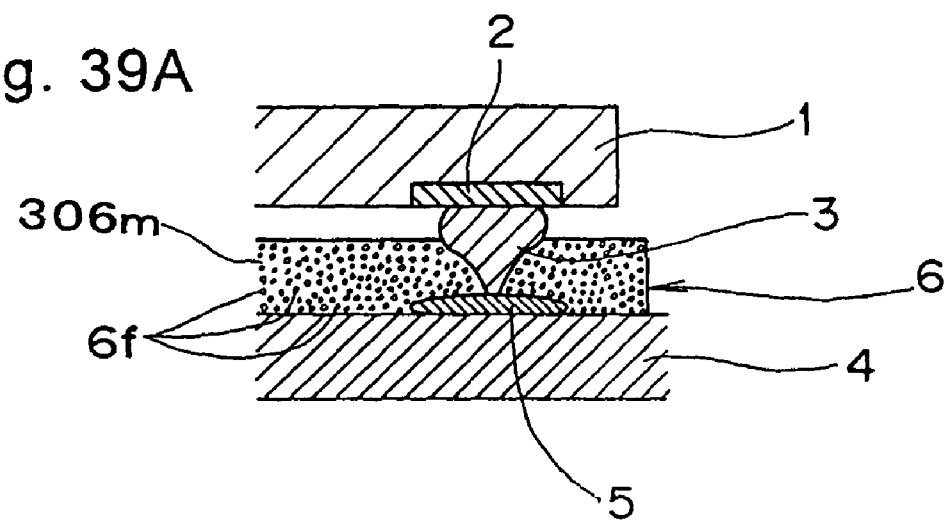
FIG. 39A and FIG. 39B are explanatory views showing a state in which an inorganic filler in a thermosetting resin is forced outwardly of a bump due to a pointed bump that enters the thermosetting resin at the beginning of bonding by a method for mounting an electronic component of, for example, an IC chip on a circuit board according to a sixteenth embodiment.
Figure 39B:
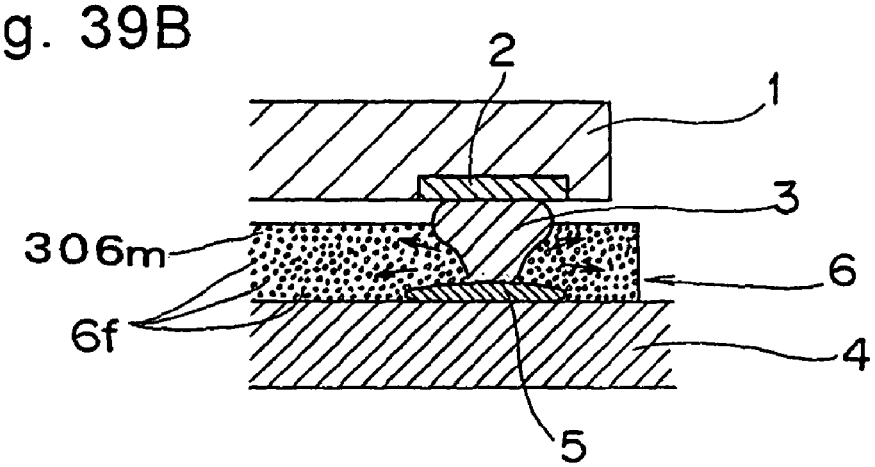
Figure 39C:
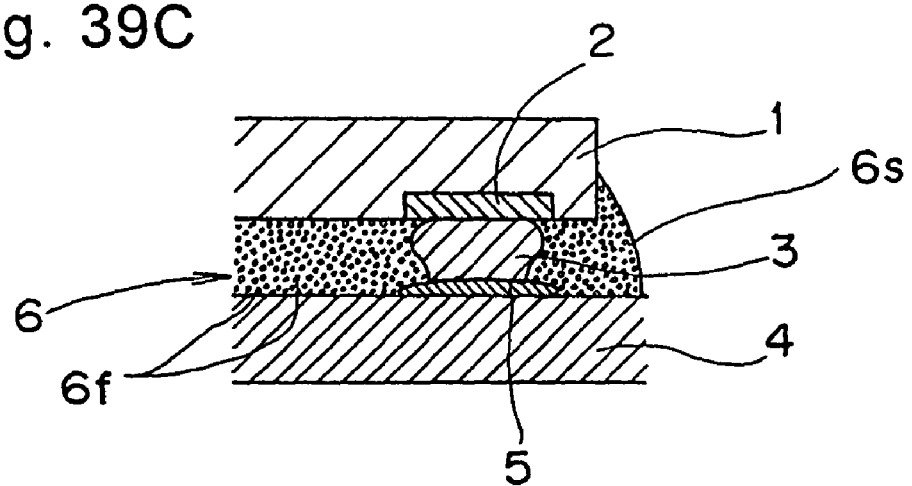
FIG. 39C is an explanatory view of a state in which no inorganic filler enters a space between the bump and the board electrode.
Figure 40A:
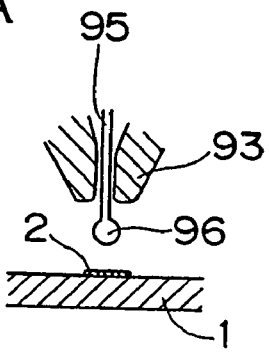
FIG. 40A, FIG. 40B, FIG. 40C, FIG. 40D, FIG. 40E, FIG. 40F and FIG. 40G are explanatory views showing a bump forming process by means of a wire bonder for an IC chip by the mounting method of the sixteenth embodiment of the present invention.
Figure 40B:
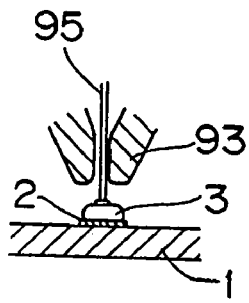
Figure 40C:
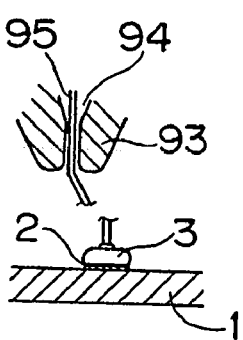
Figure 40D:
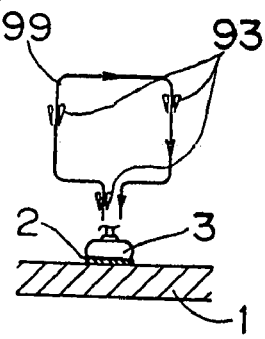
Figure 40E:
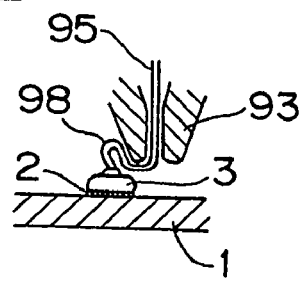
Figure 40G:
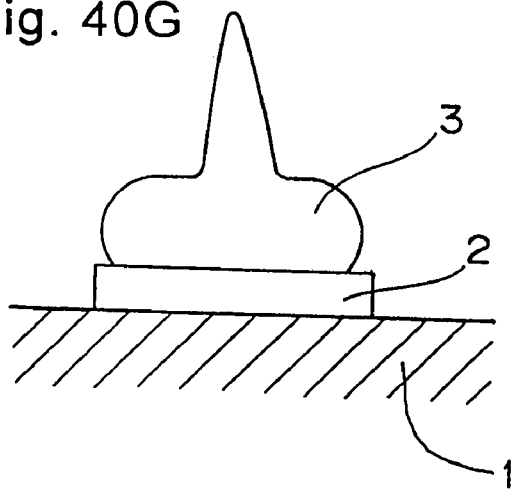
Figure 40F:
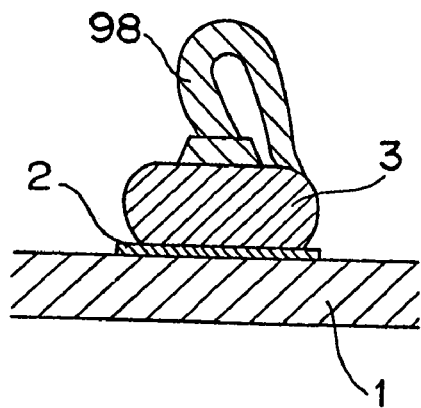

The method for mounting an IC chip on a circuit board according to the sixteenth embodiment of the present invention will be described first with reference to FIG. 38A through FIG. 41C. Bumps (protruding electrodes) 3 are formed on Al pad electrodes 2 of an IC chip 1 that serves as one example of the electronic component of FIG. 38A by a wire bonding device through the operation shown in FIG. 40A through FIG. 40F. That is, a ball 96 is formed at the lower end of a wire 95 protruding from a capillary 93 that serves as a holder in FIG. 40A, and the capillary 93 that is holding the wire 95 is lowered in FIG. 40B so as to bond the ball 96 to the electrode 2 of the chip 1, roughly forming the shape of the bump 3. By making the capillary 93 start to move up while downwardly feeding the wire 95 in FIG. 40C, moving the capillary 93 in an approximately rectangle-shaped loop 99 as shown in FIG. 40D to form a curved portion 98 on the upper portion of the bump 3 as shown in FIG. 40E and tear off the wire, the bump 3 as shown in FIG. 40F is formed. Otherwise, by clamping the wire 95 by the capillary 93 and pulling the capillary 93 upward in FIG. 40B, the metal wire of, for example, a gold wire (gold line) 95 (note that the examples of the metal wire include those made of zinc, aluminum, copper, or an alloy obtained by incorporating a trace element into these metals, and the gold wire (gold line) will hereinafter be referred to as a representative example in the following embodiments) may be torn off so as to form a bump 3 of a shape as shown in FIG. 40G. A state in which the bump 3 is thus formed on each electrode 2 of the chip 1 is shown in FIG. 38B.

Next, as shown in FIG. 38D, an insulating resin sheet that serves as an example of a solid or semi-solid insulating resin layer of, for example, a thermosetting resin sheet 6, which is cut into a size slightly larger than the size of the chip 1 and mixed with an inorganic filler 6f, is arranged on the electrodes 5 of the circuit board 4 shown in FIG. 38C, and the thermosetting resin sheet 6 is stuck to the electrode 5 of the board 4 placed on a stage 109 with a pressure force of, for example, about 5 to 10 kgf/cm² by means of a sticking tool 7 heated to, for example, 80 to 120° C. Subsequently, by peeling off a separator 6a removably arranged on the tool 7 side of the solid or semi-solid thermosetting resin sheet 6 mixed with the inorganic filler 6f, a preparation process of the board 4 is completed. This separator 6a is to prevent the solid or semi-solid thermosetting resin sheet 6 mixed with the inorganic filler 6f from adhering to the tool 7. In this case, as shown in FIG. 38G that is an enlarged view of a portion G of FIG. 38F, the thermosetting resin sheet 6 is preferably provided by mixing an insulating resin 306m with an inorganic filler 6f of ceramics of spherical or pulverized silica, alumina, or the like in dispersion, flattening this by the doctor blade method or the like and vaporizing the solvent component for solidification and preferably have a heat resistance to the extent of tolerating a high temperature in the subsequent reflow process (for example, a heat resistance capable of tolerating a temperature of 240° C. for ten seconds). The insulating resin can be provided by, for example, an insulative thermosetting resin (for example, epoxy resin, phenol resin, and polyimide) or an insulative thermoplastic resin (for example, polyphenylene sulfide (PPS), polycarbonate, and modified polyphenylene oxide (PPO)), a mixture of an insulative thermosetting resin with an insulative thermoplastic resin, or the like. In this case, description will be continued with the insulative thermosetting resin taken as a representative example. This thermosetting resin 306m generally has a glass transition point of about 120 to 200° C. When a thermoplastic resin is only employed, the resin is once softened by heating at the beginning and then hardened by being naturally cooled with the heating stopped. When a mixture of an insulative thermosetting resin with an insulative thermoplastic resin is employed, the resin is hardened by being heated similarly to the case of only the thermosetting resin is employed because the thermosetting resin functions predominantly.

Figure 55:
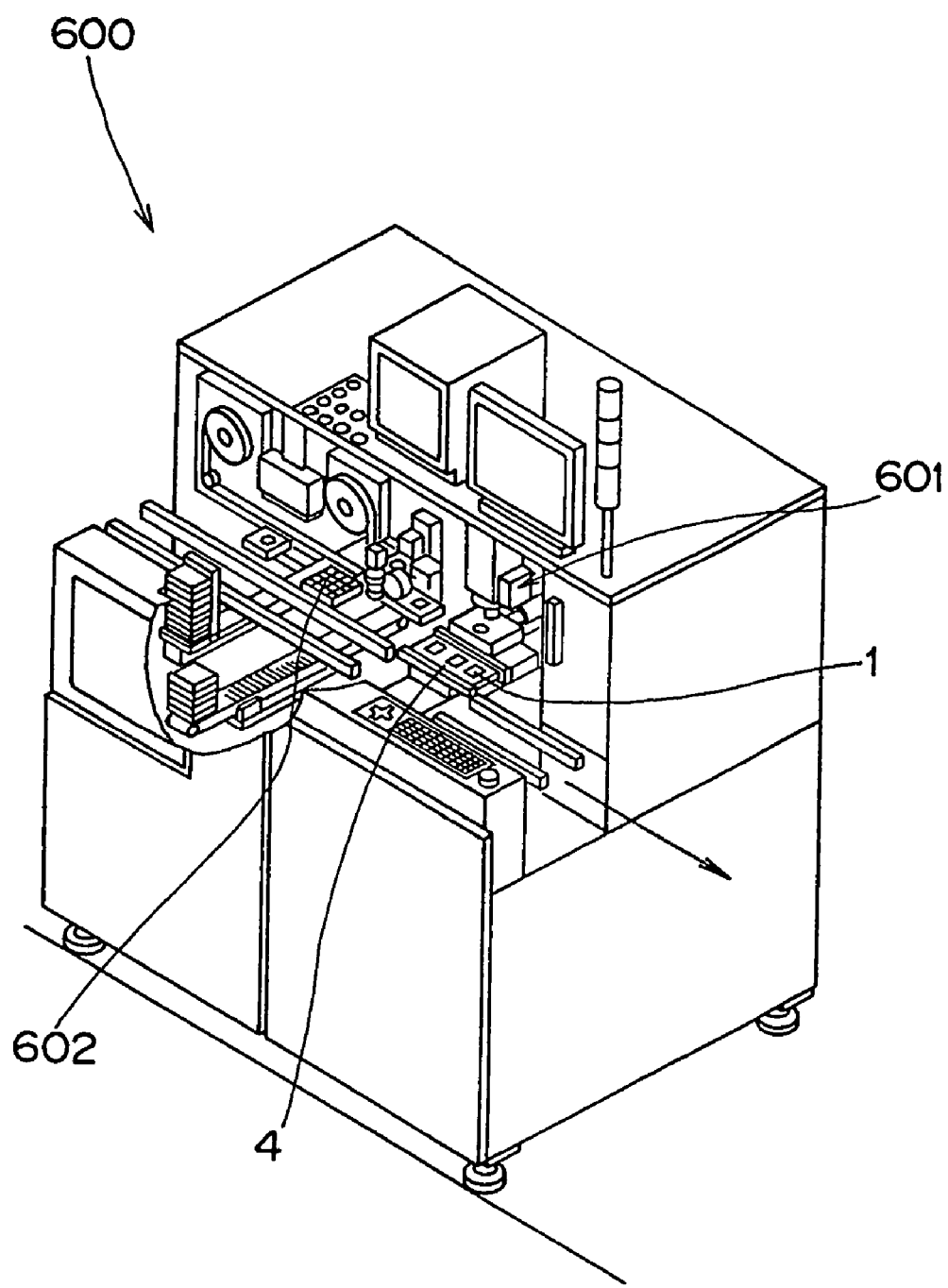
FIG. 55 is a perspective view of an electronic component mounting apparatus used in the sixteenth embodiment.
Figure 56A:
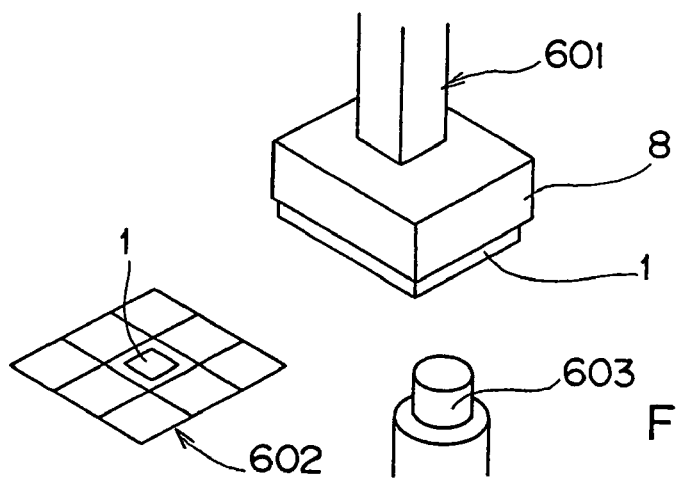
FIG. 56A, FIG. 56B, FIG. 56C and FIG. 56D are a perspective view showing a position recognizing operation on the component side of the electronic component mounting apparatus of FIG. 55, a view of a position recognition image of the component, a perspective view showing a position recognizing operation on the board side, and a view of a position recognition image of the board, respectively.
Figure 56B:
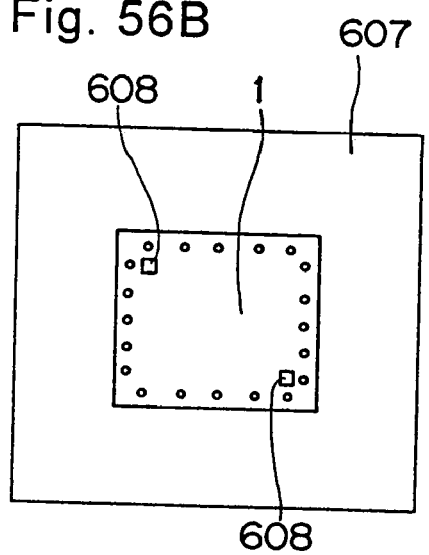
Figure 56C:
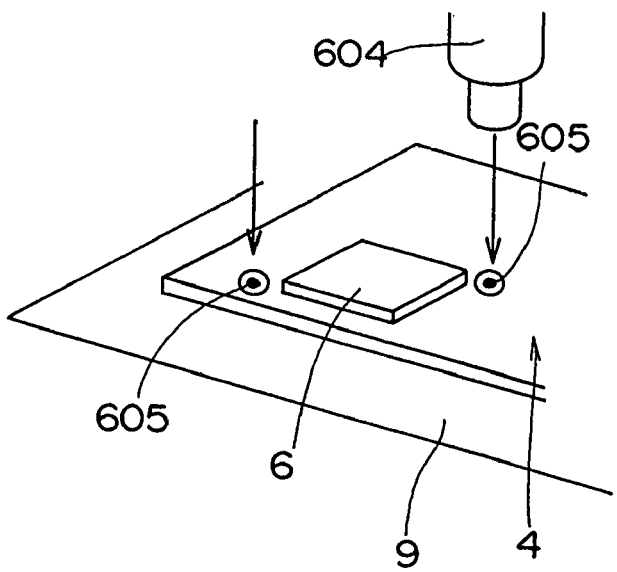
Figure 56D:
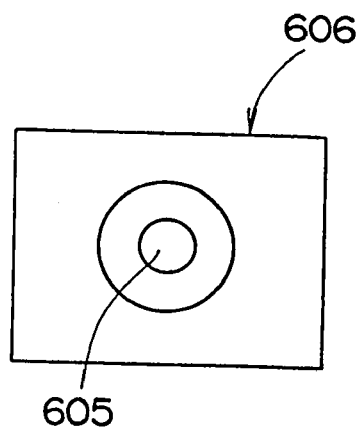

Next, as shown in FIG. 38E and FIG. 38F, in an electronic component mounting apparatus 600 shown in FIG. 55, the chip 1 in which the bumps 3 are formed on the electrodes 2 through the aforementioned process is sucked and held from a tray 602 by a heated bonding tool 8 located at the tip of a component holding member 601, and the IC chip 1 is pressed against the board 4 by the heated bonding tool 8 after being aligned in position with the electrodes 5 of the board 4 corresponding to the electrodes 2 of the IC chip 1, the board 4 having been prepared through the aforementioned preceding process and mounted on a stage 9. This positional alignment is performed by a well-known position recognizing operation. For example, as shown in FIG. 56C, a positional recognition mark(s) 605 or a lead(s) or a land pattern(s) formed on the board 4 is recognized by a board recognizing camera 604 of the electronic component mounting apparatus 600. As shown in FIG. 56D, the position of the board 4 is recognized by recognizing the XY coordinate position in the orthogonal XY directions on the stage 9 of the board 4 and the rotational position relative to the origin of the XY coordinate system on the basis of an image 606 obtained by the camera 604. On the other hand, a mark 608 or a circuit pattern for recognizing the position of the IC chip 1 sucked and held by the bonding tool 8 is recognized by an IC chip position recognizing camera 603 as shown in FIG. 56A, and the position of the IC chip 1 is recognized by recognizing the XY coordinate position in the orthogonal XY directions of the IC chip 1 and the rotational position relative to the origin of the XY coordinate system on the basis of an image 607 obtained by the camera 603 as shown in FIG. 56B. Then, the bonding tool 8 or the stage 9 is moved on the basis of the position recognition results of the board 4 and the IC chip 1 to perform positional alignment so that the electrodes 2 of the IC chip 1 are positioned on the corresponding electrodes 5 of the board 4, and thereafter, the IC chip 1 is pressed against the board 4 by the heated bonding tool 8.

Figure 41A:
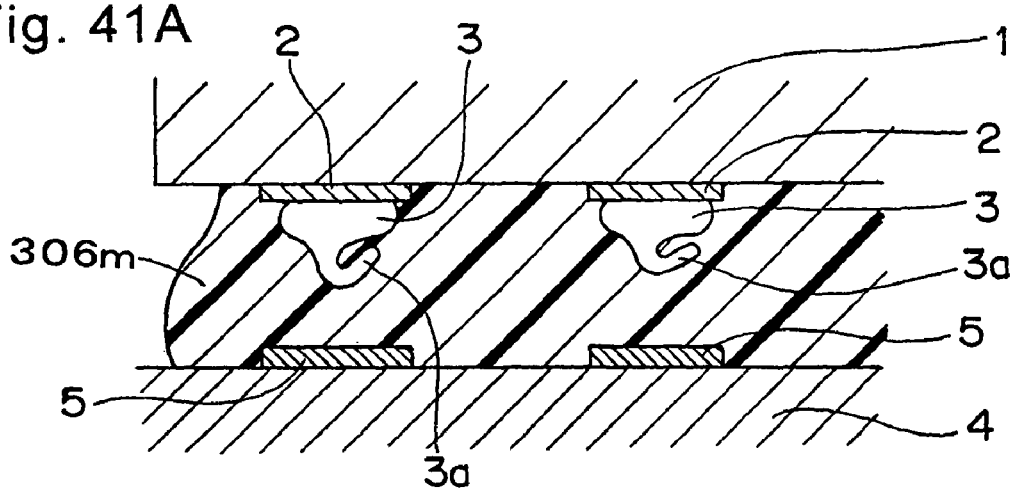
FIG. 41A, FIG. 41B and FIG. 41C are explanatory views showing a process for bonding an IC chip to a circuit board by the mounting method of the sixteenth embodiment of the present invention.
Figure 41B:
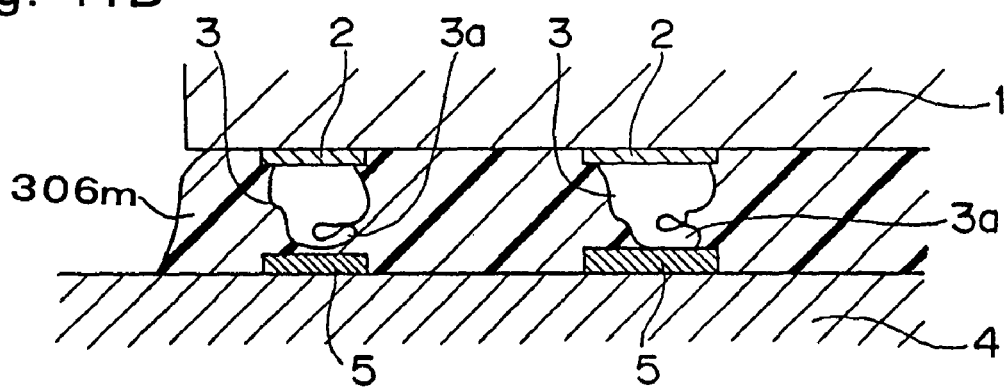

At this time, the bump 3 is pressed against the electrode 5 of the board 4 in a manner that a head portion 3a of the bump 3 is deformed as shown in FIG. 41A and FIG. 41B. At this time, as shown in FIG. 39A and FIG. 39B, the inorganic filler 6f in the thermosetting resin 306m is forced outwardly of the bump 3 by the pointed bump 3 that enters the thermosetting resin 306m at the beginning of the bonding. Moreover, as shown in FIG. 39C, there is produced the effect of reducing the connection resistance value by the arrangement that the inorganic filler 6f does not enter the space between the bump 3 and the board electrode 5 due to this outward extruding action. At this time, even if a certain amount of inorganic filler 6f enters the space between the bump 3 and the board electrode 5, there is no problem by virtue of the arrangement that the bump 3 is brought in direct contact with the board electrode 5.

Figure 41C:
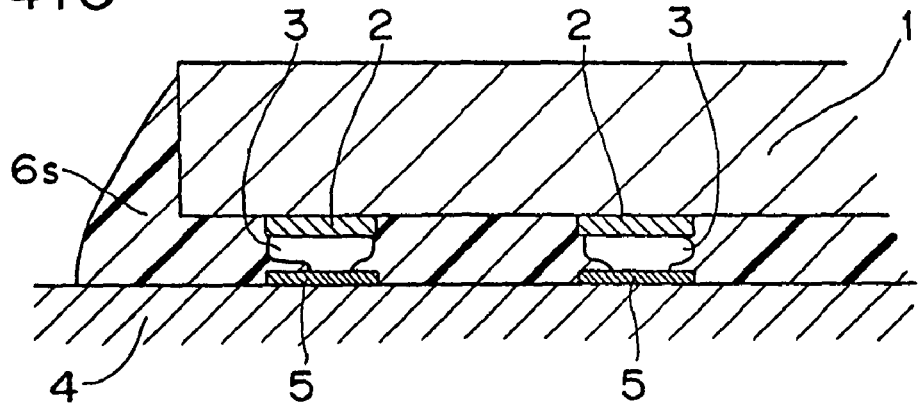
Figure 52:
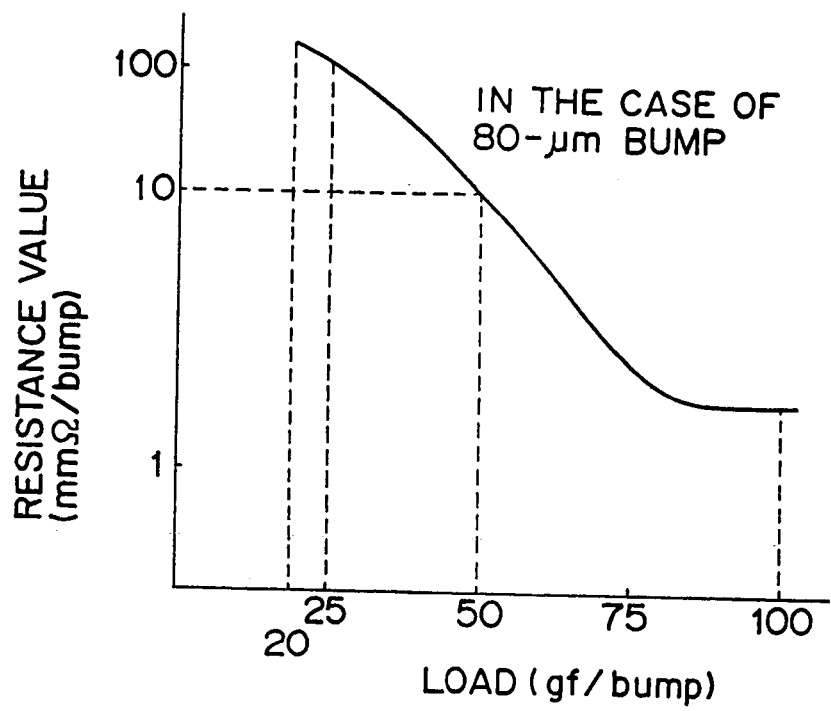
FIG. 52 is a graph of a relation between a resistance value and a load in the case of a bump that has an outside diameter of 80 μm in the sixteenth embodiment.
Figure 53:
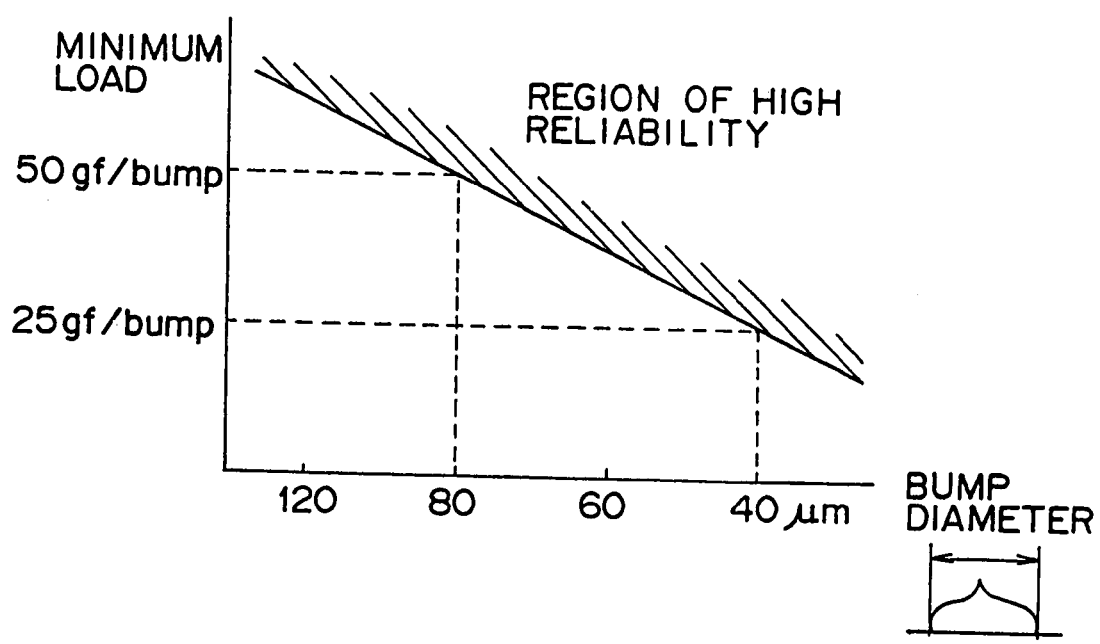
FIG. 53 is a graph showing a region of high reliability based on a relation between bumps that have outside diameters of 80 μm and 40 μm and a minimum load in the sixteenth embodiment.

At this time, a load to be applied via the IC chip 1 to the bump 3 side differs depending on the outside diameter of the bump 3. The head portion 3a that belongs to the bump 3 and is bent and folded is required to receive a load to the extent that the head portion is deformed without fail as shown in FIG. 41C. This load is required to be 20 (gf per bump) at the minimum. That is, the resistance value becomes excessively increased to a resistance value of 100 mmΩ/bump or higher when the load is smaller than 20 (gf per bump) according to the graph of a relation between the resistance value and the load in the case of the bump of an outside diameter of 80 μm to cause a practical problem, and therefore, a load of not smaller than 20 (gf per bump) is preferable, as shown in FIG. 52. FIG. 53 is a graph showing a region of high reliability based on a relation between bumps of outside diameters of 80 μm and 40 μm and minimum loads. According to this graph, it is presumed that the bump of an outside diameter of not smaller than 40 μm is preferably loaded with a minimum load of not smaller than 25 (gf per bump) and the reliability is high when the minimum load is not smaller than about 20 (gf per bump) in the case of the bump of an outside diameter smaller than 40 μm. It is also presumed that, when the bump outside diameter is reduced to less than 40 μm with a reduction in lead pitch in the future, the load tends to reduce in proportion to the second power of the projected area of the bump depending on the projected area of the bump. Therefore, it is preferable that the minimum load applied to the bump 3 side via the IC chip 1 needs to be preferably 20 (gf per bump) at the minimum. The upper limit of the load applied to the bump 3 side via the IC chip 1 is set to the extent that none of the IC chip 1, the bump 3, the circuit board 4, and so on is damaged. According to circumstances, a maximum load may sometimes exceed 150 (gf per bump). It is to be noted that the reference numeral 6s in the figure denotes a resin resulting from the thermosetting resin 306m that has been melted by the heat of the bonding tool 8 and thereafter thermally hardened out of the thermosetting resin sheet 6.

Figure 42A:
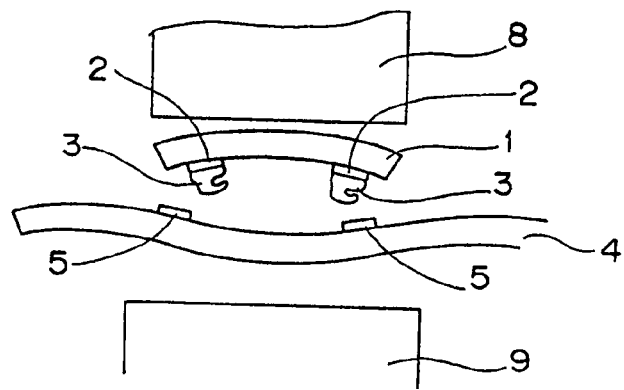
FIG. 42A, FIG. 42B and FIG. 42C are explanatory views showing a process for bonding an IC chip to a circuit board by the mounting method of the sixteenth embodiment of the present invention.
Figure 42B:
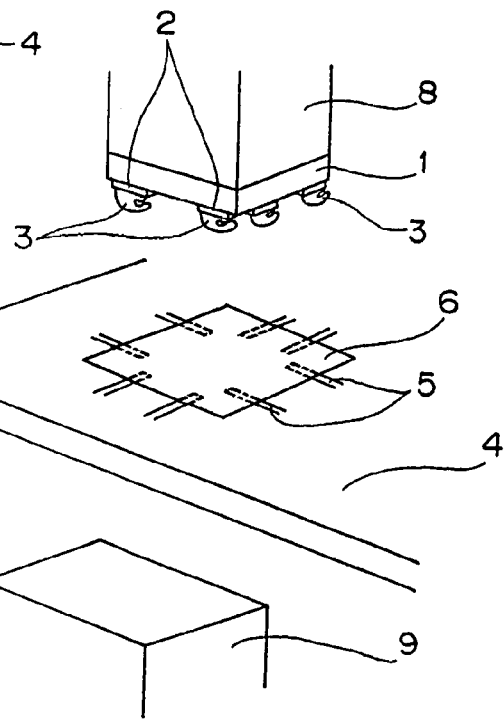
Figure 42C:
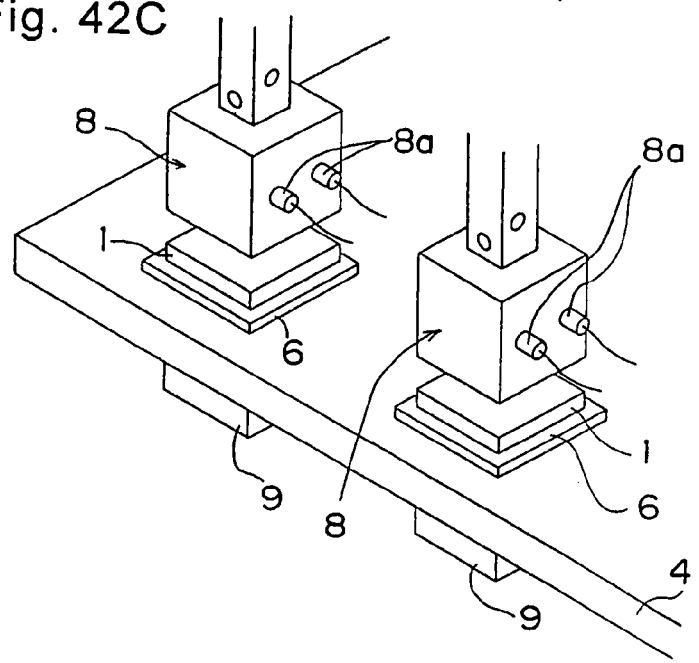

It is also acceptable to perform the process of aligning in position the IC chip 1 on the electrodes 2 of which the bumps 3 have been formed through the aforementioned preceding process by the bonding tool 8 heated by a built-in heater 8a such as a ceramic heater or a pulse heater with the electrodes 5 of the board 4 prepared through the aforementioned preceding process so that the electrodes 5 of the board 4 correspond to the electrodes 2 of the IC chip 1 as shown in FIG. 38E and the process of performing pressure bonding as shown in FIG. 38F after the positional alignment, by means of one positional alignment and pressure bonding apparatus of, for example, the position aligning and pressure bonding apparatus of FIG. 38E. However, it is also acceptable to perform the positional alignment process and the pressure bonding process by separate units of, for example, the positional alignment device of FIG. 42B and the bonding device of FIG. 42C, respectively, in order to improve the productivity by concurrently performing the positional alignment work and the pressure bonding work when continuously manufacturing, for example, a lot of boards. FIG. 42C shows two bonding devices 8 provided for the purpose of improving the productivity, by which two portions of one circuit board 4 can be concurrently subjected to pressure bonding.

The circuit board 4 is provided by a multilayer ceramic board, FPC, a glass fabric laminate epoxy board (glass epoxy board), a glass fabric laminate polyimide resin board, an aramid unwoven fabric epoxy board (for example, a resin multilayer board sold with a registered trademark of "ALIVH" produced by Matsushita Electric Industrial Co., Ltd.), or the like. These boards 4 do not always have a complete plane since warps and undulations are generated due to thermal history, cutting and processing. Accordingly, as shown in FIG. 42A and FIG. 42B, by locally applying heat and load to the circuit board 4 via the IC chip 1 from the bonding tool 8 side toward the stage 9 side by means of the bonding tool 8 and the stage 9 each of which the parallelism is controlled so that the parallelism is adjusted to, for example, about 10 μm or less, the warp of the circuit board 4 in the applied portion is corrected. The IC chip 1 is warped concave about the center of the active surface. By pressurizing the IC chip with a heavy load of not smaller than 20 gf per bump at the time of bonding, the warps and undulations of both the board 4 and the IC chip 1 can be corrected. The warp of the IC chip 1 is generated by an internal stress caused when a thin film is formed on Si in forming the IC chip 1. The quantity of deformation of the bump is about 10 to 25 μm, which becomes tolerated by each bump 3, which adapts itself with the deformation of the bump 3 to the influence of the undulation that appears on the surface from the inner layer copper foil originally owned by the board of this grade.

Thus, a heat of, for example, 140 to 230° C. is applied to the thermosetting resin sheet 6 located between the IC chip 1 and the circuit board 4 for, for example, about several seconds to 20 seconds in a state in which the warp of the circuit board 4 is corrected, and this thermosetting resin sheet 6 is hardened. At this time, the thermosetting resin 306m, which constitutes the thermosetting resin sheet 6, flows first and encapsulates the IC chip 1 up to the edge of IC chip. Moreover, the resin, which is naturally softened at the beginning when heated, generates a fluidity of a flow to the edge as described above. By making the volume of the thermosetting resin 306m greater than the volume of the space between the IC chip 1 and the circuit board 4, the resin flows and leaks out of this space, allowing the encapsulation effect to be produced. Subsequently, the heated bonding tool 8 is moved up, by which the heating source disappears to rapidly reduce the temperature of the IC chip 1 and the thermosetting resin sheet 6. The thermosetting resin sheet 6 looses its fluidity, and as shown in FIG. 38F and FIG. 41C, the IC chip 1 is fixed onto the circuit board 4 with the hardened thermosetting resin 6s. Moreover, if the circuit board 4 side is heated by a heater 9a of the stage 9 or the like, the temperature of the bonding tool 8 can further be reduced.

Seventeenth Embodiment

A method and apparatus for mounting an electronic component of, for example, an IC chip on a circuit board and an electronic component unit or module of, for example, a semiconductor device in which the IC chip is mounted on the board by the mounting method, according to a seventeenth embodiment of the present invention will be described next.

This seventeenth embodiment is made more preferable than the sixteenth embodiment by setting the ratio of mixture of the inorganic filler 6f to be mixed with the thermosetting resin sheet 6 to 5 to 90 wt % of the insulative thermosetting resin of, for example, the insulative thermosetting epoxy resin 306m. When the ratio is lower than 5 wt %, the mixture of the inorganic filler 6f is meaningless. When the ratio exceeds 90 wt %, the adhesive strength is extremely reduced, and it is difficult to form a sheet, leading to a disadvantage. As an example, from the point of view of maintaining high reliability, it is preferable to set the ratio to 20 to 40 wt % in the case of a resin board and to 40 to 70 wt % in the case of a ceramic board. In the case of a glass epoxy board, the coefficient of linear expansion of the sheet encapsulant can be considerably reduced at a ratio of about 20 wt %, producing an effect on the resin board. The ratio is set about half the percentage by weight in terms of volume percentage or in the proportions of 1 part epoxy resin to 2 parts silica in terms of specific gravity. In the normal case, the ratio of mixture of this inorganic filler 6f is determined by the manufacturing conditions in forming the thermosetting resin 306m into a sheet, by the elastic modulus of the board 4 and finally by the result of a reliability test.

By mixing the inorganic filler 6f at the aforementioned ratio of mixture with the thermosetting resin sheet 6, the elastic modulus of the thermosetting resin 306m of the thermosetting resin sheet 6 can be increased, and the reliability of bonding of the IC chip 1 to the board 4 can be improved by reducing the coefficient of thermal expansion. Moreover, the ratio of mixture of the inorganic filler 6f can be determined so that the material constant of the thermosetting resin 306m, i.e., the elastic modulus and the coefficient of linear expansion are optimized for the material of the board 4. It is to be noted that the coefficient of linear expansion tends to be reduced although the elastic modulus is increased as the ratio of mixture of the inorganic filler 6f is increased.

The sixteenth embodiment and the seventeenth embodiment have the advantage that the employed thermosetting resin sheet 6, which is not liquid but solid, is easy to handle and is able to be formed of polymer since no liquid component exists, allowing the objective one with a high glass transition point to be easily formed.

Figure 51A:
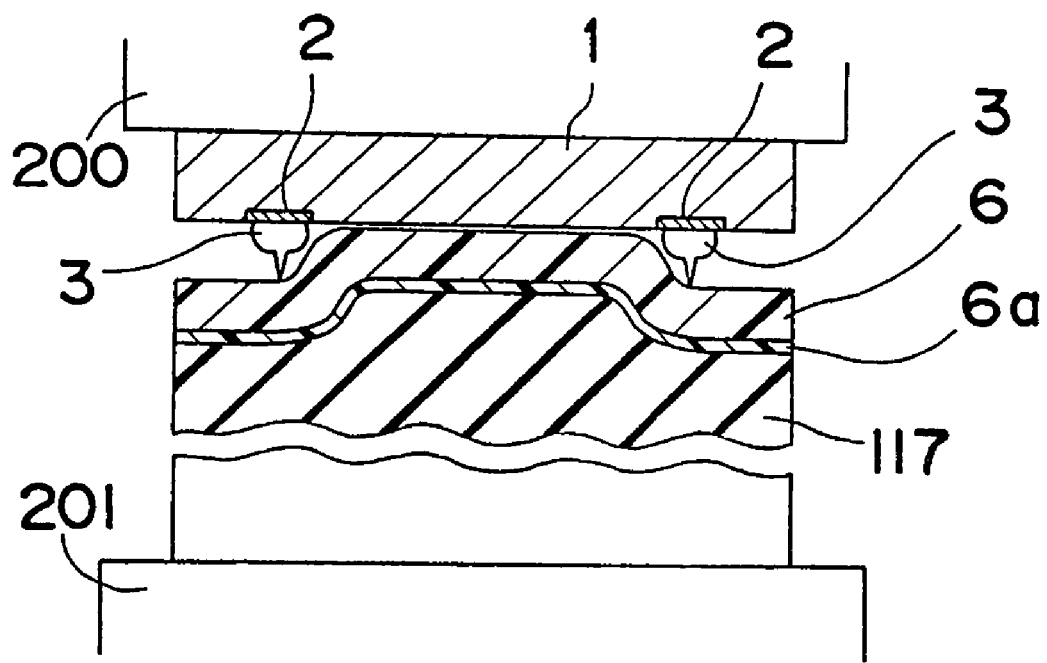
FIG. 51A and FIG. 51B are an explanatory view showing a modification example of the sixteenth embodiment in which a thermosetting resin sheet is formed on the IC chip side and an explanatory view showing a modification example of the sixteenth embodiment in which a thermosetting adhesive is formed on the IC chip side.
Figure 51B:
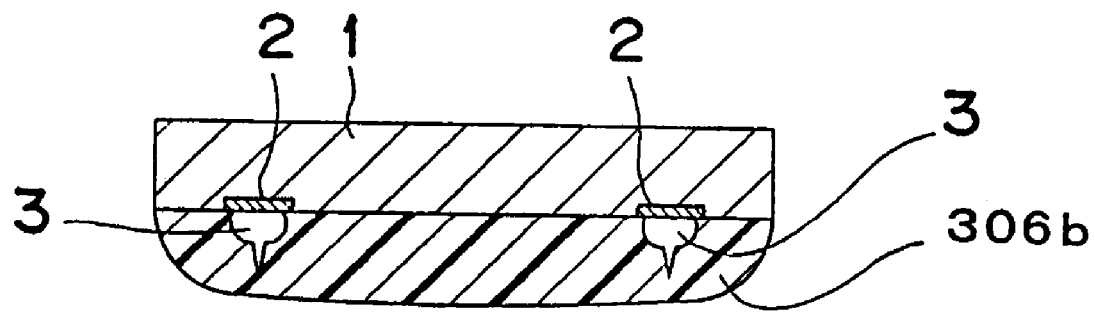

With reference to FIG. 38A through FIG. 38G, FIG. 39A through FIG. 39C and FIG. 43 and FIG. 44 described later, the formation of the thermosetting resin sheet 6 or the thermosetting adhesive 306b that is one example of the insulating resin layer on the circuit board 4 side has been described. However, without being limited to this, the sheet or adhesive may be formed on the IC chip 1 side and thereafter bonded to the board 4 as shown in FIG. 51A or FIG. 51B. In the case of, in particular, the thermosetting resin sheet 6, it is acceptable to stick the thermosetting resin sheet 6 to the IC chip 1 along the configuration of the bumps 3 by pressing the IC chip 1 held by a holding member 200 such as a suction nozzle against an elastic body 117 such as rubber on a stage 201 together with a separator 6a removably arranged on the circuit board side of the thermosetting resin sheet 6.

Eighteenth Embodiment

A method and apparatus for mounting an electronic component of, for example, an IC chip on a circuit board and an electronic component unit or module of, for example, a semiconductor device in which the IC chip is mounted on the board by the mounting method, according to an eighteenth embodiment of the present invention will be described next with reference to FIG. 43A through FIG. 43C and FIG. 44A through FIG. 44F.

Figure 43A:
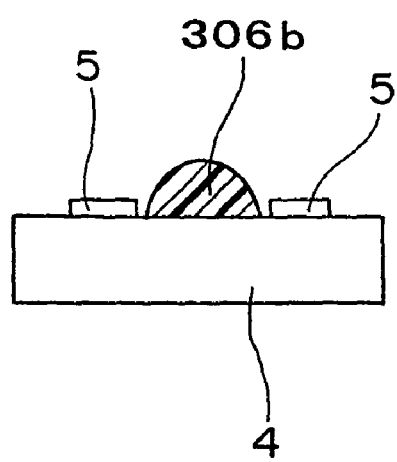
FIG. 43A, FIG. 43B and FIG. 43C are explanatory views for explaining a thermosetting adhesive arranged on a circuit board in place of a thermosetting resin sheet by a mounting method according to an eighteenth embodiment of the present invention.

According to this eighteenth embodiment, instead of sticking the thermosetting resin sheet 6 to the board 4 as in the sixteenth embodiment, a thermosetting adhesive 306b that has a liquid form and serves as one example of the insulating resin layer is applied or printed or transferred onto the circuit board 4 by a dispenser 502 or the like as shown in FIG. 43A and FIGS. 44A and 44D and thereafter solidified into a semi-solid state, or the state of the so-called B stage. Subsequently, the IC chip 1 is mounted on the board 4 similarly to the first or seventeenth embodiment.

Figure 43B:
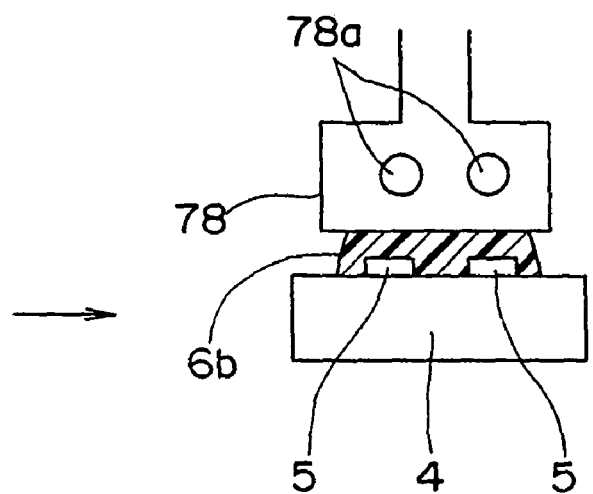
Figure 43C:
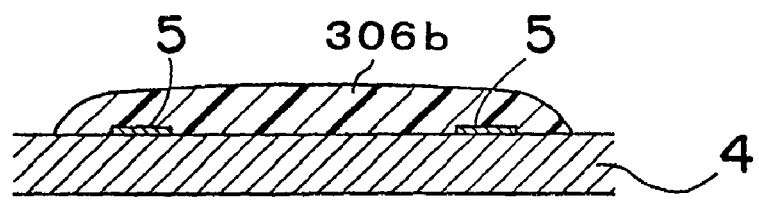

In detail, as shown in FIG. 43A, the thermosetting adhesive 306b in the liquid form is applied or printed or transferred onto the circuit board 4 by the dispenser 502 or the like, which can be moved in two directions orthogonal on the board surface and the discharge rate of which is controlled with an air pressure as shown in FIG. 44A. Next, the adhesive is solidified into a semi-solid state, or the state of the so-called B stage as shown in FIG. 43C through uniforming with heat and pressure applied by a tool 78 that has a built-in heater 78a as shown in FIG. 43B.

Otherwise, in the case where the thermosetting adhesive 306b in the liquid form has a low viscosity, the liquid thermosetting adhesive 306b is applied to a specified position on the board 4 by means of the dispenser 502 as shown in FIG. 44A, and thereafter, the thermosetting adhesive 306b naturally spreads on the board since its viscosity is low and enters into a state as shown in FIG. 44B. Subsequently, by putting the board 4 into a furnace 503 by means of a conveying unit 505 like a conveyer as shown in FIG. 44C and hardening the liquid-form thermosetting adhesive 306b of the applied insulating resin by a heater 504 of the furnace 503, the adhesive is solidified into a semi-solid state, i.e., the state of the so-called B stage.

In the case where the thermosetting adhesive 306b in the liquid form has a high viscosity, the liquid thermosetting adhesive 306b is applied to a specified position on the board 4 by means of the dispenser 502 as shown in FIG. 44D, and thereafter, the thermosetting adhesive 306b is spread flat by a squeegee 506 as shown in FIGS. 44E and 44F since the adhesive does not naturally spread on the board due to the high viscosity of the thermosetting adhesive 306b. Subsequently, by putting the board 4 into the furnace 503 by means of the conveying unit 505 like a conveyer as shown in FIG.

44C and hardening the liquid thermosetting adhesive 306*b* of the applied insulating resin by the heater 504 of the furnace 503, the adhesive is solidified into the semi-solid state, i.e., the state of the so-called B stage.

Figure 54:
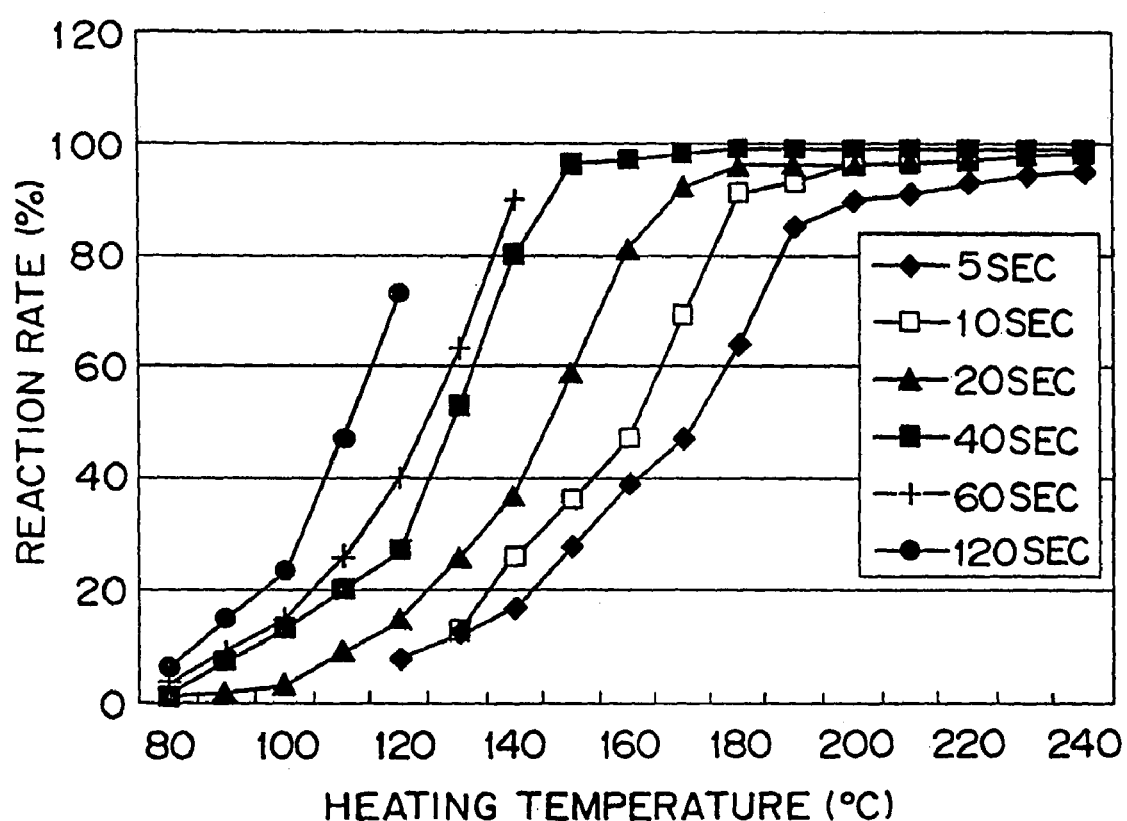
FIG. 54 is a graph of a relation between a heating temperature and a reaction rate of a resin sheet in the eighteenth embodiment.

As described above, although there is a difference depending on the characteristics of the thermosetting resin in the thermosetting adhesive 306*b* when the thermosetting adhesive 306*b* is semi-solidified, pressurization is effected at a temperature of 80 to 130° C., which is 30 to 80% of the glass transition point of the thermosetting resin. The pressurization is normally performed at a temperature of about 30% of the glass transition point of the thermosetting resin. The reason why the temperature is 30 to 80% of the glass-transition point of the thermosetting resin is that a further range for reaction can still sufficiently be left in the subsequent processes within the range of 80 to 130° C. according to the graph of the heating temperature of the resin sheet with respect to the reaction rate of FIG. 54. In other words, the reaction rate of the insulating resin, or for example, the epoxy resin can be restrained to about 10 to 50%, also depending on time, within the temperature range of 80 to 130° C., and therefore, no problem occurs at the time of IC chip pressure bonding in the subsequent processes. That is, the prescribed quantity of pressure can be secured at the time of pressure-bonding the IC chip, and this scarcely incur the problem that the press-cutting cannot be achieved. It is also possible to perform the semi-solidification by vaporizing only the solvent component while restraining the reaction.

When a plurality of IC chips 1 are mounted on the board 4 after the thermosetting adhesive 306*b* is semi-solidified as described above, the productivity is further improved by preliminarily performing the semi-solidifying process of the thermosetting adhesive 306*b* as a pre-arranging process in a plurality of portions which belong to the board 4 and in which the plurality of IC chips 1 are mounted, supplying the thus pre-arranged board 4 and bonding the plurality of IC chips 1 to the plurality of portions of the supplied board 4. In the subsequent processes, even when the thermosetting adhesive 306*b* is used, the process identical to the process employing the thermosetting resin sheet 6 of the aforementioned first or seventeenth embodiment is basically performed. By adding the semi-solidifying process, the liquid thermosetting adhesive 306*b* can be employed similarly to the thermosetting resin sheet 6, and this arrangement has the advantage that the handling is easy because of the solidness and the advantage that an adhesive having a high glass transition point can be easily formed since it can be formed of polymer because of the non-existence of a liquid component. When the thermosetting adhesive 306*b* having fluidity is employed as described above, there is the coexistent advantage that the adhesive can be applied, printed, or transferred in an arbitrary size to arbitrary positions of the board 4 by comparison with the case where the solid thermosetting resin sheet 6 is employed.

Nineteenth Embodiment

Figure 57:
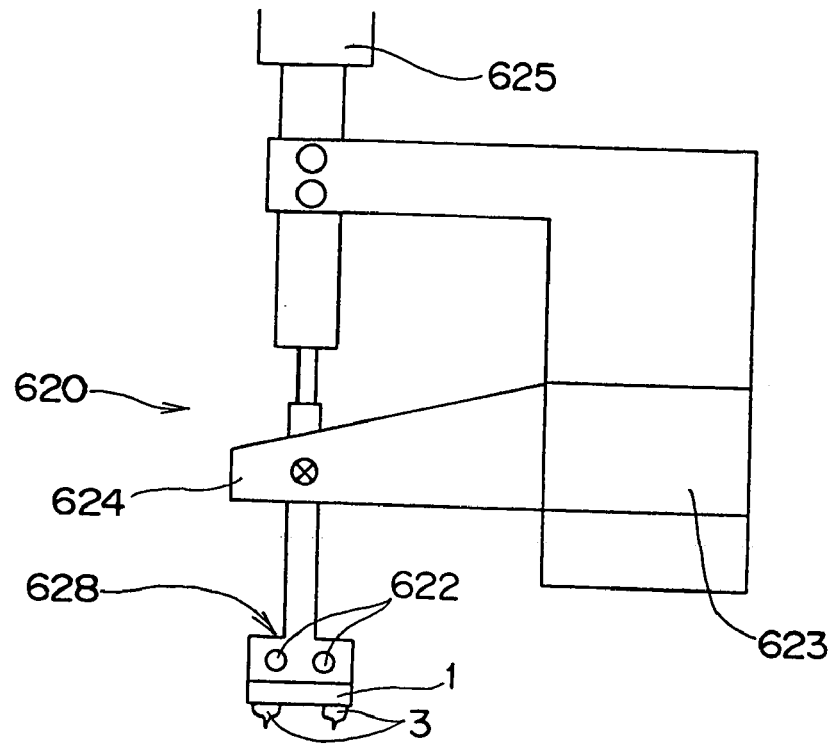
FIG. 57 is a schematic view of a supersonic wave applying device used in the nineteenth embodiment.
Figure 58:
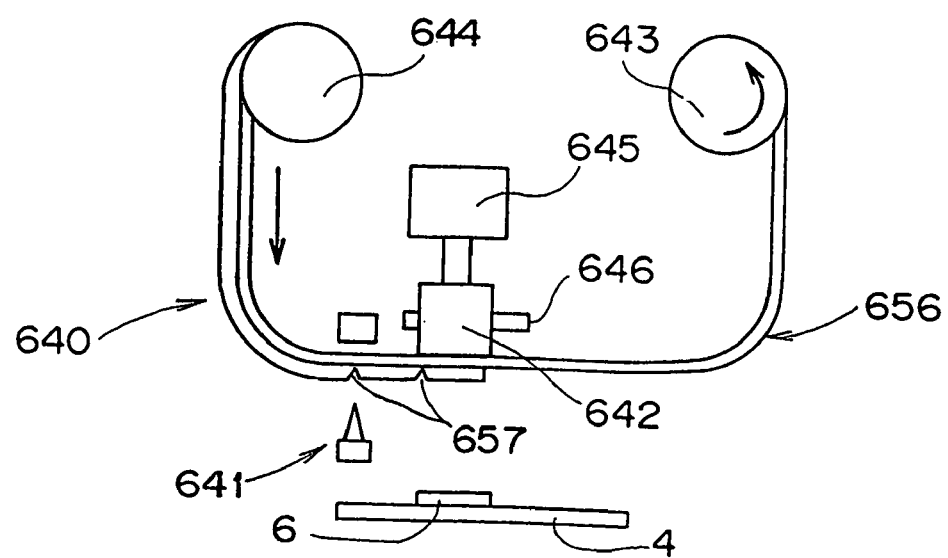
FIG. 58 is a schematic view of a sticking device used in the twentieth embodiment.

A method and apparatus for mounting an electronic component of, for example, an IC chip on a circuit board and an electronic component unit or module of, for example, a semiconductor device in which the IC chip is mounted on the board by the mounting method, according to a nineteenth embodiment of the present invention will be described next with reference to FIG. 57. The nineteenth embodiment differs from the sixteenth embodiment in that the bump tip is shaped so as to prevent the short circuit with adjacent bumps or electrodes due to the collapse of a neck (whisker) portion at the tip of the bump 3 caused by the tearing-off at the time of bump formation by pressurizing the bump 3 with a load of not greater than 20 gf at need without leveling the bump 3 with supersonic waves applied in addition to the load when the IC chip 1 is bonded to the board 4, the IC chip 1 is thereafter mounted on the board 4 while aligning in position the bump 3 with the IC chip 1, and the metal bump 3 is subjected to thermocompression-bonding with supersonic waves to the metal of the electrode surface on the board side. The state in which the IC chip 1 is bonded to the board 4 is similar to those of FIG. 39 and FIG. 43 of the aforementioned embodiments.

According to this nineteenth embodiment, the solid thermosetting resin sheet 6 or the liquid thermosetting adhesive 306*b* semi-solidified as described above, obtained by mixing the insulating thermosetting resin 306*m* with the inorganic filler 6*f* is stuck to the board 4 or the thermosetting adhesive 306*b* that contains the thermosetting resin is applied to the board 4 and semi-solidified. Thereafter, the ball 96 is formed by an electric spark at the tip of the gold wire 95 through the operation as shown in FIG. 40A through FIG. 40F similarly to the wire bonding with respect to the electrode 5 of the board 4 and the electrode 2 of the IC chip 1, and the IC chip 1 is mounted on the board 4 by aligning in position the bump 3, which is formed by thermocompression-bonding this ball 96 to the board electrode 5 with supersonic waves by means of the capillary 93, with the IC chip 1 without leveling the bump 3. In this case, the aforementioned "the liquid thermosetting adhesive 306*b* semi-solidified as described above" is the object obtained by semi-solidifying the thermosetting adhesive 306*b* as described in connection with the eighteenth embodiment, similar to the object put in the B stage. By using this, a material less expensive than the sheet encapsulating material or ACF (Anisotropic Conductive Film) can be utilized. At this time, in a supersonic wave applying device 620 as shown in FIG. 57, the gold bumps 3 are metallically bonded to the gold platings located on the board side while shaping the tips so as to prevent the collapse of neck portions at the tips of the gold bumps 3 by effecting a load of an air cylinder 625 applied from the upper surface of the IC chip 1 sucked and held by the pre-heated bonding tool 628 with a built-in heater 622 and the supersonic waves that are generated by a supersonic wave generating element 623 such as a piezoelectric element and applied via a supersonic wave horn 624. Next, the IC chip 1 is pressed against the circuit board 4 with a pressure force of not smaller than 20 gf per bump while heating the IC chip 1 from the upper surface side of the IC chip 1 and/or from the board side so as to correct the warp of the board 4 and crush the bumps 3, and the thermosetting resin sheet 6 or the thermosetting adhesive 306*b* interposed between the IC chip 1 and the circuit board 4 is hardened by the heat so as to bond the IC chip 1 to the circuit board 4, electrically connecting both the electrodes 2 and 5 together.

The reason why the pressure force of not smaller than 20 gf per bump is needed is that the bonding cannot be achieved since frictional heat scarcely occurs even by the bonding using supersonic waves as described above. Also, when bonding gold to gold together, frictional heat is generated by pressing the bump with a specified constant load and applying supersonic waves to the portion, by which the metals are bonded together. Therefore, even in this case, the specified load sufficient for pressurizing the bump, i.e., the pressure force of not smaller than 20 gf per bump is needed. For example, the pressure force is set to 50 gf or more per bump.

According to the nineteenth embodiment, the metal bump 3 and the metal plating of the board 4 are subjected to metallic diffusion bonding, and this arrangement is therefore appropriate for giving a strength to the bump portion or further reducing the connection resistance value.

Twentieth Embodiment

A method and apparatus for mounting an electronic component of, for example, an IC chip on a circuit board and an electronic component unit or module of, for example, a semiconductor device in which the IC chip is mounted on the board by the mounting method, according to the twentieth embodiment of the present invention will be described next with reference to FIG. 45A through FIG. 45C and FIG. 46A through FIG. 46C. The twentieth embodiment differs from the sixteenth embodiment in that the encapsulation process can be eliminated.

Figure 45A:
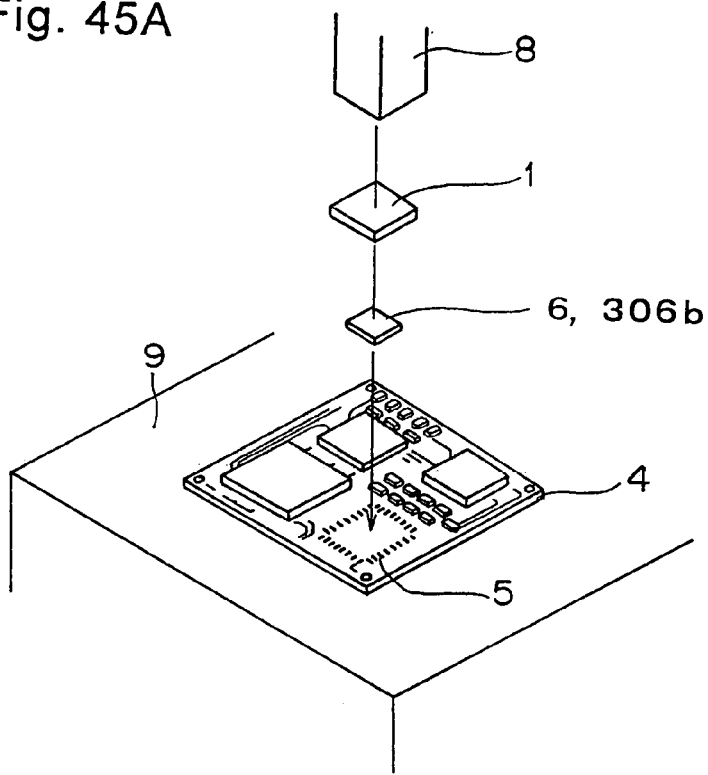
FIG. 45A, FIG. 45B and FIG. 45C are explanatory views showing a process for bonding an IC chip to a circuit board by a mounting method according to a twentieth embodiment of the present invention.
Figure 45B:
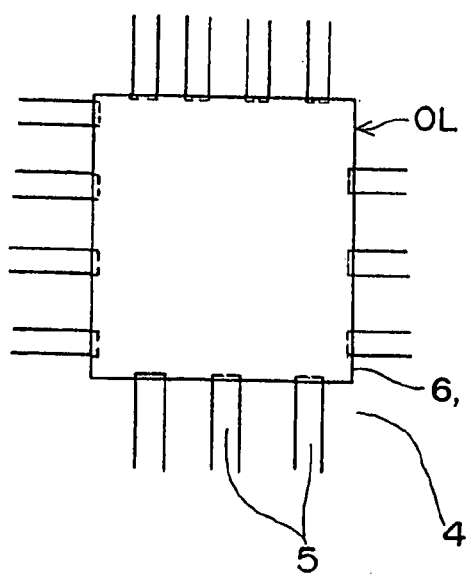
Figure 45C:
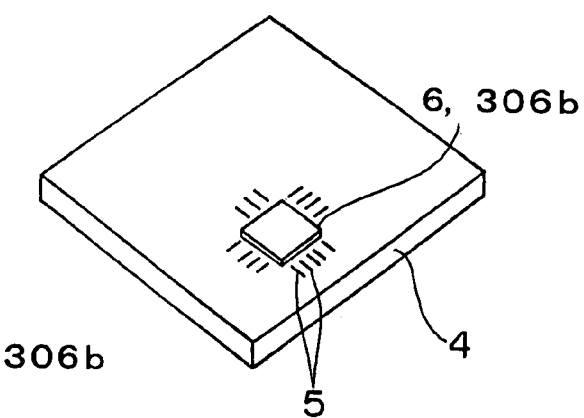
Figure 46A:
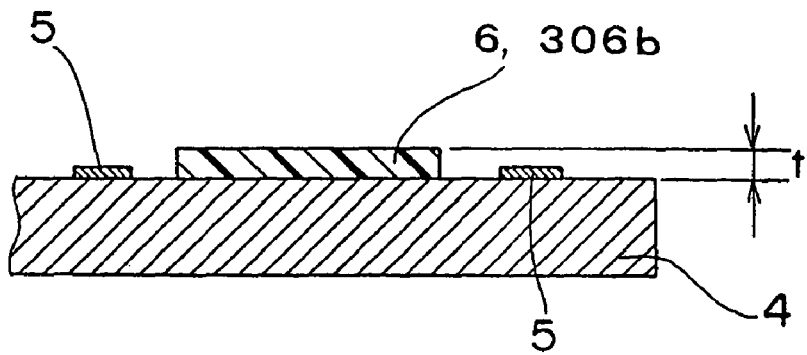
FIG. 46A, FIG. 46B and FIG. 46C are explanatory views showing a process for bonding an IC chip to a circuit board by the mounting method of the twentieth embodiment of the present invention.
Figure 46B:
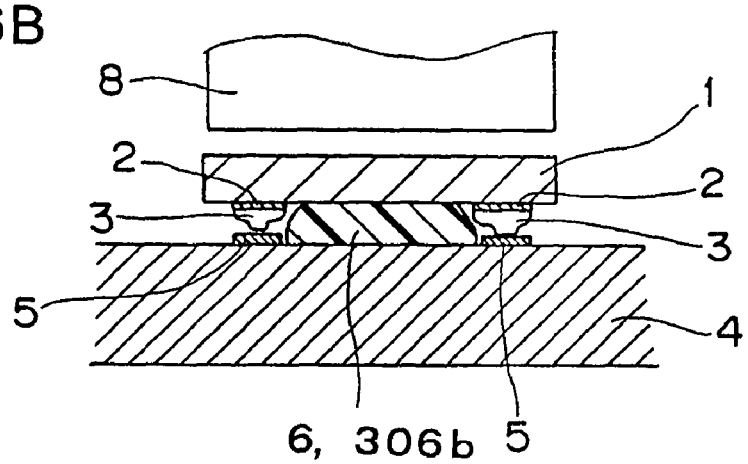
Figure 46C:
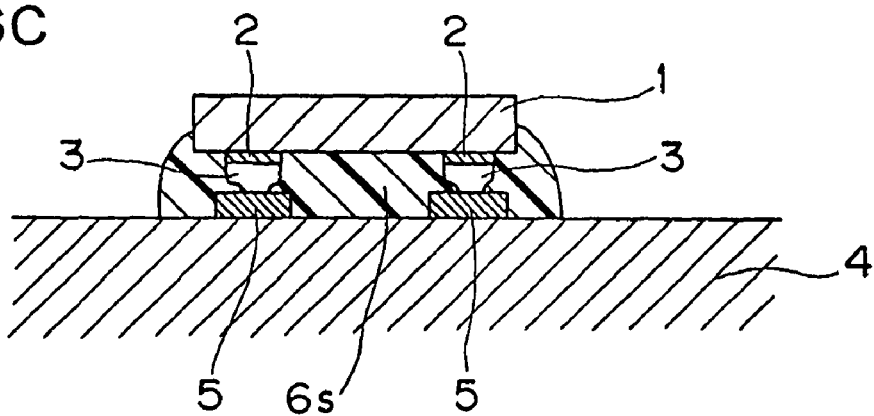

As described above, the protruding electrode (bump) 3 is preparatorily formed on the electrode 2 of the IC chip 1. On the circuit board 4, as shown in FIG. 45B, FIG. 45C, FIG. 46A and FIG. 58, a rectangular sheet-shaped thermosetting resin sheet 6 or a thermosetting adhesive 306*b* that has a configurational dimension smaller than an approximately rectangle-shaped outline dimension OL defined by joining the inner edges of the plurality of electrodes 2 of the IC chip 1 is preparatorily stuck or applied to a center portion of a region defined by joining the electrodes 5 of the circuit board 4. At this time, the thickness of the sheet-shaped thermosetting resin sheet 6 or the thermosetting adhesive 306*b* is set so that its volume becomes slightly greater than a gap between the IC chip 1 and the board 4. By means of the sticking device 640 of FIG. 58, a rectangular sheet-shaped thermosetting resin sheet 656 that is rewound from a rewinding roll 644 and wound around a winding roll 643 is cut along portions preliminarily provided with notches 657 by upper and lower cutter blades 641 into a configurational dimension smaller than the approximately rectangle-shaped outline dimension OL defined by joining the inner edges of the plurality of electrodes 2 of the IC chip 1. The thermosetting resin sheet 6 cut in the rectangular sheet-like shape is sucked and held by a sticking head 642 pre-heated by a built-in heater 646 and stuck to the center portion of the region defined by joining the electrodes 5 of the circuit board 4. Next, the bumps 3 and the electrodes 5 of the circuit board 4 are aligned in position and, as shown in FIG. 45A and FIG. 46B, the IC chip 1 is pressurized with a pressure against the circuit board 4 by the heating tool 8 heated by the heater 8*a* so as to concurrently perform the correction of the warp of the board 4 and harden the thermosetting resin sheet 6 or the thermosetting adhesive 306*b* interposed between the IC chip 1 and the circuit board 4. At this time, the thermosetting resin sheet 6 or the thermosetting adhesive 306*b* is softened as described hereinabove by the heat applied from the bonding tool 8 via the IC chip 1 and flows outward by being pressurized from the position to which it has been stuck or applied as shown in FIG. 46C. This outflow thermosetting resin sheet 6 or the thermosetting adhesive 306*b* becomes an encapsulation material (underfill), which remarkably improves the reliability of the bonding of the bumps 3 to the electrodes 5. After a lapse of a specified time, the hardening of the thermosetting resin sheet 6 or the thermosetting adhesive 306*b* gradually progresses, and the hardened resin 6*s* finally bonds the IC chip 1 to the circuit board 4. By moving up the bonding tool 8 that is pressurizing the IC chip 1, the bonding of the IC chip 1 to the electrodes 5 of the circuit board 4 is completed. Strictly speaking, in the case of thermosetting, the reaction of the thermosetting resin progresses during heating, and the fluidity almost disappears with the moving-up motion of the bonding tool 8. According to the above-mentioned method, neither the thermosetting resin sheet 6 nor the thermosetting adhesive 306*b* covers the electrodes 5 before bonding, and therefore, the bumps 3 are brought in direct contact with the electrodes 5 at the time of bonding. Then, neither the thermosetting resin sheet 6 nor the thermosetting adhesive 306*b* enters spaces under the electrodes 5, and the value of connection resistance between the bump 3 and the electrode 5 can be reduced. If the circuit board side is heated, then the temperature of the bonding head 8 can further be reduced. If this method is applied to the eighteenth embodiment, the bonding of the gold bumps to the gold electrodes (for example, copper or tungsten plated with nickel or gold) of the circuit board can easily be achieved.

Twenty-First Embodiment

A method and apparatus for mounting an electronic component of, for example, an IC chip on a circuit board and an electronic component unit or module of, for example, a semiconductor device in which the IC chip is mounted on the board by the mounting method, according to a twenty-first embodiment of the present invention will be described next with reference to FIG. 47 and FIG. 48. The twenty-first embodiment differs from the sixteenth embodiment in that high-reliability bonding can be achieved even if a bump 103 is mounted on the electrode 5 of the circuit board 4 while being shifted.

Figure 47A:
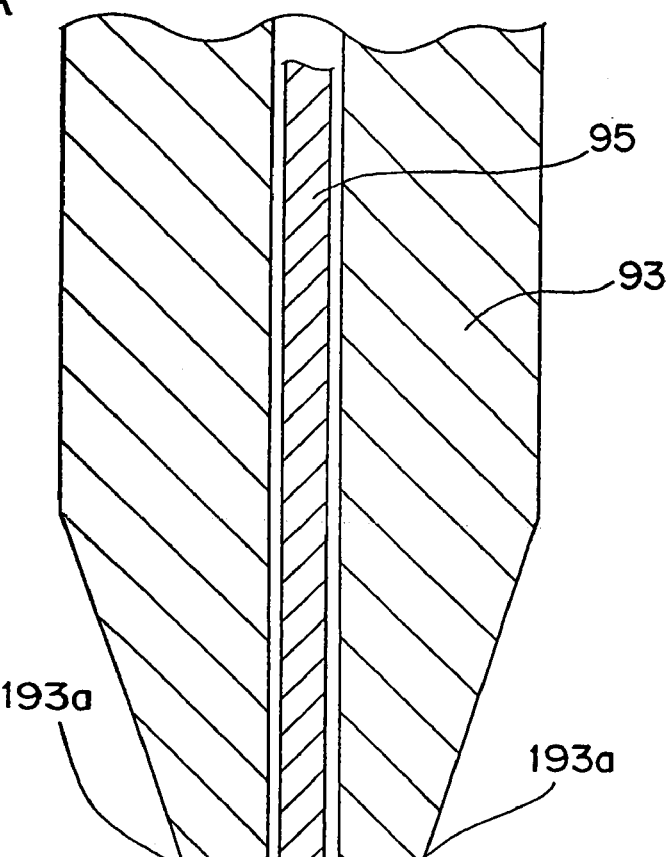
FIG. 47A, FIG. 47B, FIG. 47C and FIG. 47D are explanatory views showing a process for bonding an IC chip to a circuit board by a mounting method according to a twenty-first embodiment of the present invention.

According to the twenty-first embodiment, as shown in FIG. 47A, a gold ball 96 is formed of a gold wire 95 by an electric spark similarly to the wire bonding in forming the bumps 3 on the IC chip 1. Next, a ball 96*a* of a diameter Φd-Bump denoted by 95*a* is formed while adjusting the size of the ball by the duration of the electric spark, and the thus-formed ball 96*a* of the diameter Φd-Bump is formed by controlling the parameter of time or voltage for generating the electric spark so that a chamfer diameter $\phi$D denoted by 93*a* of a capillary 193 whose chamfer angle $\theta$c is not greater than 100° becomes one-half to three-fourths the gold ball diameter d-Bump.

Figure 47C:
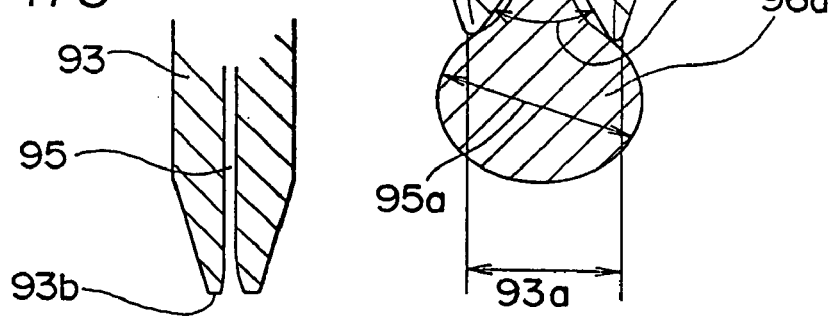
Figure 47D:
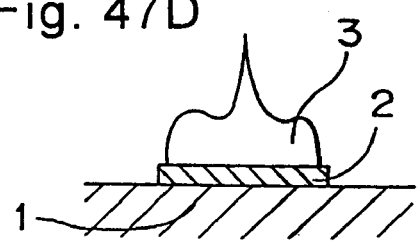
Figure 47B:
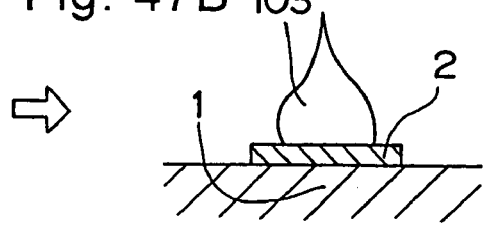

Instead of forming a bump 3 as shown in FIG. 47D with the provision of a flat portion 93*b* in the portion to be brought in contact with the gold ball of the capillary 93 as shown in FIG. 47C, a bump 103 as shown in FIG. 47B is formed on the electrode 2 of the IC chip 1 by supersonic wave thermocompression-bonding by means of a capillary 193 whose tip shape has a tip portion 193*a* provided with no flat portion in the portion to be brought in contact with the gold ball 96*a* of the capillary 193 as shown in FIG. 47A. By using the capillary 193 having the above-mentioned tip shape, an approximately conically tipped bump 103 as shown in FIG. 47B can be formed on the electrode 2 of the IC chip 1. Even when the approximately conically tipped bump 103 formed by the above-mentioned method is mounted on the electrode 5 of the circuit board 4 while being shifted as shown in FIG. 48C, the bump 103 can be partially brought in contact with the electrode 5 of the board 4 without fail since the bump 103 has the approximately conically shaped tip so long as the shift is not greater than half the outside diameter of the bump 103.

In contrast to this, in the case of a bump 3 as shown in FIG. 48D, when the bumps 3 are mounted on the electrodes 5 of the circuit board 4 while being shifted by a dimension Z as shown in FIG. 48C, the so-called base 3*g* of a width dimension d partially comes in contact with the electrode 5 as shown in FIG. 48E. However, this contact is mere partial contact, leading to bonding in an unstable contact state. If the board 4 is subjected to a thermal shock test or reflow in the above unstable bonding state, then the bonding in the unstable bonding state may result in becoming open, that is, defective bonding. In contrast to this, according to the twenty-first embodiment, even when the approximately conically tipped bump 103 is mounted on the electrode 5 of the circuit board 4 while being shifted by the dimension Z as shown in FIG. 48C, the bump 103 can partially come in contact with the electrode 5 of the board 4 without fail so long as the shift is not greater than half the outside diameter of the bump 103 since the bump 103 has the conical tip shape, and this can prevent the possible occurrence of the defective bonding even when the board is subjected to the thermal shock test or reflow.

Twenty-Second Embodiment

Figure 49A:
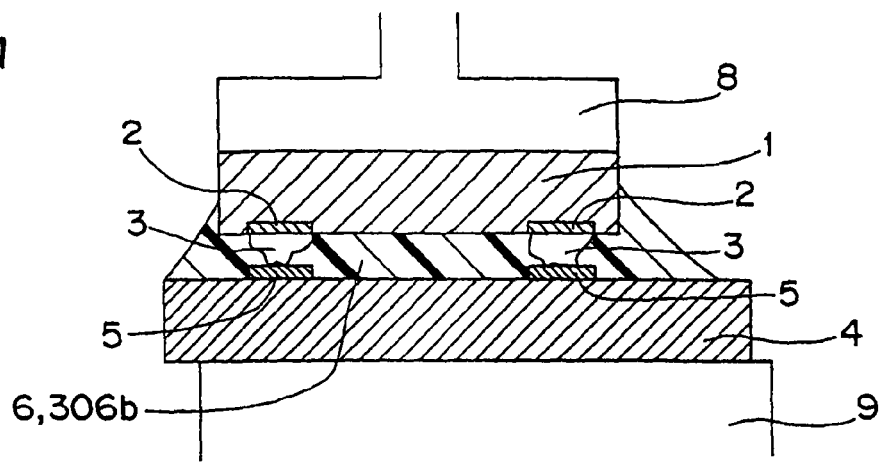
FIG. 49A, FIG. 49B, FIG. 49C and FIG. 49D are explanatory views showing a process for bonding an IC chip to a circuit board by a mounting method according to a twenty-second embodiment of the present invention.
Figure 49B:
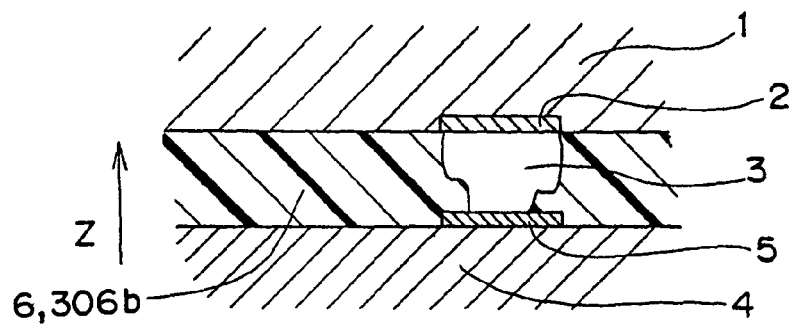
Figure 49C:
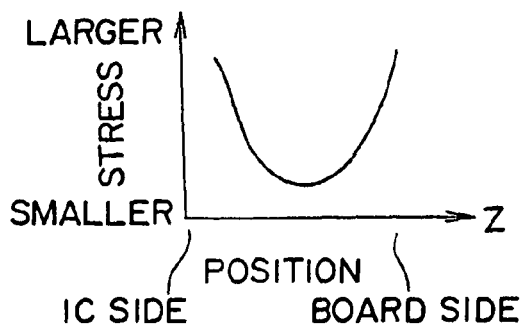
Figure 49D:
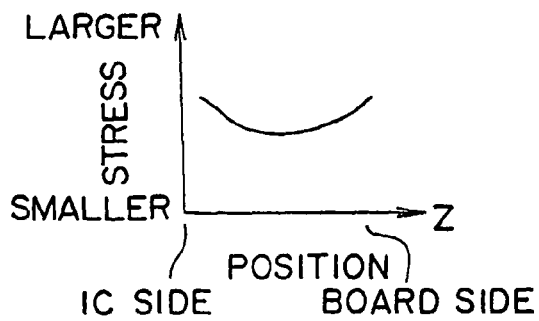
Figure 50:
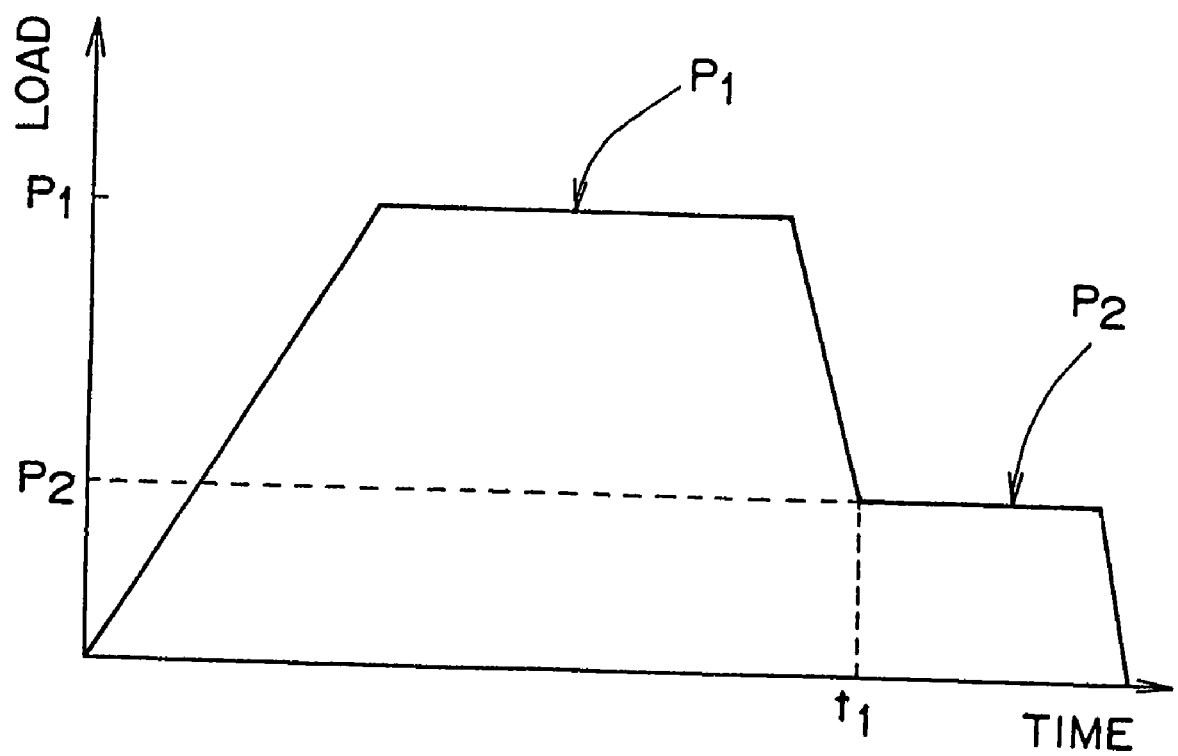
FIG. 50 is an explanatory view showing a pressure profile used in a process for bonding an IC chip to a circuit board by the mounting method of the twenty-second embodiment of the present invention.

A method and apparatus for mounting an electronic component of, for example, an IC chip on a circuit board and an electronic component unit or module of, for example, a semiconductor device in which the IC chip is mounted on the board by the mounting method, according to a twenty-second embodiment of the present invention will be described next with reference to FIG. 49 and FIG. 50. According to this twenty-second embodiment, the stress of the IC chip 1 and the circuit board 4 in the sixteenth embodiment can be alleviated when the thermosetting resin is hardened after the bonding of the IC chip 1 to the circuit board 4.

In the twenty-second embodiment, the bumps 3 formed on the electrodes 2 of the IC chip 1 by the wire bonding are aligned in position with the electrodes 5 of the circuit board 4 without leveling the bumps with interposition of a solid or semi-solid thermosetting resin sheet 6 or the thermosetting adhesive 306b obtained by mixing an insulating resin 306m with an inorganic filler 6f. The IC chip 1 is pressed against the circuit board 4 with a pressure force P1 of not smaller than 80 gf per bump in the case of a ceramic board while heating the IC chip 1 from its rear surface side by the tool 8 heated to a specified temperature of, for example, 230° C. to correct the warp of the board 4, and the thermosetting resin sheet 6 or the thermosetting adhesive 306b interposed between the IC chip 1 and the circuit board 4 is hardened by the heat. Next, assuming that the total time is, for example, 20 seconds, then, after a lapse of a specified time t1, i.e., after a lapse of five to 10 seconds being one-fourth or one-half the time, also depending on the reaction rate of the material, or in other words, before the reaction rate of the material reaches 90%, the pressure is reduced to a pressure P2 lower than the pressure P1 to alleviate the stress when the thermosetting adhesive 306b is hardened, and the IC chip 1 and the circuit board 4 are bonded together to electrically connect both the electrodes 2 and 5. Preferably, by setting the pressure P1 to 20 gf or more per bump for the reason that a minimum of about 20 gf is required for the deformation of the bump, i.e., in order to obtain the pressure required for the deformation and adaptation of the bump and force out the excessive resin from between the IC chip 1 and the board 4 and setting the pressure P2 less than 20 gf per bump in order to remove the hardening distortion unevenly distributed inside the ratio before the deformation or the like of the bump, the reliability is improved. The detailed reasons are as follows. That is, the stress distribution of the thermosetting resin in the thermosetting resin sheet 6 or the thermosetting adhesive 306b is increased on the IC chip 1 side and the board 4 side at the time of pressure bonding as shown in FIG. 49C.

In this state kept intact, if fatigue is repetitively given through a reliability test and normal long-term use, then the thermosetting resin in the thermosetting resin sheet 6 or the thermosetting adhesive 306b sometimes unable to endure the stress and may separate on the IC chip 1 side or the board 4 side. If the above state occurs, then the adhesive strength of the IC chip 1 and the circuit board 4 becomes insufficient and the bonded portion becomes open. Accordingly, by adopting a two-step pressure profile of the higher pressure P1 and the lower pressure P2 as shown in FIG. 50, the pressure can be reduced to the pressure P2 lower than the pressure P1 when the thermosetting adhesive 306b is hardened, and the stress of the IC chip 1 and the circuit board 4 can be alleviated (in other words, the degree of stress concentration can be reduced) as shown in FIG. 49D by removing the hardening distortion unevenly distributed inside the resin with the pressure P2. Subsequently, by increasing the pressure to the pressure P1, a pressure required for the deformation and adaptation of the bump can be obtained and the excessive resin can be forced out of the space between the IC chip 1 and the board 4, improving the reliability.

It is to be noted that the aforementioned "adhesive strength of the IC chip 1 and the circuit board 4" means a force to make the IC chip 1 and the board 4 adhere to each other. With this regard, the IC chip 1 and the board 4 are bonded together by the three forces of an adhesive strength provided by the adhesive, a hardening shrinkage force when the adhesive is hardened, and a shrinkage force (for example, a shrinkage force generated when the adhesive heated to a temperature of, for example, 180° C. shrinks when returning to the normal temperature) in the Z-direction.

Twenty-Third Embodiment

A method and apparatus for mounting an electronic component of, for example, an IC chip on a circuit board and an electronic component unit or module of, for example, a semiconductor device in which the IC chip is mounted on the board by the mounting method, according to a twenty-third embodiment of the present invention will be described next with reference to FIG. 49 and FIG. 50. According to this twenty-third embodiment, the inorganic filler 6f mixed with the insulating resin 306m in each of the aforementioned embodiments has a mean particle diameter of not smaller than 3 μm. It is to be noted that the maximum mean particle diameter of the inorganic filler 6f is assumed to have a dimension that does not exceed the gap dimension between the IC chip 1 and the board 4 after bonding.

If fine particles having a mean particle diameter smaller than 3 μm are used as the inorganic filler 6f when the insulating resin 306m is mixed with the inorganic filler 6f, then the surface area of those particles becomes large as a whole, and this possibly leads to moisture absorption to the periphery of the inorganic filler 6f of the fine particles that have a mean particle diameter smaller than 3 μm, which is disadvantageous in terms of the bonding of the IC chip 1 to the board 4.

Figure 59A:
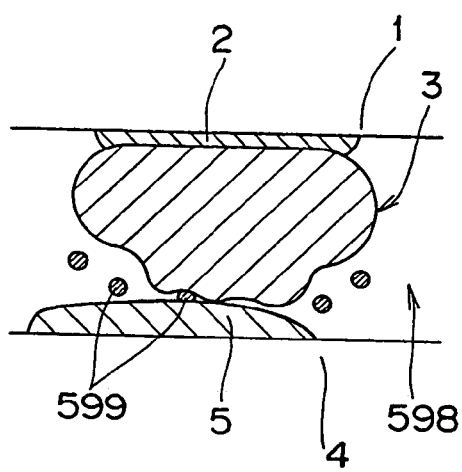
FIG. 59A and FIG. 59B are enlarged sectional views in the vicinity of a bump for explaining a comparison between an ACF processing method and the processing method of the above embodiment.
Figure 59B:
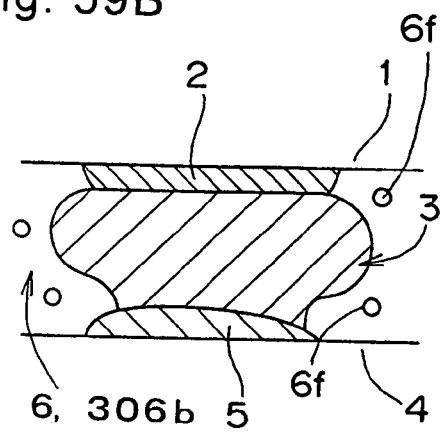

Therefore, when the inorganic filler 6f of the same weight is mixed, the amount of moisture absorption to the periphery of the inorganic filler 6f can be reduced by employing a larger inorganic filler 6f that has a mean particle diameter of not smaller than 3 μm, and this allows the moisture resistance to be improved. Moreover, the inorganic filler of a larger mean particle diameter (in other words, average grain size) is generally less expensive, and this is preferable in terms of cost. As shown in FIG. 59A, according to the processing method that employs the ACF (Anisotropic Conductive Film) 598 for the bonding of the IC chip 1 to the board 4, it is required to place conductive particles 599 in the ACF 598 between the bump 3 and the board electrode 5 without fail. However, since no conductive particle exists in the aforementioned embodiment of the present invention, there is no need for doing so. As shown in FIG. 59B, the bump 3 is pressure-bonded to the board electrode 5 while being crushed by the electrode 5, and therefore, the inorganic filler 6f also slips out of the space between the bump 3 and the board electrode 4 together with the insulating resin layers 6 and 306b between the bump 3 and the board electrode 4. On the basis of the feature that there is almost no hindrance of conductivity by virtue of the placement of the unnecessary inorganic filler 6f between the board electrode 4 and the bump 3, an inorganic filler 6f of a large mean particle diameter of not smaller than 3 μm can be employed.

Twenty-Fourth Embodiment

Figure 60:
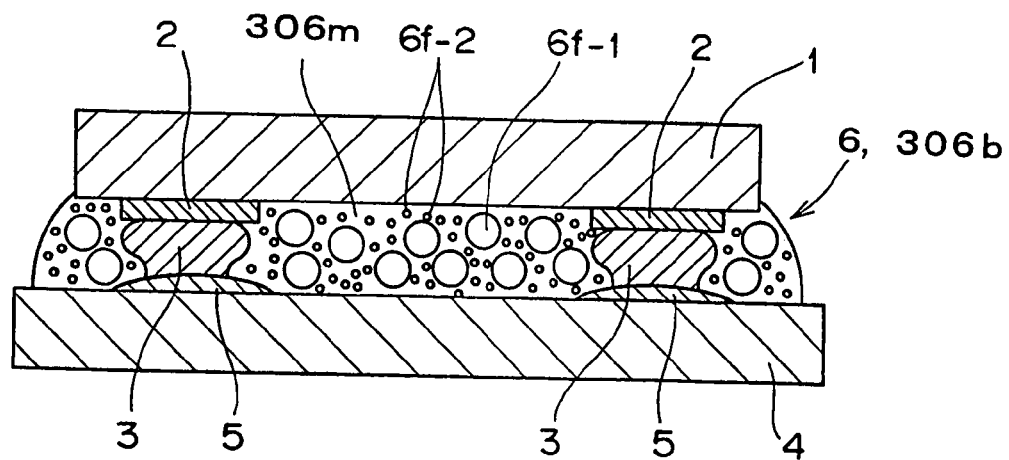
FIG. 60 is a schematic sectional view of a bonded state achieved by a method and apparatus for mounting an electronic component of, for example, an IC chip on a circuit board according to a twenty-fourth embodiment of the present invention.
Figure 61:
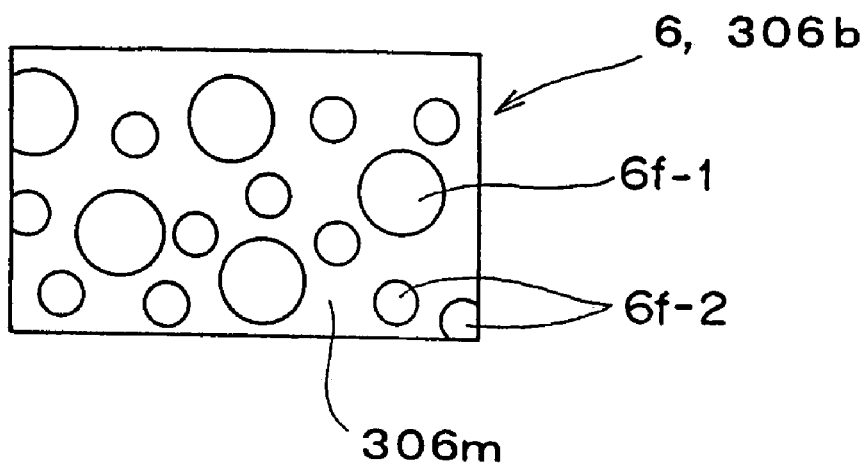
FIG. 61 is a partially enlarged schematic sectional view of a resin sheet employed by the method and apparatus for mounting the electronic component of, for example, an IC chip on the circuit board of the twenty-fourth embodiment.

A method and apparatus for mounting an electronic component of, for example, an IC chip on a circuit board and an electronic component unit or module of, for example, a semiconductor device in which the IC chip is mounted on the board by the mounting method, according to a twenty-fourth embodiment of the present invention will be described next with reference to FIG. 60 and FIG. 26. FIG. 60 and FIG. 26 are a schematic sectional view of a bonded state produced by the method and apparatus for mounting an electronic component of, for example, an IC chip on a circuit board and a partially enlarged schematic sectional view of a resin sheet 6 employed in the above case, according to the twenty-fourth embodiment. According to this twenty-fourth embodiment, the inorganic filler 6f to be mixed with the insulating resin 306m of the insulating resin layers 6 and 306b in each of the aforementioned embodiments is provided by inorganic fillers 6f-1 and 6f-2, which have a plurality of different mean particle diameters. As a concrete example, an inorganic filler having a mean particle diameter of 0.5 μm and an inorganic filler having a mean particle diameter of 2 to 4 μm are employed.

According to the twenty-fourth embodiment, by mixing the insulating resin 306m with the inorganic fillers 6f-1 and 6f-2, which have the plurality of different mean particle diameters, the amount of the inorganic filler 6f to be mixed with the insulating resin 306m can be increased, and the amount of moisture absorption to the periphery of the inorganic filler can be reduced. This enables the improvement in the moisture resistance and facilitates the film formation (solidification). That is, in terms of percentage by weight, the amount of the inorganic filler per unit volume can be increased when inorganic fillers of different particle diameters are mixed rather than when one type of inorganic filler is employed. This enables the increase in amount of the inorganic filler 6f to be mixed with the resin sheet 6 or the adhesive 306b that serves as an encapsulation sheet and enables the reduction in the coefficient of linear expansion of the resin sheet 6 or the adhesive 306b, allowing the operating life to be increased for the improvement of reliability.

Twenty-Fifth Embodiment

Next, according to a method and apparatus for mounting an electronic component of, for example, an IC chip on a circuit board and an electronic component unit or module of, for example, a semiconductor device in which the IC chip is mounted on the board by the mounting method, according to a twenty-fifth embodiment of the present invention, in order to further ensure the effect of the twenty-fourth embodiment, the mean particle diameter of one inorganic filler 6f-1 of the inorganic fillers 6f-1 and 6f-2, which have the plurality of different mean particle diameters, is two or more times different from the mean particle diameter of the other inorganic filler 6f-2. As a concrete example, an inorganic filler having a mean particle diameter of 0.5 μm and an inorganic filler having a mean particle diameter of 2 to 4 μm are employed.

With this arrangement, the effect of the twenty-fourth embodiment can further be improved. That is, by mixing the insulating resin 306m with the inorganic fillers 6f-1 and 6f-2, which have the plurality of different mean particle diameters and in which the mean particle diameter of one inorganic filler 6f-1 is two or more times different from the mean particle diameter of the other inorganic filler 6f-2, the amount of the inorganic filler 6f to be mixed with the insulating resin 306m can be more reliably increased. This arrangement facilitates the film formation (solidification), increases the loadings of the inorganic filler 6f in the resin sheet 6 or the adhesive 306b and enables the further reduction in the coefficient of linear expansion of the resin sheet 6 or the adhesive 306b, allowing the operating life to be increased for further improvement of reliability.

Twenty-Sixth Embodiment

Next, according to a method and apparatus for mounting an electronic component of, for example, an IC chip on a circuit board and an electronic component unit or module of, for example, a semiconductor device in which the IC chip is mounted on the board by the mounting method, according to a twenty-sixth embodiment of the present invention, in order to further ensure the effect of the twenty-fourth embodiment, it is preferable to provide the inorganic filler 6f to be mixed with the insulating resin 306m by at least two types of inorganic fillers 6f-1 and 6f-2, which have a plurality of different mean particle diameters, make one inorganic filler 6f-1 out of at least two types of inorganic fillers have a mean particle diameter exceeding 3 μm and make the other inorganic filler 6f-2 out of at least two types of inorganic fillers have a mean particle diameter of not greater than 3 μm. As a concrete example, an inorganic filler having a mean particle diameter of 0.5 μm and an inorganic filler having a mean particle diameter of 2 to 4 μm are employed.

Twenty-Seventh Embodiment

Next, according to a method and apparatus for mounting an electronic component of, for example, an IC chip on a circuit board and an electronic component unit or module of, for example, a semiconductor device in which the IC chip is mounted on the board by the mounting method, according to a twenty-seventh embodiment of the present invention, based on each of the aforementioned embodiments, it is acceptable to provide the inorganic filler 6f to be mixed with the insulating resin 306m by at least two types of inorganic fillers 6f-1 and 6f-2, which have a plurality of different mean particle diameters, and constitute one inorganic filler 6f-1 of the larger mean particle diameter out of at least two types of inorganic fillers by a material identical to that of the insulating resin 306m, producing a stress alleviating effect. As a concrete example, an inorganic filler having a mean particle diameter of 0.5 μm and an inorganic filler having a mean particle diameter of 2 to 4 μm are employed.

According to this twenty-seventh embodiment, the stress alleviating effect can be produced in addition to the operative effect of the twenty-fourth embodiment by virtue of the arrangement that the one inorganic filler 6f-1 of the larger mean particle diameter is made of the material identical to that of the insulating resin 306m and the integration of the one inorganic filler 6f-1 of the larger mean particle diameter with the insulating resin 306m when a stress is exerted on the insulating resin 306m.

Twenty-Eighth Embodiment

Next, according to a method and apparatus for mounting an electronic component of, for example, an IC chip on a circuit board and an electronic component unit or module of, for example, a semiconductor device in which the IC chip is mounted on the board by the mounting method, according to a twenty-eighth embodiment of the present invention, based on each of the aforementioned embodiments, it is acceptable to provide the inorganic filler 6f to be mixed with the insulating resin 306m by at least two types of inorganic fillers 6f-1 and 6f-2, which have a plurality of different mean particle diameters, and make one inorganic filler 6f-1 of the larger mean particle diameter out of at least two types of inorganic fillers softer than the epoxy resin of the insulating resin 306m, producing a stress alleviating effect by the compression of the one inorganic filler 6f-1.

Figure 62:
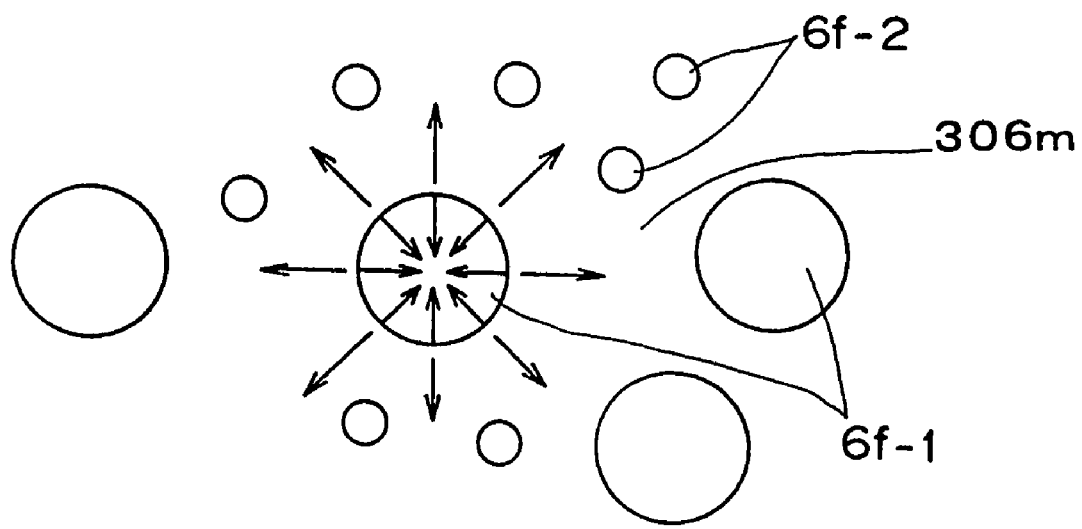
FIG. 62 is a schematic sectional view of an insulating resin and an inorganic filler in a bonded state achieved by a method and apparatus for mounting an electronic component of, for example, an IC chip on a circuit board according to a twenty-eighth embodiment of the present invention.

According to this twenty-eighth embodiment, the stress alleviating effect can be produced in addition to the operative effect of the twenty-fourth embodiment by virtue of the arrangement that the one inorganic filler 6f-1 of the larger mean particle diameter is made of the material identical to that of the insulating resin 306m and the arrangement that the one inorganic filler 6f-1 of the larger mean particle diameter is softer than the epoxy resin of the insulating resin 306m, as a consequence of which the one inorganic filler 6f-1 is compressed as shown in FIG. 62 to disperse the tension force of a reactive force against the compression around there when a stress is exerted on the insulating resin 306m.

Twenty-Ninth Embodiment

Figure 63A:
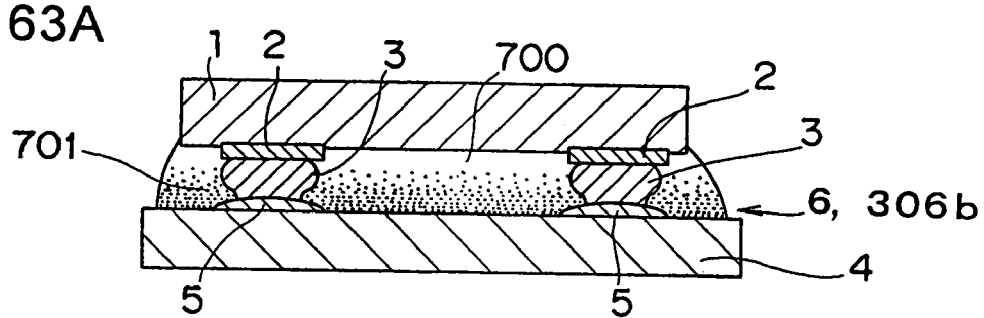
FIG. 63A, FIG. 63B, FIG. 63C and FIG. 63D are schematic sectional views of various examples of electronic component units of an insulating resin layer employed by a method and apparatus for mounting an electronic component of, for example, an IC chip on a circuit board according to a twenty-ninth embodiment of the present invention.
Figure 63B:
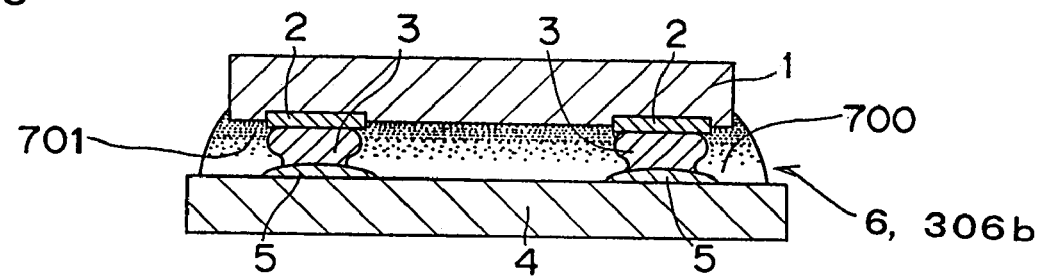

Next, according to a method and apparatus for mounting an electronic component of, for example, an IC chip on a circuit board and an electronic component unit or module of, for example, a semiconductor device in which the IC chip is mounted on the board by the mounting method, according to a twenty-ninth embodiment of the present invention, based on each of the aforementioned embodiments, it is further acceptable to mix a portion 700 or a layer 6x, which belongs to the insulating resin layers 6 and 306b and is brought in contact with the IC chip 1 or the board 4, with a smaller amount of inorganic filler than another portion 701 or a layer 6y or with no inorganic filler 6f, as shown in FIGS. 63A and 63B, FIGS. 64A and 64B, FIG. 65 and FIG. 66. In this case, it is acceptable to gradually vary the amount of inorganic filler without definitely distinguishing the portion 700 brought in contact with the IC chip 1 or the board 4 from the other portion 701 as shown in FIGS. 63A and 63B or to definitely distinguish them from each other as shown in FIGS. 64A and 64B, FIG. 65 and FIG. 66. That is, in FIGS. 64A and 64B, FIG. 65 and FIG. 66, the insulating resin layers 6 and 306b are allowed to have a multilayer structure provided with a first resin layer 6x that is positioned in the portion brought in contact with the IC chip 1 or the board 4 and in which an insulating resin identical to the insulating resin 306m is mixed with the inorganic filler 6f as well as a second resin layer 6y brought in contact with the first resin layer 6x and constructed of the insulating resin mixed with a smaller amount of inorganic filler than the first resin layer 6x or with no inorganic filler 6f.

With this arrangement, the following effects can be produced. That is, if the inorganic filler 6f is mixed by the same weight percentage (wt %) with the whole body of the insulating resin layer, then the inorganic filler 6f might increase on the IC chip side or the board side or in the vicinity of the opposite surfaces of both of them and conversely decreases in a portion located in the middle of the IC chip 1 and the board 4. As a result, there is a greater amount of inorganic filler 6f on the IC chip side or the board side or in the vicinity of the opposite surfaces of both of them, and therefore, the adhesive strength is sometimes reduced between the insulating resin layers 6 and 306b and the IC chip 1 or the board 4 or both of them. According to the twenty-ninth embodiment, with the arrangement that the portion 700 or the layer 6x brought in contact with either one of the IC chip 1 and the board 4 is mixed with a smaller amount of inorganic filler than the other portion 701 or the layer 6y or with no inorganic filler 6f, the reduction in the adhesive strength due to the large amount of inorganic filler can be prevented.

A variety of modification examples of this twenty-ninth embodiment will be described below.

Figure 63C:
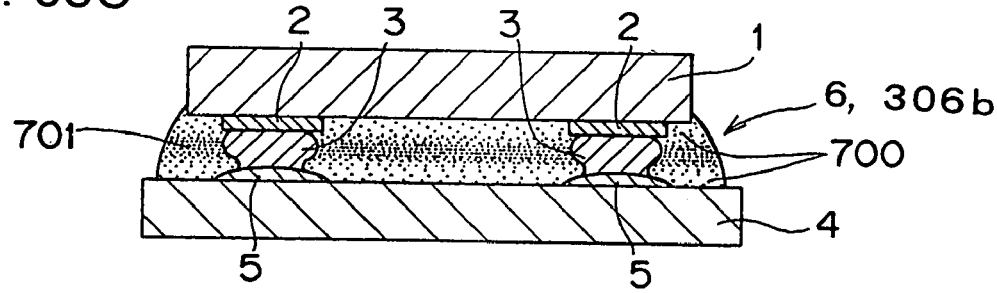
Figure 64A:
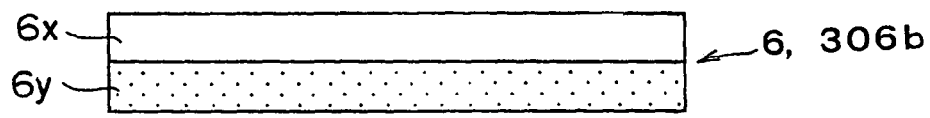
FIG. 64A, FIG. 64B, FIG. 64C and FIG. 64D are schematic sectional views of various examples of an insulating resin layer employed by a method and apparatus for mounting an electronic component of, for example, an IC chip on a circuit board according to a modification example of the twenty-ninth embodiment of the present invention.
Figure 64B:
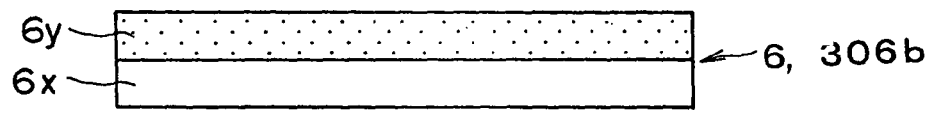
Figure 64C:
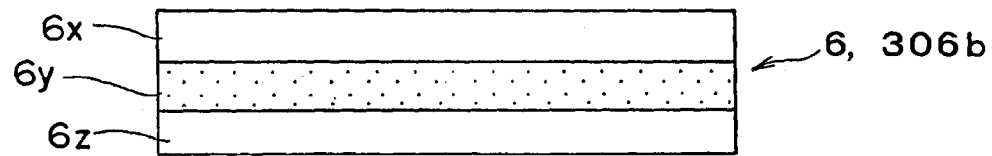
Figure 67A:
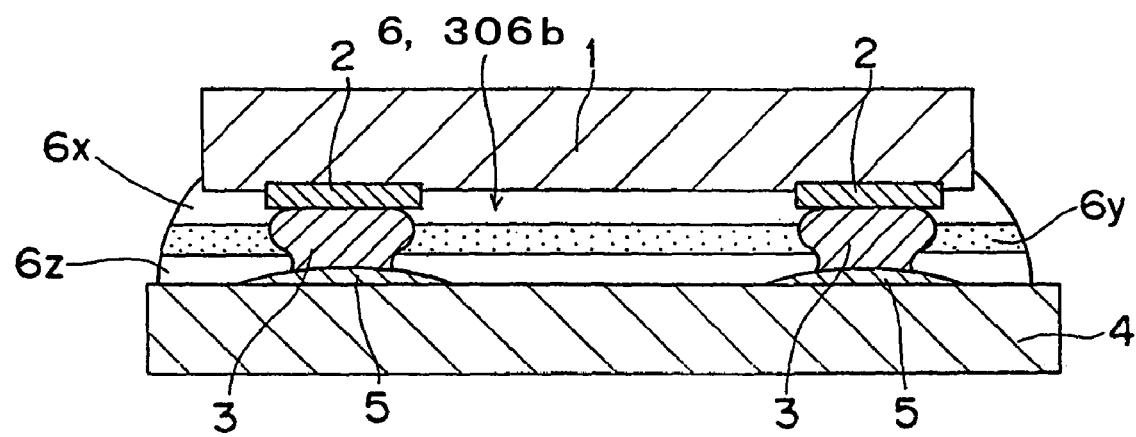
FIG. 67A and FIG. 67B are schematic sectional views of a bonded state achieved by using the insulating resin layer employed by the method and apparatus for mounting the electronic component of, for example, an IC chip on the circuit board of the twenty-ninth embodiment shown in FIG. 64C and FIG. 64D.

First, as a first modification example, as shown in FIG. 63C, FIG. 64C and FIG. 67A, the insulating resin layers 6 and 306b can be constructed so that the portion 700 brought in contact with both the IC chip 1 and the board 4 is mixed with a smaller amount of inorganic filler than the other portion 701 or with no inorganic filler 6f. Also, in this case, it is acceptable to gradually vary the amount of inorganic filler without definitely distinguishing the portion 700 brought in contact with both the IC chip 1 and the board 4 from the other portion 701 as shown in FIG. 63C or to definitely distinguish them from each other as shown in FIG. 64C and FIG. 67A. That is, in FIG. 64C and FIG. 67A, it is acceptable to make the insulating resin layers 6 and 306b have a multilayer structure further provided with a third resin layer 6z that is located on the opposite side of the first resin layer 6x with respect to the second resin layer 6y and is constructed of the insulating resin mixed with a smaller amount of inorganic filler than the first resin layer 6x or no inorganic filler 6f and bring the first resin layer 6x and the third resin layer 6z in contact with the IC chip 1 and the board 4, respectively.

Furthermore, as another modification example, it is acceptable to mix the portion 700 brought in contact with the IC chip 1 or the board 4 or both of them with the inorganic filler by less than 20 wt % or with no inorganic filler 6f and mix the other portion 701 with the inorganic filler by not less than 20 wt %. In this case, it is acceptable to gradually vary the amount of inorganic filler without definitely distinguishing the portion 700 brought in contact with the IC chip 1 or the board 4 or both of them from the other portion 701 as shown in FIGS. 63A, 63B and 63C or to definitely distinguish them from each other as shown in FIGS. 64A, 64B and 64C, FIG. 65, FIG. 66 and FIG. 67A. That is, it is possible to mix the first resin layer 6x or the first resin layer 6x and the third resin layer 6z with the inorganic filler by less than 20 wt % or with no inorganic filler 6f and mix the second resin layer 6y with the inorganic filler by not less than 20 wt %.

As a concrete example, assuming that the insulating resin 306m is provided by thermosetting epoxy resin, then the second resin layer 6y occupies 50 wt % in the case of a ceramic board or 20 wt % in the case of a glass epoxy board. As an example, the first resin layer 6x or the third resin layer 6z or both of them are made to have a thickness of 15 μm, while the second resin layer 6y is made to have a thickness of 40 to 60 μm. The thickness of the insulating resin layers 6 and 306b is made to have a dimension larger than the gap dimension obtained after the bonding of the IC chip 1 to the board 4, so that the space between the IC chip 1 and the board 4 is completely filled with the layer at the time of bonding of the IC chip 1 to the board 4, further ensuring the connection.

Figure 63D:
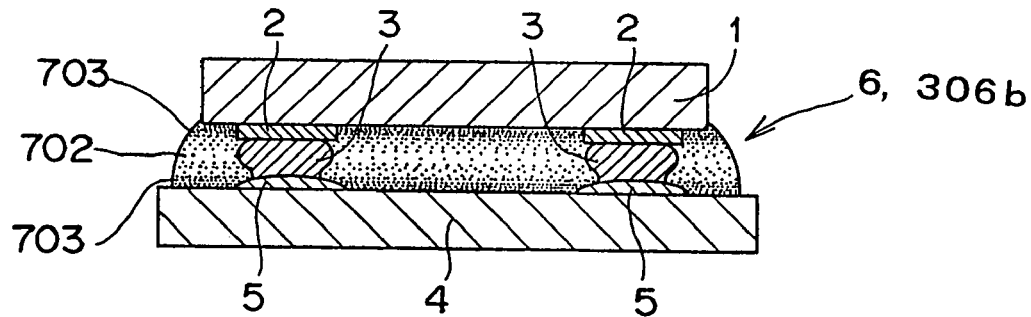
Figure 64D:
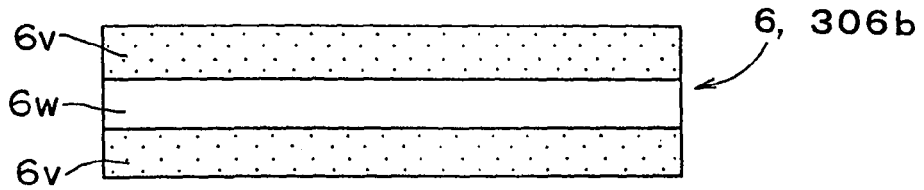
Figure 67B:
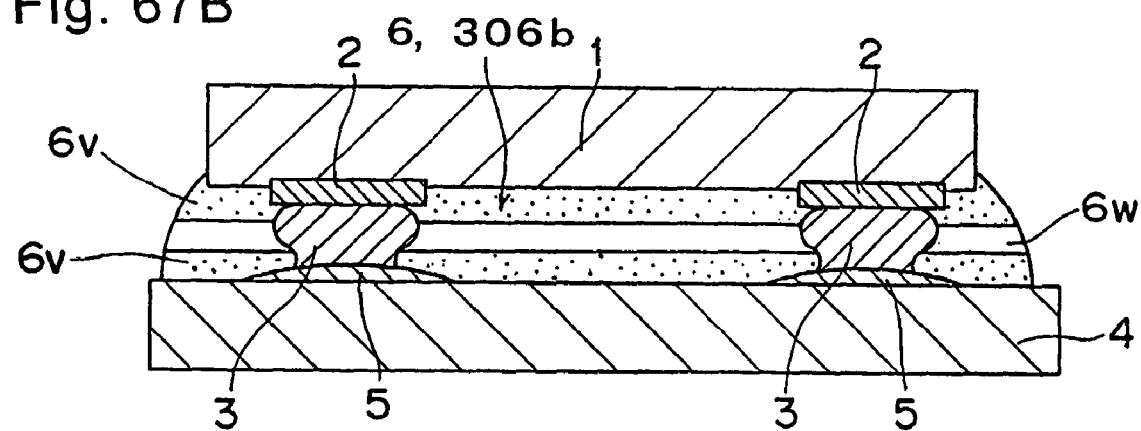

As another modification example, it is acceptable to reverse the loadings of the inorganic filler with respect to the modification example shown in FIG. 63C, FIG. 64C and FIG. 67A. That is, as shown in FIG. 63D, it is acceptable that a middle portion 702 of the portion 703 that belongs to the insulating resin layers 6 and 306b and is brought in contact with both the IC chip 1 and the board 4 is mixed with a smaller amount of inorganic filler than the portion 703 brought in contact with both the IC chip 1 and the board 4 or with no inorganic filler 6f. Also in this case, it is acceptable to gradually vary the amount of inorganic filler without definitely distinguishing the portion 703 brought in contact with both the IC chip 1 and the board 4 from the middle portion 702 or to definitely distinguish them from each other as shown in FIG. 64D and FIG. 67B. That is, as shown in FIG. 64D and FIG. 67B, the insulating resin layers 6 and 306b can be provided with a fourth resin layer 6v constructed of the insulating resin 306m that is positioned in the portion brought in contact with the IC chip 1 and the board 4 and mixed with the inorganic filler 6f and a fifth resin layer 6w constructed of the insulating resin 306m that is positioned in the middle portion between the IC chip 1 and the board 4 and mixed with a smaller amount of inorganic filler than the fourth resin layer 6v or with no inorganic filler.

With this arrangement, the middle portion 702 located between the IC chip 1 and the board 4 or the fifth resin layer 6w is mixed with a smaller amount of inorganic filler than that of the portion 703 or the fourth resin layer 6v brought in contact with the IC chip 1 and the board 4 or with no inorganic filler, and therefore, the elastic modulus is reduced, allowing the stress alleviation effect to be produced. By selectively employing an insulating resin of high adhesion to the IC chip 1 and the board 4 as the insulating resin of the portion 703 or the fourth resin layer 6v brought in contact with the IC chip 1 and the board 4, it is allowed to select the loadings or material of the inorganic filler 6f so that the portion 703 brought in contact with the IC chip 1 or the fourth resin layer 6v located in the vicinity of the IC chip 1 comes to have a coefficient of linear expansion closer to that of the IC chip 1 and select the loadings or material of the inorganic filler 6f so that the portion 703 brought in contact with the board 4 or the fourth resin layer 6v located in the vicinity of the board 4 comes to have a coefficient of linear expansion closer to that of the board 4. As a result, the coefficient of linear expansion of the portion 703 brought in contact with the IC chip 1 or the fourth resin layer 6v located in the vicinity of the IC chip 1 comes close to that of the IC chip 1. Therefore, both the members are hard to separate, and since the coefficient of linear expansion of the portion 703 brought in contact with the board 4 or the fourth resin layer 6v located in the vicinity of the board 4 comes close to that of the board 4, both the members are hard to separate.

Figure 68A:
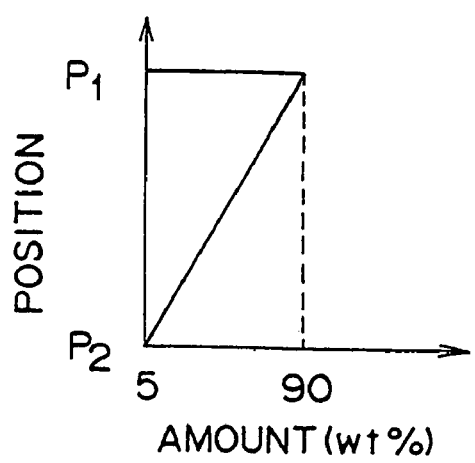
FIG. 68A, FIG. 68B, FIG. 68C, FIG. 68D, FIG. 68E and FIG. 68F are graphs showing various relations between the amount of the inorganic filler of the insulating resin layer employed by the method and apparatus for mounting the electronic component of, for example, an IC chip on the circuit board of the twenty-ninth embodiment and the position in the direction of thickness of the insulating resin layer.
Figure 68B:
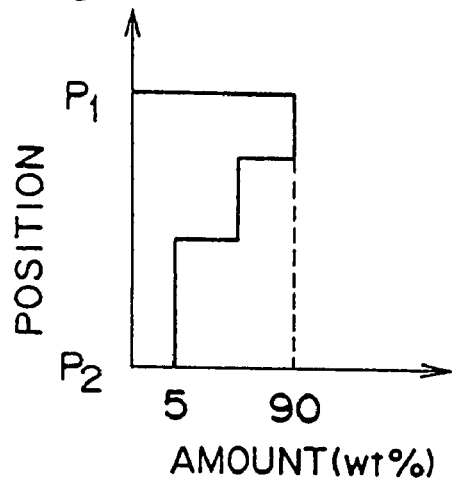

Furthermore, as indicated by the solid lines in FIGS. 68A and 68B, the insulating resin layers 6 and 306b can also be constructed so that the amount of the inorganic filler is reduced gradually or in steps from the portion P1 brought in contact with either the IC chip 1 or the board 4 toward the other portion P2.

Figure 68C:
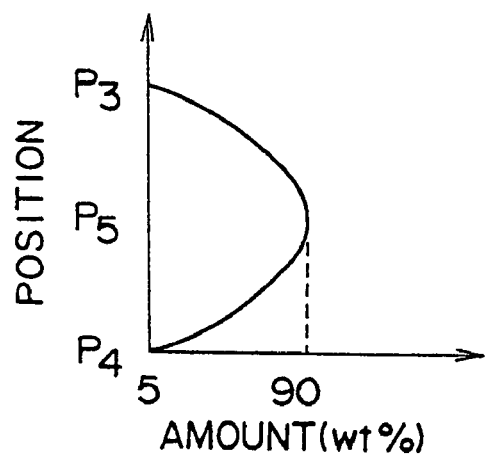
Figure 68D:
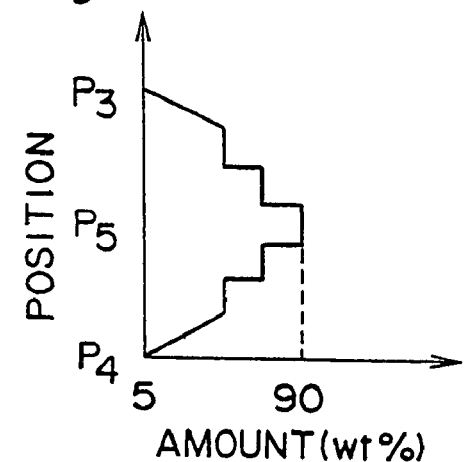

As indicated by the solid lines in FIGS. 68C and 68D, the insulating resin layers 6 and 306b can also be constructed so that the amount of the inorganic filler is reduced gradually or in steps from portions P3 and P4 brought in contact with the IC chip 1 and the board 4, respectively, toward another portion, i.e., a middle portion P5 located between the IC chip 1 and the board 4.

Figure 68E:
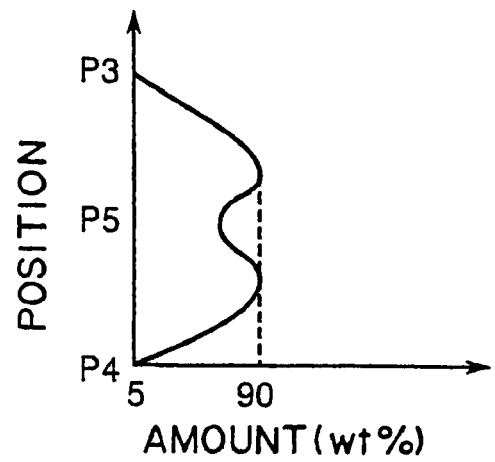

As indicated by the solid line in FIG. 68E, the insulating resin layers 6 and 306b can also be constructed so that the amount of the inorganic filler is gradually reduced from a portion brought in contact with the IC chip 1 and the board 4 (portion corresponding to the contact portion 703 in the modification example of FIG. 63D) toward a middle portion (portion corresponding to the middle portion 702 in the modification example of FIG. 63D) located between the IC chip 1 and the board 4.

Figure 68F:
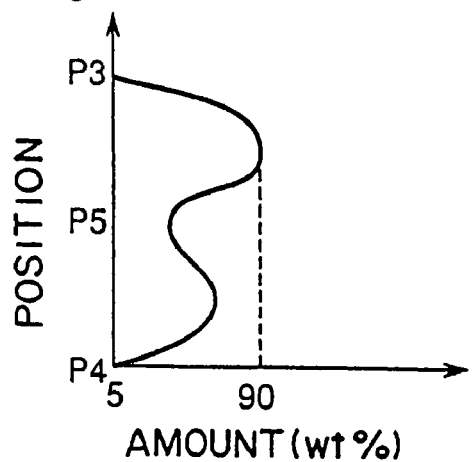

As indicated by the solid line in FIG. 68F, the insulating resin layers 6 and 306b can also be constructed so that the amount of the inorganic filler is mixed less in the order of a portion located in the vicinity of the IC chip 1, a portion located in the vicinity of the board 4, and a middle portion located between the vicinity of the IC chip 1 and the vicinity of the board 4. Although the amount of the inorganic filler is gradually reduced in the above-mentioned order as shown by example in FIG. 68F, without being limited to this, the amount may be reduced in steps.

With the arrangements of the modification examples of FIGS. 68E and 68F, the middle portion located between the IC chip 1 and the board 4 is mixed with a smaller amount of inorganic filler than that of the portions brought in contact with the IC chip 1 and the board 4 or with no inorganic filler. Therefore, the elastic modulus becomes reduced, allowing the stress alleviation effect to be produced. By selectively employing an insulating resin of high adhesion to the IC chip 1 and the board 4 as the insulating resin of the portion brought in contact with the IC chip 1 and the board 4, it is allowed to select the loadings or material of the inorganic filler 6f so that the portion brought in contact with the IC chip 1 comes to have a coefficient of linear expansion closer to that of the IC chip 1 and select the loadings or material of the inorganic filler 6f so that the portion brought in contact with the board 4 comes to have a coefficient of linear expansion closer to that of the board 4. If the loadings of the inorganic filler 6f is determined from this point of view, then, as indicated by the solid line in FIG. 68F, the amount of the inorganic filler is mixed less in the order of a portion located in the vicinity of the IC chip 1, a portion located in the vicinity of the board 4, and a middle portion located between the vicinity of the IC chip 1 and the vicinity of the board 4. With this construction, the coefficient of linear expansion of the portion brought in contact with the IC chip 1 comes close to that of the IC chip 1. Therefore, both the members are hard to separate, and since the coefficient of linear expansion of the portion brought in contact with the board 4 comes close to that of the board 4, both the members are hard to separate.

In any one of the cases of FIGS. 68A through 68F, it is practically preferable to set the amount of the inorganic filler within a range of 5 to 90 wt %. When the ratio is lower than 5 wt %, the mixture of the inorganic filler 6f is meaningless. When the ratio exceeds 90 wt %, the adhesive strength is extremely reduced, and it is difficult to form a sheet, leading to a disadvantage.

When the IC chip 1 is thermocompression-bonded to the board 4 employing a film of a multilayer structure constructed of a plurality of resin layers 6x and 6y or resin layers 6x, 6y and 6z as described above as an insulating resin layer, the insulating resin 306m is softened and melted by heat at the time of bonding, causing the mixture of the resin layers. Therefore, finally, the definite boundaries between the resin layers disappear, and the inclined inorganic filler distributions as shown in FIG. 68 result.

Furthermore, in the twenty-ninth embodiment or the modification examples, it is also possible to employ different insulating resins for insulating resin layer that has a portion or layer including the inorganic filler 6f or the insulating resin layer in which the inorganic filler distribution is inclined, according to the portion or the resin layer. For example, it is also possible to employ an insulating resin that improves the adhesion to the film material to be used on the IC chip surface for the portion or the resin layer brought in contact with the IC chip 1 and employ an insulating resin that improves the adhesion to the material of the board surface for the portion or the resin layer brought in contact with the board 4.

According to the twenty-ninth embodiment and the various modification examples thereof, no or a smaller amount of inorganic filler 6f exists in the bonding interface of the IC chip 1 or the board 4 and the insulating resin layers 6 and 306b, and the innate adhesion of the insulating resin is effected. This increases the insulating resin of high adhesion in the bonding interface, allowing the adhesion strength of the IC chip 1 or the board 4 and the insulating resin 306m and improving the adhesion to the IC chip 1 or the board 4. With this arrangement, the operating life is improved during a variety of reliability tests, and the peel strength to bending is improved.

If an inorganic filler 6f, which does not contribute to the bonding itself but has the effect of reducing the coefficient of linear expansion, is uniformly distributed in the insulating resin 306m, then the inorganic filler 6f comes in contact with the surface of the board 4 or the IC chip 1. This leads to a reduction in the amount of adhesive contributing to the bonding and to degraded adhesion. If the separation between the IC chip 1 or the board 4 and the adhesive occurs, moisture enters the portion, causing the corrosion of the electrode of IC chip 1 or the like. If the separation progresses from the separated portion, then the very bonding of the IC chip 1 to the board 4 becomes defective, causing a defective electrical connection.

In contrast to this, according to the twenty-ninth embodiment and the various modification examples thereof as described above, the adhesive strength can be improved with the effect of reducing the coefficient of linear expansion by the inorganic filler 6f kept provided. This improves the adhesion strength to the IC chip 1 and the board 4 and improves the reliability.

Furthermore, when the portion 700 or the resin layer 6x that has a small amount of inorganic filler 6f is arranged on the IC chip side or when the inorganic filler distribution is reduced on the IC chip side, the portion 700 or the resin layer 6x is able to have an improved adhesive strength to the passivation film made of silicon nitride or silicon oxide on the IC chip surface. It is also possible to properly select and employ an insulating resin that improves adhesion to the film material used on the IC chip surface. Moreover, by reducing the elastic modulus in the vicinity of the IC chip, the stress concentration in the encapsulating sheet material, which is one example of the insulating resin layer, is alleviated. If such a structure is adopted when the material used for the board 4 is as hard as ceramic (with high elastic modulus), then there is advantageously provided matching with the encapsulating sheet material in the vicinity of the board in terms of elastic modulus and the coefficient of linear expansion.

In the case where the portion 700 or the resin layer 6x having a small amount of inorganic filler 6f is arranged on the board side or in the case where the inorganic filler distribution is reduced on the board side, if a bending stress is applied when the board 4 is assembled into the casing of electric equipment when a bending force is applied to the board 4 as in the case of a resin board or a flexible board (FPC), then the portion or layer can be used for the purpose of improving the adhesion strength exerted between the board 4 and the encapsulating sheet that serves as an example of the insulating resin layer. In the case where the surface layer on the IC chip side is constructed of a protecting film formed of a polyimide film, the elastic modulus and the coefficient of linear expansion vary in steps from the IC chip 1 to the board 4 when the adhesion of the insulating resin is generally satisfactory and has no problem, allowing the encapsulating sheet to be made of a hard material on the IC chip side and of a soft material on the board side. With this arrangement, the stress generation inside the encapsulating sheet is reduced, and therefore, the reliability is improved.

Furthermore, in the case where the portion 700 or the resin layers 6x and 6z having a small amount of inorganic filler 6f are arranged on both the IC chip side and the board side or in the case where the inorganic filler distribution is reduced on both the IC chip side and the board side, a compatibility is assured on both the IC chip side case and the board side case. This enables the improvement in adhesion on both the IC chip side and the board side and the connection of both the IC chip 1 and the board 4 with high reliability with a reduced coefficient of linear expansion. Moreover, it is allowed to select and employ an insulating resin of excellent adhesion and resin wettability according to the material of the surface on the IC chip side and the board material. Moreover, the inclination of the loadings of the inorganic filler 6f can be freely changed, and therefore, it is possible to provide matching with the board material by extremely reducing the thickness of the portion or layer that has a small amount of inorganic filler 6f or taking similar measures.

Thirtieth Embodiment

Figure 70:
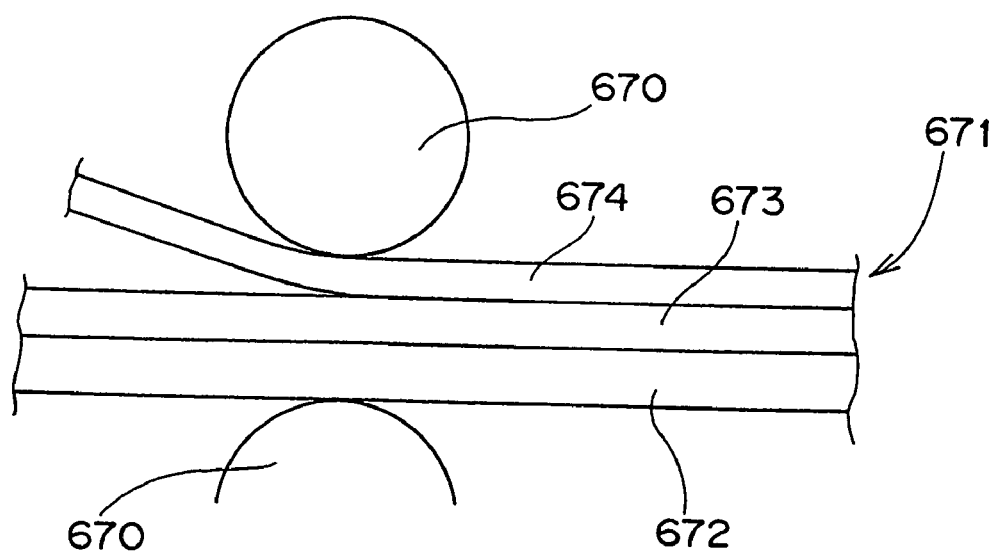
FIG. 70 is a partially enlarged view of FIG. 69.

According to a thirtieth embodiment of the present invention, a process for producing an insulating resin layer to be used for the method and apparatus for mounting an electronic component of, for example, an IC chip on a circuit board and an electronic component unit or module of, for example, a semiconductor device in which the IC chip is mounted on the board by the mounting method according to the eighth through fourteenth embodiments and the modification examples thereof will be described next with reference to FIG. 67 and FIG. 70.

Figure 65:
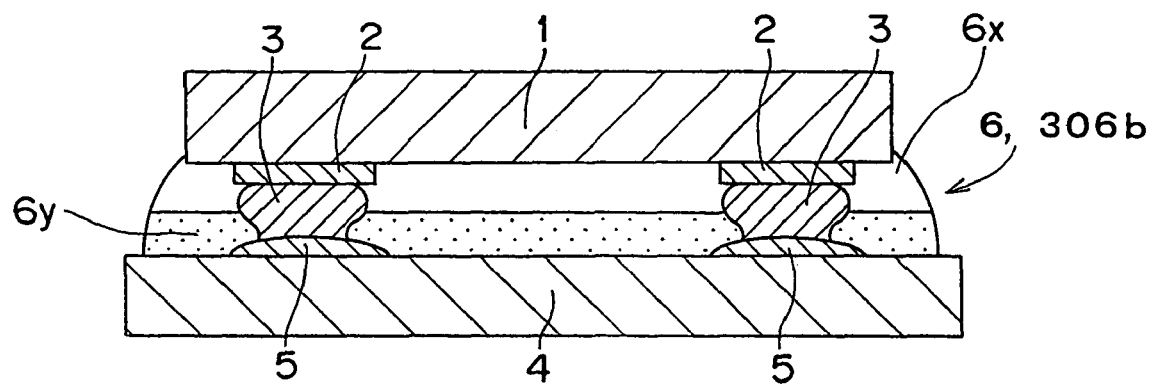
FIG. 65 is a schematic sectional view of a bonded state achieved by using the insulating resin layer employed by the method and apparatus for mounting the electronic component of, for example, an IC chip on the circuit board of the twenty-ninth embodiment shown in FIG. 64A.
Figure 66:
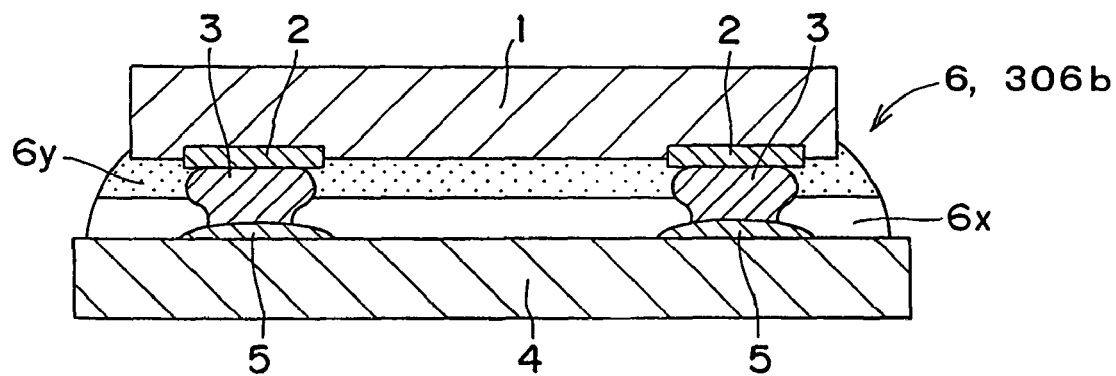
FIG. 66 is a schematic sectional view of a bonded state achieved by using the insulating resin layer employed by the method and apparatus for mounting the electronic component of, for example, an IC chip on the circuit board of the twenty-ninth embodiment shown in FIG. 64B.

First of all, when forming an insulating resin layer directly on the circuit board 4, a first resin sheet is stuck onto the circuit board 4, and a second resin sheet is stuck onto the first resin sheet. When there is a great amount of inorganic filler 6f in the first resin sheet at this time, there is the result as shown in FIG. 63A or FIG. 65. In the converse case, there is the result as shown in FIG. 63B or FIG. 66. That is, in the former case, the first resin sheet is a resin sheet corresponding to the portion 701 or the second resin layer 6y that has a great amount of inorganic filler 6f. In the latter case, the sheet is a resin sheet corresponding to the portion 700 or the first resin layer 6x that has a small amount of inorganic filler 6f.

When a third resin sheet is further formed on the second resin sheet together with the first resin sheet and the third resin sheet corresponding to the portion 700 or the first resin layer 6x that has a small amount of inorganic filler 6f, there is the result as shown in FIG. 63C or FIG. 67A.

Figure 69:
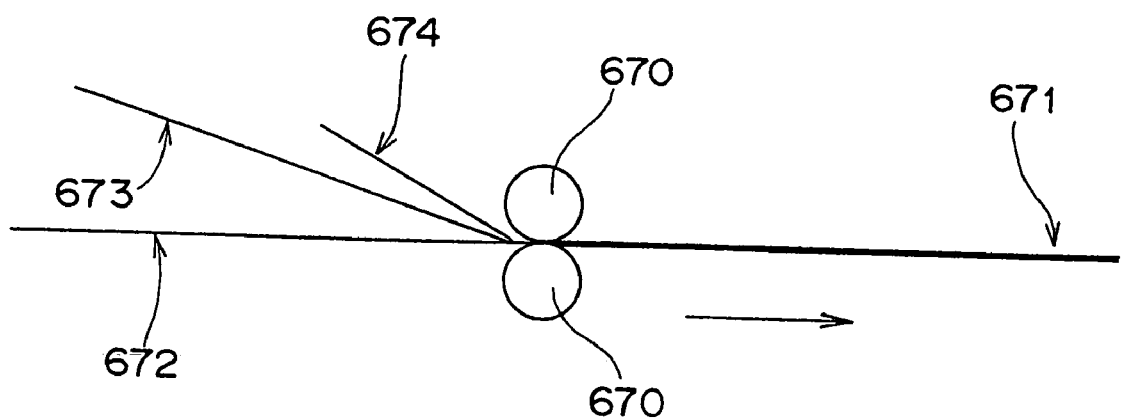
FIG. 69 is an explanatory view of a manufacturing process of the insulating resin layer employed by a method and apparatus for mounting an electronic component of, for example, an IC chip on a circuit board according to a thirtieth embodiment of the present invention.

It is also acceptable to preliminarily form a first resin sheet 673 and a second resin sheet 674 on a base film 672 that is called a separator in this order (only this case is shown in FIG. 69 and FIG. 70) or reversely or together with a third resin sheet stuck, as shown in FIG. 69 and FIG. 70. In this case, as shown in FIG. 69 and FIG. 70, the plurality of resin sheets 673 and 674 are stuck by heating at need by means of a vertical pair of heatable rollers 670 and 270 as shown in FIG. 69 and FIG. 70. Subsequently, by cutting the formed resin sheet body 671 every prescribed dimension, there is the insulating resin sheet 6 as shown in any one of FIGS. 63A through 63C, FIGS. 64A through 64C and FIGS. 65 through 32.

When producing an insulating resin sheet body of the continuous insulating resin sheets 6 as another modification example, epoxy and inorganic fillers dissolved in a solvent are applied to a base film called a separator by the doctor blade method or the like. This solvent is dried to produce the insulating resin sheet body.

At this time, a liquid insulating resin in which the density of the inorganic filler 6f is low or no inorganic filler 6f is contained is once applied as a first layer to the base film, and according to circumstances, the applied first layer is dried. When the layer is not dried, a certain amount of the inorganic filler 6f of the second layer is mixed with the first layer, providing a structure in which the inorganic filler distribution is inclined as shown in FIG. 68.

A liquid insulating resin mixed with a greater amount of inorganic filler 6f than that of the first layer is applied as a second layer onto the first layer formed that has been applied and formed. By drying the second layer, there is formed an insulating resin sheet body of a two-layer structure in which the first layer and the second layer are formed on the base film. By cutting the insulating resin sheet body every specified dimension, there is an insulating resin sheet 6 as shown in FIG. 63A, FIG. 64A and FIG. 65.

When the layer that has a small amount of inorganic filler 6f is arranged on the board side, the insulating resin sheet body of a two-layer structure can be formed by a process reverse to the above, i.e., by forming the second layer on the base film and thereafter forming the first layer on the second layer. By cutting the insulating resin sheet body every specified dimension, there is an insulating resin sheet 6 as shown in FIG. 63B, FIG. 64B and FIG. 66.

The insulating resin 306m in which the density of the inorganic filler 6f is low or no inorganic filler 6f is contained is once applied and dried (sometimes omitted), and an insulating resin mixed with a greater amount of the inorganic filler 6f than that of the first layer is applied onto the first layer and dried (sometimes omitted). The third layer in which the amount of the inorganic filler is smaller than that of the second layer or no inorganic filler 6f is contained is applied onto the layer. By drying this, there can be formed an insulating resin sheet body of a three-layer structure in which the first layer, the second layer, and the third layer are formed on the base film. By cutting the insulating resin sheet body every specified dimension, there is an thermosetting resin sheet 6 as shown in FIG. 63C, FIG. 64C and FIG. 67A.

According to the method for forming the insulating resin layer directly on the circuit board 4, the resin material most appropriate for the electronic component is selected and arranged on the electronic component side of the insulating resin layer on a side of manufacturing the electronic component unit, while the resin material most appropriate for the board can be selected and arranged on the board side, allowing the degree of freedom of selecting the resin can be improved.

In contrast to this, according to the method of manufacturing the insulating resin sheet body, a lot of the thermosetting resin sheets 6 can be collectively manufactured although the degree of freedom of selection is less than the above-mentioned case. This leads to a satisfactory manufacturing efficiency and an inexpensive cost and needs only one sticking device.

As described above, according to the aforementioned embodiments of the present invention, many processes that have conventionally been needed for bonding the electronic component of, for example, an IC chip to the circuit board can be eliminated, and the productivity can be remarkably improved. That is, in the case of, for example, the stud bump bonding and the solder bump bonding described as prior art examples, it is required to inject an encapsulating material after flip chip bonding and put the board in a batch type furnace to perform hardening. A time of several minutes per unit is required for the injection of the encapsulating material, and a time of two to five hours are required the hardening of the encapsulating material. The stud bump bonding mounting further needs a process for transferring Ag pastes to the bumps as pre-processing, mounting this on a board and thereafter hardening the Ag pastes. Two hours are required for this process. In contrast to this, according to the methods of the aforementioned embodiments, the encapsulating process can be eliminated, allowing the productivity to be remarkably improved. Furthermore, according to the aforementioned embodiments, employing the solid or semi-solid insulating resin encapsulating sheet allows the employment of, for example, epoxy resin of a great molecular weight, allows the achievement of bonding in a short time of about 10 to 20 seconds, allows the reduction in bonding time and allows the productivity to be further improved. When the thermosetting resin sheet 6 or the thermosetting adhesive 306b, which has no conductive particle as a bonding material, is employed, there is no need for adding conductive particles into the insulating resin by comparison with the method described in connection with the second prior art. Therefore, an inexpensive IC chip mounting method and apparatus can be provided.

Furthermore, the following effects can be produced.

(1) Bump Formation

According to the method of forming a bump with plating (third prior art), a special bump forming process is required to be performed by the semiconductor manufacturer, and therefore, the bump formation can be formed only by the limited manufacturers. However, according to the aforementioned embodiments of the present invention, IC chips for general-purpose wire bonding can be employed by means of a wire bonding device, and IC chips can easily be available. The reason why the IC chips for general-purpose wire bonding can be employed is that bumps can be formed on ordinary IC pads on which Al pads are formed by means of a wire bonding device or a bump bonding apparatus so long as the IC chips are for wire bonding use. On the other hand, in order to form plating bumps by the method of forming bumps with plating (third prior art), there are the processes of forming barrier metals of Ti, Cu, Cr, or the like on Al pads, applying a resist by spin coating, and forming holes by exposure only in the bump forming portions. The bumps are formed by electrifying this and plating the hole portions with Au or the like. Therefore, a large-scale plating apparatus and a waste disposal plant of hazardous substances such as cyanides are needed to form the plating bumps, and therefore, it is practically impossible to do so in a factory that carries out the ordinary assembly processes.

Moreover, the bump leveling for stabilizing the amount of transfer of the adhesive in an unstable transfer process of transfer such as the transfer of the conductive adhesive becomes unnecessary by comparison with the method of the first prior art, and the leveling device for such a leveling process becomes unnecessary. The above is because it is not required to preliminarily level only the bumps since the bumps are crushed on the electrodes of the board while pressurizing the bumps.

Moreover, if the following method is adopted, bonding of high reliability can also be achieved even when bump(s) 103 is bonded to the electrode(s) 5 of the circuit board 4 as mounted with a shift. That is, when forming the bumps 3 on the IC chip 1, a gold ball 96a is formed by subjecting the gold wire to an electric spark similarly to the wire bonding. Next, a ball 96a of a Φd-Bump of the diameter denoted by 95a is formed, and a bump 103 is formed on the electrode 2 of the IC chip 1 by supersonic waves and thermocompression-bonding by means of a capillary 193 designed so that a chamfer diameter φD denoted by 93a of the capillary 193 whose chamfer angle θc is not greater than 100° becomes one-half to three-fourths the gold ball diameter d-Bump and no flat portion is provided in the portion to be brought in contact with the gold ball 96a of a capillary 193 in terms of tip shape. By using the capillary 193 that has the above-mentioned configuration, approximately conically tipped bumps 103 as shown in FIG. 47B can be formed on the electrodes 2 of the IC chip 1. Even when the bumps 103 formed by the aforementioned method are mounted on the electrodes 5 of the circuit board 4 while being shifted by a dimension Z as shown in FIG. 48C, the bumps 103 can partially come in contact with the electrodes 5 of the board 4 without fail so long as the shift is not greater than half the outside diameter of the bump 103 since the bumps 103 have the approximately conically tipped shape. The so-called base 3g of a width dimension d of the bump 3 partially comes in contact with the electrode in FIG. 48D of the conventional bump 3. However, this contact is mere partial contact, leading to unstable bonding. If this is subjected to a thermal shock test or reflow, the bonded portion becomes open. The present invention can eliminate the above-mentioned unstable bonding and provide the bonding of high production yield and high reliability.

(2) Bonding of IC Chip to Circuit Board

According to the method of the second prior art, the connection resistance has been depended on the number of conductive particles that exist between the bump and the electrode of the circuit board. However, according to the aforementioned embodiments of the present invention, the bump 3 can be directly connected to the electrode 5 by being pressed against the electrode 5 of the circuit board 4 with a load (for example, a pressure force of not smaller than 20 gf per bump 3) heavier than in the first and second prior art examples without being leveled in the leveling process as an independent process. Therefore, the connection resistance value does not depend on the number of interposed particles, and the connection resistance value can be stably obtained.

Although the conventional leveling process has been performed in order to shape the bump height constant at the time of bonding to the board electrode, the crushing of the bumps 3 can be performed concurrently with the bonding to the electrodes 2 or 5 in each of the embodiments of the present invention. Therefore, no independent leveling process is needed, and the bonding can be achieved while correcting the warp and undulation of the circuit board 4 by deforming the same, or the bonding is achieved while correcting the warp and undulation of the circuit board 4 by deforming the same without the need for the leveling process of the bumps 3 and 103 by hardening the conductive paste stuck to the bumps 3 and 103 and deforming the conductive paste at the time of bonding. Accordingly, this arrangement tolerates the warp and undulation.

There are needed a high-accuracy board 4 and the leveling of the bumps 3 and 103, as exemplified by 10 μm per IC chip (meaning that a thickness warp dimension accuracy of 10 μm per IC chip is needed) in the first prior art, 2 μm per IC chip in the second prior art, and 1 μm per IC chip in the third prior art (bump height variation of not greater than ±1 μm). In practice, a glass board represented by LCD is employed. In contrast to this, according to the aforementioned embodiments of the present invention, the bonding is achieved while correcting the warp and undulation of the circuit board 4 by deforming the same at the time of bonding. Therefore, a board of a degraded surface flatness including warp and undulation, exemplified by a resin board, a flexible board, a multilayer ceramic board, or the like, can be employed, and a less expensive versatile IC chip bonding method can be provided.

If the volume of the thermosetting resin 306m located between the IC chip 1 and the circuit board 4 is set greater than the volume of the space between the IC chip 1 and the circuit board 4, then the resin flows out of this space, producing the encapsulating effect. Therefore, it is not required to lay an encapsulation resin (underfill coat) under the IC chip after the bonding of the IC chip to the circuit board with the conductive adhesive, which has been needed in the first prior art, and the process can be shortened.

By mixing the inorganic filler 6f with the thermosetting resin 306m by about 5 to 90 wt % of the thermosetting resin 306m, the elastic modulus and the coefficient of thermal expansion of the thermosetting resin can be controlled to be optimum for the board 4. In addition to this, if this is utilized for the ordinary plating bump, then the inorganic filler enters the space between the bump and the circuit board, degrading the bonding reliability. However, if the stud bump (forming method utilizing wire bonding) is employed as in the aforementioned embodiments of the present invention, then the inorganic filler 6f and also the thermosetting resin 306m are forced outwardly of the bumps 3 and 103 by the pointed bumps 3 and 103 that enter the thermosetting resin 306m at the beginning of the bonding. By this operation, the inorganic filler 6f and the thermosetting resin 306m are forced outwardly of the space between the bumps 3 and 103 and the electrodes 5 and 2 in the process of the deformation of the pointed bumps 3 and 103, and the unnecessary interposed object can be eliminated, allowing the reliability to be further improved.

According to the present invention described above, the method and apparatus for bonding electronic components such as IC chips to circuit boards can be provided with higher productivity and lower cost than those of the conventional bonding method.

As described above, the present invention is able to eliminate the processes that have conventionally been needed for bonding an electronic component to a circuit board and remarkably improve the productivity.

When an insulating resin having no conductive particle (for example, a thermosetting resin sheet or a thermosetting adhesive) is employed as a bonding material, there is no need for adding conductive particles into the insulating resin by comparison with the method described in connection with the second prior art. Therefore, an inexpensive electronic component mounting method and apparatus can be provided.

The following effects can also be produced.

(1) Bump Formation

According to the method of forming a bump with plating (third prior art), a special bump forming process is required to be performed by the semiconductor manufacturer, and therefore, the bump formation can be formed only by the limited manufacturers. However, according to the present invention, IC chips for general-purpose wire bonding can be employed as an example of the electronic component by means of a wire bonding device, and IC chips can easily be available.

Moreover, the bump leveling for stabilizing the amount of transfer of the adhesive in an unstable transfer process of transfer such as the transfer of the conductive adhesive becomes unnecessary by comparison with the method of the first prior art, and the leveling device for such a leveling process becomes unnecessary.

If the approximately conically tipped bumps are formed on the electrodes of an electronic component, even when the bumps are mounted on the electrodes of the circuit board while being shifted, the bumps can partially come in contact with the electrodes of the board without fail so long as the shift is not greater than half the outside diameter of the bump since the bumps have the approximately conically tipped shape. According to the conventional bumps, the so-called bases of the bumps partially come in contact with the electrodes. However, this contact is mere partial contact, leading to unstable bonding. If this is subjected to a thermal shock test or reflow, the bonded portions become open. The present invention can eliminate the above-mentioned unstable bonding and provide the bonding of high production yield and high reliability.

(2) Bonding of IC Chip to Circuit Board

According to the method of the second prior art, the connection resistance has been depended on the number of conductive particles that exist between the bump and the electrode of the circuit board. However, according to the present invention, the bumps can be directly connected to the electrodes by being pressed against the electrodes of the circuit board with a load (for example, a pressure force of not smaller than 20 gf per bump) heavier than in the first and second prior art examples without being leveled in the leveling process as an independent process. Therefore, the connection resistance value does not depend on the number of interposed particles, and the connection resistance value can be stably obtained.

Although the conventional leveling process has been performed in order to shape the bump heights constant at the time of bonding to the board electrodes, the crushing of the bumps can be performed concurrently with the bonding to the electrodes according to the present invention. Therefore, no independent leveling process is needed, and the bonding can be achieved while correcting the warp and undulation of the circuit board by deforming the same, or the bonding is achieved while correcting the warp and undulation of the circuit board by deforming the same without the need for the leveling process of the bumps by hardening the conductive paste stuck to the bumps and deforming the conductive paste at the time of bonding. Accordingly, this arrangement tolerates the warp and undulation.

There are needed a high-accuracy board and the leveling of the bumps, as exemplified by 10 μm per IC chip (meaning that a thickness warp dimension accuracy of 10 μm per IC chip is needed) in the first prior art, 2 μm per IC chip in the second prior art, and 1 μm per IC chip in the third prior art (bump height variation of not greater than ±1 μm). In practice, a glass board represented by LCD is employed. In contrast to this, according to the present invention, the bonding is achieved while correcting the warp and undulation of the circuit board by deforming the same at the time of bonding. Therefore, a board of a degraded surface flatness including warp and undulation, exemplified by a resin board, a flexible board, a multilayer ceramic board, or the like, can be employed, and a less expensive versatile IC chip bonding method can be provided.

If the volume of the insulating resin located between the electronic component and the circuit board is set greater than the volume of the space between the electronic component and the circuit board, then the resin flows out of this space, producing the encapsulating effect. Therefore, it is not required to lay an encapsulation resin (underfill coat) under the IC chip after the bonding of the IC chip to the circuit board with the conductive adhesive, which has been needed in the first prior art, and the process can be shortened.

By mixing the inorganic filler with the insulating resin by about 5 to 90 wt % of the insulating resin, the elastic modulus and the coefficient of thermal expansion of the insulating resin can be controlled to be optimum for the board. In addition to this, if this is utilized for the ordinary plating bump, then the inorganic filler enters the space between the bump and the circuit board, degrading the bonding reliability. However, if the stud bumps (forming method utilizing wire bonding) are employed as in the present invention, then the inorganic filler and also the insulating resin are forced outwardly of the bumps by the pointed bumps that enter the insulating resin at the beginning of the bonding. By this operation, the inorganic filler and the insulating resin are forced outwardly of the space between the bumps and the electrodes in the process of the deformation of the pointed bumps, and the unnecessary interposed object can be eliminated, allowing the reliability to be further improved.

When the inorganic filler of the same weight is mixed, by employing an inorganic filler that has a mean particle diameter of not smaller than 3 μm, employing an inorganic filler that has a plurality of different mean particle diameters, employing inorganic fillers in which the mean particle diameter of one inorganic filler is two times or more different from the mean particle diameter of the other inorganic filler, or employing at least two types of inorganic fillers in which one inorganic filler has a mean particle diameter exceeding 3 μm and the other inorganic filler has a mean particle diameter of not greater than 3 μm, the amount of moisture absorption to the periphery of the inorganic filler can be reduced to allow the moisture resistance to be improved and allow the amount of the inorganic filler to be increased, facilitating the film formation (solidification). Furthermore, the coefficient of linear expansion of the insulating resin layer of, for example, the resin sheet or the adhesive can be reduced, allowing the operating life to be increased, for the improvement in reliability.

Furthermore, if the one inorganic filler of the larger mean particle diameter is made of a material identical to the aforementioned insulating resin, then the stress alleviating effect can be produced. If the one inorganic filler of the larger mean particle diameter is made softer than the epoxy resin that serves as the insulating resin and the one inorganic filler is compressed, then the stress alleviating effect can also be produced.

Moreover, if the inorganic filler is not existing or reduced in amount in the bonding interface between the electronic component or the board and the insulating resin layer, the innate adhesion of the insulating resin is effected. This increases the insulating resin of high adhesion in the bonding interface, allowing the adhesion strength of the electronic component or the board and the insulating resin to be improved and improving the adhesion to the electronic component or the board with the effect of reducing the coefficient of linear expansion by the inorganic filler kept intact. With this arrangement, the operating life is improved during a variety of reliability tests, and the peel strength to bending is improved.

Furthermore, by employing an insulating resin, which improves the adhesion to the film material used on the surface of the electronic component in the portion or layer brought in contact with the electronic component and employing the insulating resin, which improves the adhesion to the material of the board surface, in the portion or layer brought in contact with the board, the adhesion can further be improved.

In each of the aforementioned embodiments, it is acceptable to apply heat from the electronic component side or from the board side or from both the electronic component side and the board side after performing both the process of metallically bonding the gold bumps to the board electrodes with supersonic waves applied and the process of correcting the warp and undulation of the board and crushing the bump without applying heat to both the electronic component and the board.

As described above, according to the present invention, there can be provided the method and apparatus for bonding electronic components to boards with high productivity and high reliability without needing the resin encapsulating process to pour resin between the electronic component and the board and the bump leveling process for regulating the bump height constant after the bonding of the electronic component to the circuit board.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:

1. A method of mounting an electronic component comprising:
    forming a ball at a tip of a metal wire;
    forming a pointed bump by thermocompression-bonding the ball to a first electrode of an electronic component;
    positioning an insulating resin layer comprising a mixture of an insulating resin and an inorganic filler, between the electronic component and a circuit board while the first electrode is aligned with a second electrode of the circuit board; and
    bonding, without leveling the pointed bump before the pointed bump is brought into contact with the second electrode of the circuit board, the electronic component to the circuit board by hardening the insulating resin layer such that the first electrode becomes electrically connected to the second electrode via the pointed bump, and such that the inorganic filler is forced outwardly of the pointed bump by virtue of the pointed bump entering the insulating resin layer at a beginning of said bonding operation,
    wherein the insulating resin layer comprises:
    a first resin layer in contact with the electronic component;
    a second resin layer in contact with the first resin layer; and
    a third resin layer in contact with the circuit board, and
    wherein each of the first resin layer and the third resin layer includes an insulating resin that is identical, and the second resin layer has an amount of the inorganic filler that is less than an amount of the inorganic filler in each of the first resin layer and the third resin layer.

* * * * *